United States Patent
Shinozaki et al.

(10) Patent No.: US 7,295,483 B2
(45) Date of Patent: *Nov. 13, 2007

(54) SEMICONDUCTOR MEMORY

(75) Inventors: Naoharu Shinozaki, Kawasaki (JP); Yasurou Matsuzaki, Kawasaki (JP)

(73) Assignee: Fujitsu Limted, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/513,394

(22) Filed: Aug. 31, 2006

(65) Prior Publication Data
US 2006/0291297 A1    Dec. 28, 2006

Related U.S. Application Data

(62) Division of application No. 10/968,811, filed on Oct. 20, 2004, now Pat. No. 7,209,402, which is a division of application No. 10/335,949, filed on Jan. 3, 2003, now Pat. No. 6,829,192.

(30) Foreign Application Priority Data

Jul. 15, 2002   (JP) .............................. 2002-205313

(51) Int. Cl.
  *G11C 7/00*   (2006.01)
(52) U.S. Cl. ............. 365/222; 365/189.05; 365/189.04
(58) Field of Classification Search ................ 365/222, 365/189.05, 189.04
  See application file for complete search history.

(56) References Cited

U.S. PATENT DOCUMENTS

| | | | |
|---|---|---|---|
| 6,219,292 B1 | 4/2001 | Jang | |
| 6,349,068 B2 | 2/2002 | Takemae et al. | |
| 6,560,155 B1* | 5/2003 | Hush | 365/222 |
| 6,744,685 B2* | 6/2004 | Mizugaki | 365/222 |
| 6,829,192 B2* | 12/2004 | Shinozaki et al. | 365/222 |
| 2002/0191466 A1 | 12/2002 | Hwang et al. | |
| 2003/0218931 A1 | 11/2003 | Okamoto et al. | |

* cited by examiner

*Primary Examiner*—Richard T. Elms
*Assistant Examiner*—N Nguyen
(74) *Attorney, Agent, or Firm*—Arent Fox LLP

(57) ABSTRACT

A partial area for retaining data during low power consumption mode is composed of a single first memory cell out of a plurality of memory cells connected to a bit line. An operation control circuit operates any of the memory cells selected in accordance with an address signal during normal operation mode for performing a read operation and a write operation. The operation control circuit keeps latching data retained by the first memory cell in the partial area into a sense amplifier during the low power consumption mode. This eliminates the need for a refresh operation for retaining the data in the first memory cell during the low power consumption mode. Since the data can be retained without a refresh operation, it is possible to reduce the power consumption during the low power consumption mode.

9 Claims, 59 Drawing Sheets

MODE3="H" or MODE4="H"

| REFAD | | | | | | | | | | | | | | |
|---|---|---|---|---|---|---|---|---|---|---|---|---|---|---|
| R0 | 0 | 0 | 0 | 0 | 0 | 0 | 0 | 0 | 0 | 0 | ....... | 0 | 0 | 0 |
| R1 | 0 | 1 | 0 | 1 | 0 | 1 | 0 | 1 | 0 | 1 | ....... | 1 | 0 | 1 |
| R2 | 0 | 0 | 1 | 1 | 0 | 0 | 1 | 1 | 0 | 0 | ....... | 0 | 1 | 1 |
| R3 | 0 | 0 | 0 | 0 | 1 | 1 | 1 | 0 | 0 | 0 | ....... | 1 | 1 | 1 |
| R4 | 0 | 0 | 0 | 0 | 0 | 0 | 0 | 1 | 1 | 0 | ....... | 1 | 1 | 1 |
| R5 | 0 | 0 | 0 | 0 | 0 | 0 | 0 | 0 | 0 | 0 | ....... | 1 | 1 | 1 | count up →

MODE1="H" or MODE2="H"

| REFAD | | | | | | | | | | | | | | |
|---|---|---|---|---|---|---|---|---|---|---|---|---|---|---|
| R0 | 0 | 1 | 0 | 1 | 0 | 1 | 0 | 1 | 0 | 1 | ....... | 1 | 0 | 1 |
| R1 | 0 | 0 | 1 | 1 | 0 | 0 | 1 | 1 | 0 | 0 | ....... | 0 | 1 | 1 |
| R2 | 0 | 0 | 0 | 0 | 1 | 1 | 1 | 1 | 0 | 0 | ....... | 1 | 1 | 1 |
| R3 | 0 | 0 | 0 | 0 | 0 | 0 | 0 | 0 | 1 | 1 | ....... | 1 | 1 | 1 |
| R4 | 0 | 0 | 0 | 0 | 0 | 0 | 0 | 0 | 0 | 0 | ....... | 1 | 1 | 1 |
| R5 | 0 | 0 | 0 | 0 | 0 | 0 | 0 | 0 | 0 | 0 | ....... | 1 | 1 | 1 | count up →

Fig. 35

MODE3="H" or MODE4="H"

| REFAD | | | | | | | | | | | | | | |
|---|---|---|---|---|---|---|---|---|---|---|---|---|---|---|
| R5 | R4 | R3 | R2 | R1 | R0 | | | | | | | | | |
| 0 | 0 | 0 | 0 | 0 | 0 | | | | | | | | | |
| 0 | 0 | 0 | 1 | 0 | 0 | | | | | | | | | |
| 0 | 0 | 1 | 0 | 0 | 0 | | | | | | | | | |
| 0 | 0 | 1 | 1 | 0 | 0 | | | | | | | | | |
| 0 | 1 | 0 | 0 | 0 | 0 | | | | | | | | | |
| 0 | 1 | 0 | 1 | 0 | 0 | | | | | | | | | |
| 0 | 1 | 1 | 0 | 0 | 0 | | | | | | | | | |
| 0 | 0 | 1 | 1 | 0 | 0 | | | | | | | | | |
| 1 | 0 | 0 | 0 | 0 | 0 | | | | | | | | | |
| 1 | 0 | 0 | 1 | 0 | 0 | | | | | | | | | |
| ........ | | | | | | | | | | | | | | |
| 1 | 1 | 0 | 1 | 0 | 0 | | | | | | | | | |
| 1 | 1 | 1 | 0 | 0 | 0 | | | | | | | | | |
| 1 | 1 | 1 | 1 | 0 | 0 | | | | | | | | | |

→ count up

MODE1="H" or MODE2="H"

| REFAD | | | | | | |
|---|---|---|---|---|---|---|
| R5 | R4 | R3 | R2 | R1 | R0 | |
| 0 | 0 | 0 | 0 | 0 | 0 | |
| 0 | 0 | 0 | 0 | 0 | 1 | |
| 0 | 0 | 0 | 0 | 1 | 0 | |
| 0 | 0 | 0 | 0 | 1 | 1 | |
| 0 | 0 | 0 | 1 | 0 | 0 | |
| 0 | 0 | 0 | 1 | 0 | 1 | |
| 0 | 0 | 0 | 1 | 1 | 0 | |
| 0 | 0 | 0 | 1 | 1 | 1 | |
| 0 | 0 | 1 | 0 | 0 | 0 | |
| ........ | | | | | | |
| 1 | 1 | 1 | 1 | 0 | 1 | |
| 1 | 1 | 1 | 1 | 1 | 0 | |
| 1 | 1 | 1 | 1 | 1 | 1 | |

→ count up

Fig. 50

SEMICONDUCTOR MEMORY

CROSS-REFERENCE TO RELATED APPLICATION

This is a Divisional Application which claims the benefit of U.S. patent application Ser. No. 10/968,811, filed Oct. 20, 2004 now U.S. Pat. No. 7,209,402, which is a Divisional Application of U.S. patent application Ser. No. 10/335,949, filed Jan. 3, 2003, now U.S. Pat. No. 6,829,192 B2, issued Dec. 7, 2004. The disclosures of the prior applications are hereby incorporated in their entirety by reference.

BACKGROUND OF THE INVENTION

1. Field of the Invention

The present invention relates to a semiconductor memory which requires fresh operations to retain data written in its memory cells.

2. Description of the Related Art

Hand-held terminals such as cellular phones are growing in memory capacity requirement year by year. Under the circumstances, dynamic RAMs (hereinafter, referred to as DRAMs) have come to be used as the work memories of the cellular phones instead of conventional static RAMs (hereinafter, referred to as SRAMs). DRAMs are smaller than SRAMs in the numbers of devices that constitute the memory cells. DRAMs can thus be reduced in chip size, with lower chip cost than that of SRAMs.

Meanwhile, semiconductor memories to be mounted on cellular phones must be low in power consumption so as to allow prolonged use of the batteries. Unlike SRAMs, DRAMs require periodic refresh operations in order to retain data written in their memory cells. Consequently, when DRAMs are used as the work memories of cellular phones, data retention alone can consume power to exhaust the batteries even if the cellular phones are not in use.

In order to reduce the power consumption of the DRAMs during standby (in low power consumption mode), there have been developed partial refresh technology and twin cell technology.

According to the partial refresh technology; the number of memory cells to be refreshed is reduced by limiting the number of memory cells to retain data in a standby state. Reducing the memory cells to refresh can decrease the number of times of refresh, with a reduction in the power consumption during standby.

According to the twin cell technology, complementary data is stored into two memory cells (memory cell pair) which are connected to complementary bit lines, respectively. This doubles the charges retained in the memory cell pair. Since the two memory cells retain "H" data and "L" data, respectively, the refresh interval is determined by a longer one between the data retention times of "H" data and "L" data. That is, the worst data retention time is the sum of the characteristics of the two memory cells, not the characteristic of one single memory cell. On the contrary, in a single memory cell, the refresh interval is determined by a shorter one between the data retention times of "H" data and "L" data. As above, according to the twin cell technology, retaining data in two memory cells makes it possible to compensate a small leak path, if any, in one of the memory cells with the other memory cell.

In the partial refresh technology described above, to reduce the power consumption during the low power consumption mode requires that the data retention areas be small. As a result, the lower the power consumption, the smaller the memory capacity available for retention during the low power consumption mode.

In the twin cell technology, two memory cells are always used to retain a single bit of data not only in refresh operations but also in normal read operations and write operations. Storing a single bit hence requires a memory cell size twice as big as that of a single memory cell, which results in increasing chip cost. Consequently, in the cases of DRAMs to which the twin cell technology is applied, there is not much advantage in replacing the SRAMs mounted on cellular phones with the DRAMs.

SUMMARY OF THE INVENTION

It is an object of the present invention to reduce the power consumption of a semiconductor memory in low power consumption mode, the semiconductor memory having memory cells that require refresh operations.

According to one of the aspects of the semiconductor memory of the present invention, a partial area for retaining data in low power consumption mode is composed of a single first memory cell out of a plurality of memory cells connected to a bit line. An operation control circuit operates any of the memory cells selected in accordance with an address signal during normal operation mode for performing a read operation and a write operation. The operation control circuit keeps latching data retained by the first memory cell in the partial area into a sense amplifier during low power consumption mode. This eliminates the need for a refresh operation for retaining the data in the memory cell during the low power consumption mode. Since the data can be retained without a refresh operation, it is possible to reduce the power consumption in the low power consumption mode.

According to another aspect of the semiconductor memory of the present invention, a word line control circuit of the operation control circuit enables selection of a partial word line of word lines connected to the memory cells and disables selection of the other word lines, the partial word line being connected to the memory cell in the partial area. A sense amplifier control circuit of the operation control circuit keeps activating the sense amplifier during the low power consumption mode. Since the selection of the word lines other than in the partial area is disabled during the low power consumption mode, the sense amplifier keeps latching the data that is read from the memory cell. Consequently, data crash can be avoided during the low power consumption mode.

According to another aspect of the semiconductor memory of the present invention, the word line control circuit keeps selecting the partial word line during the low power consumption mode while the sense amplifier keeps latching the data. This simplifies the selecting/deselecting control of the word lines. That is, it is possible to reduce the scale of the control circuit for the word lines.

According to another aspect of the semiconductor memory of the present invention, a booster for supplying a boost voltage to the word lines stops its operation after the sense amplifier latches data at the start of the low power consumption mode. In returning from the low power consumption mode to the normal operation mode, the booster starts a boost operation again. Since the booster is operated only when the selecting operation of the word lines is necessary, the power consumption in the low power consumption mode can be reduced further.

According to another aspect of the semiconductor memory of the present invention, a mask circuit disables the selection of the word lines in response to a refresh control signal in the low power consumption mode. The semiconductor memory is thus prevented from malfunctioning.

According to another aspect of the semiconductor memory of the present invention, its operation mode shifts to the normal operation mode or the low power consumption mode in accordance with a chip enable signal for operating the semiconductor memory. Thus, shifting of the operation mode of the semiconductor memory can be made by simple control. This enables a simple configuration of the control circuit of a system implementing the semiconductor memory.

According to another aspect of the semiconductor memory of the present invention, the operation control circuit selects first and second word lines simultaneously in second and subsequent refresh operations on each of the partial areas in the low power consumption mode. The operation control circuit can thus be configured simply.

According to another aspect of the semiconductor memory of the present invention, a plurality of partial areas for retaining data during low power consumption mode are each composed of a predetermined number of memory cells, of memory cells connected to a bit line. A refresh control circuit cyclically outputs a refresh control signal for refreshing the memory cells. An operation control circuit performs a read operation, a write operation, and a refresh operation on the memory cells. The partial areas each include a single first memory cell and at least a single second memory cell which are of the memory cells connected to the bit line.

At the start of the low power consumption mode, the operation control circuit performs a refresh operation on data retained in the first memory cell. The data is amplified by a sense amplifier and written to the first and second memory cells in the refresh operation. Consequently, the data in the first memory cell can be written to the second memory cell(s) with reliability. The operation control circuit subsequently refreshes the first and second memory cells simultaneously in response to the refresh control signal during the low power consumption mode. Since data retained in a single memory cell is retained by using a plurality of memory cells during the low power consumption mode, it is possible to extend the retention time over which the data can be retained. Consequently, the refresh intervals can be made longer in the low power consumption mode than in normal operations. A reduction in the frequency of refresh operations can reduce the power consumption in the low power consumption mode.

According to another aspect of the semiconductor memory of the present invention, in each of the partial areas, the first memory cell is connected to a first word line and the second memory cell(s) is/are connected to a second word line(s). A word line control circuit of the operation control circuit starts selection of the first word line earlier than selection of the second word line(s) in a first refresh operation on each of the partial areas in the low power consumption mode. This can prevent the data in the second memory cell(s) from being read first to destroy data retained in the first memory cell. That is, the semiconductor memory can be prevented from malfunctioning.

According to another aspect of the semiconductor memory of the present invention, the refresh control circuit outputs, in second and subsequent refresh operations in the low power consumption mode, the refresh control signal at intervals longer than in the normal operation mode. This can lower the refresh frequency in the low power consumption mode and reduce the power consumption.

According to another aspect of the semiconductor memory of the present invention, the refresh control circuit performs, in shifting from the low power consumption mode to the normal operation mode, a refresh operation only on the memory cell(s) on which a predetermined time elapses after a previous refresh operation has been performed. Performing a refresh operation on the necessary memory cell(s) allows a quick shifting from the low power consumption mode to the normal operation mode. Returning to the normal operation mode quickly can improve the operation efficiency of a system on which the semiconductor memory is mounted.

According to another aspect of the semiconductor memory of the present invention, the refresh control circuit outputs, in shifting from the low power consumption mode to the normal operation mode, the refresh control signal at intervals shorter than in the normal operation mode. This allows quick return from the low power consumption mode with the improved operation efficiency of a system on which the semiconductor memory is mounted.

According to another aspect of the semiconductor memory of the present invention, a switch circuit divides a bit line into first and second bit lines. A partial area is composed of a first memory cell out of memory cells, the first memory cell being connected to a first bit line lying on a side of the switch circuit closer to a sense amplifier. A refresh control circuit cyclically outputs a refresh control signal for refreshing the memory cells. A switch control circuit turns on the switch circuit in the normal operation mode, and turns off the same in the low power consumption mode. Since the bit line connected to the sense amplifier decreases in bit line capacity during the low power consumption mode, the sense amplifier can surely latch data retained in the first memory cell even if the signal quantity of the data is low. As a result, it is possible to lower the refresh frequency during the low power consumption mode, resulting in reducing the power consumption.

According to another aspect of the semiconductor memory of the present invention, a plurality of word lines to be selected in accordance with an address signal are connected to the memory cells, respectively. A word line control circuit selects any of the word lines in accordance with the address signal during the normal operation mode. The word line control circuit enables selection of a partial word line and disables selection of the other word lines during the low power consumption mode, the partial word line being one of the word lines and connected to the first memory cell in the partial area. Since the selection of the word lines other than in the partial area is disabled during the low power consumption mode, the sense amplifier keeps latching the data that is read from the memory cell through the selection of the partial word line. Consequently, data crash can be avoided during the low power consumption mode.

According to another aspect of the semiconductor memory of the present invention, first and second memory cells are connected to complementary bit lines, respectively. A sense amplifier is connected to the complementary bit lines. A refresh control circuit cyclically outputs a refresh control signal for refreshing the first and second memory cells. An operation control circuit operates either of the first and second memory cells selected in accordance with an address signal during normal operation mode for performing a read operation and a write operation.

At the start of low power consumption mode, the operation control circuit makes the sense amplifier amplify data retained in the first memory cell, and writes it to the first and second memory cells (refresh operation). Consequently, the data in the first memory cell can be written to the second memory cell(s) with reliability. The operation control circuit subsequently refreshes the first and second memory cells simultaneously in response to the refresh control signal. The operation control circuit subsequently refreshes the first and second memory cells simultaneously in response to the refresh control signal during the low power consumption mode. Since data retained in a single memory cell is retained by using a plurality of memory cells during the low power consumption mode, it is possible to extend the retention time over which the data can be retained. Consequently, the refresh intervals can be made longer in the low power consumption mode than in normal operations. The lower frequency of refresh operations can reduce the power consumption in the low power consumption mode.

According to another aspect of the semiconductor memory of the present invention, the first memory cell is connected to a first word line and the second memory cell is connected to a second word line. The operation control circuit starts selection of the first word line earlier than selection of the second word line in a first refresh operation in the low power consumption mode. This can prevent the data in the second memory cell from being read first to destroy data retained in the first memory cell. That is, the semiconductor memory can be prevented from malfunctioning.

According to another aspect of the semiconductor memory of the present invention, the first and second word lines are adjacent to each other. This simplifies the circuit layout of a decoder and the like for selecting the first and second word lines.

According to another aspect of the semiconductor memory of the present invention, its operation mode shifts to the normal operation mode or the low power consumption mode in accordance with a command supplied through a command terminal. Thus, the operation mode of the semiconductor memory can be shifted by simple control. As a result, the control circuit of a system implementing the semiconductor memory can be configured simply.

According to another aspect of the semiconductor memory of the present invention, a first memory cell and a plurality of second memory cells are each connected to either of complementary bit lines. A sense amplifier is connected to the complementary bit lines. A refresh control circuit cyclically outputs a refresh control signal for refreshing the first and second memory cells.

An operation control circuit operates any of the first and second memory cells selected in accordance with an address signal during normal operation mode for performing a read operation and a write operation. The operation control circuit performs at the start of low power consumption mode a refresh operation in which data retained in the first memory cell is amplified by the sense amplifier and written to the first and second memory cells, and subsequently refreshes the first and second memory cells simultaneously in response to the refresh control signal. Since data retained in the single memory cell is retained by using the first memory cell and the plurality of second memory cells during the low power consumption mode, it is possible to extend the retention time over which the data can be retained. Consequently, the frequency of refresh operations can be further reduced for a significant reduction in the power consumption during the low power consumption mode.

According to another aspect of the semiconductor memory of the present invention, the operation control circuit selects second word lines in succession after the selection of a first word line. It is therefore possible to disperse the consumption current of the control circuit that operates to select the word lines. This can reduce power supply noise and the like that occur with the selection of word lines.

According to another aspect of the semiconductor memory of the present invention, first and second memory cells are connected to complementary bit lines, respectively. A sense amplifier is connected to the complementary bit lines. For operation mode, the semiconductor memory has a first operation mode, a second operation mode, and a third operation mode.

In the first operation mode, at least either of a read operation and a write operation is performed on the first and second memory cells. In the second operation mode, data retained in the first memory cell is latched into a sense amplifier, and the latched data and inverted data thereof are written to the first and second memory cells, respectively. In the third operation mode, the data retained in the first memory cell and the inverted data retained in the second memory cell are latched into the sense amplifier, and the latched data and inverted data thereof are written to the first and second memory cells, respectively.

Since data retained in a single memory cell is retained by using a plurality of memory cells during the second operation mode, the retention time over which the data can be retained becomes longer in the third operation mode. Consequently, the frequency of data rewrite during the third operation mode decreases, which allows a reduction in the power consumption during low power consumption mode.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 35 is an explanatory diagram showing the operation of the refresh address counter shown in FIG. 33;

FIG. 50 is an explanatory diagram showing the operation of the refresh address counter shown in FIG. 49;

DESCRIPTION OF THE PREFERRED EMBODIMENTS

Figure 1:
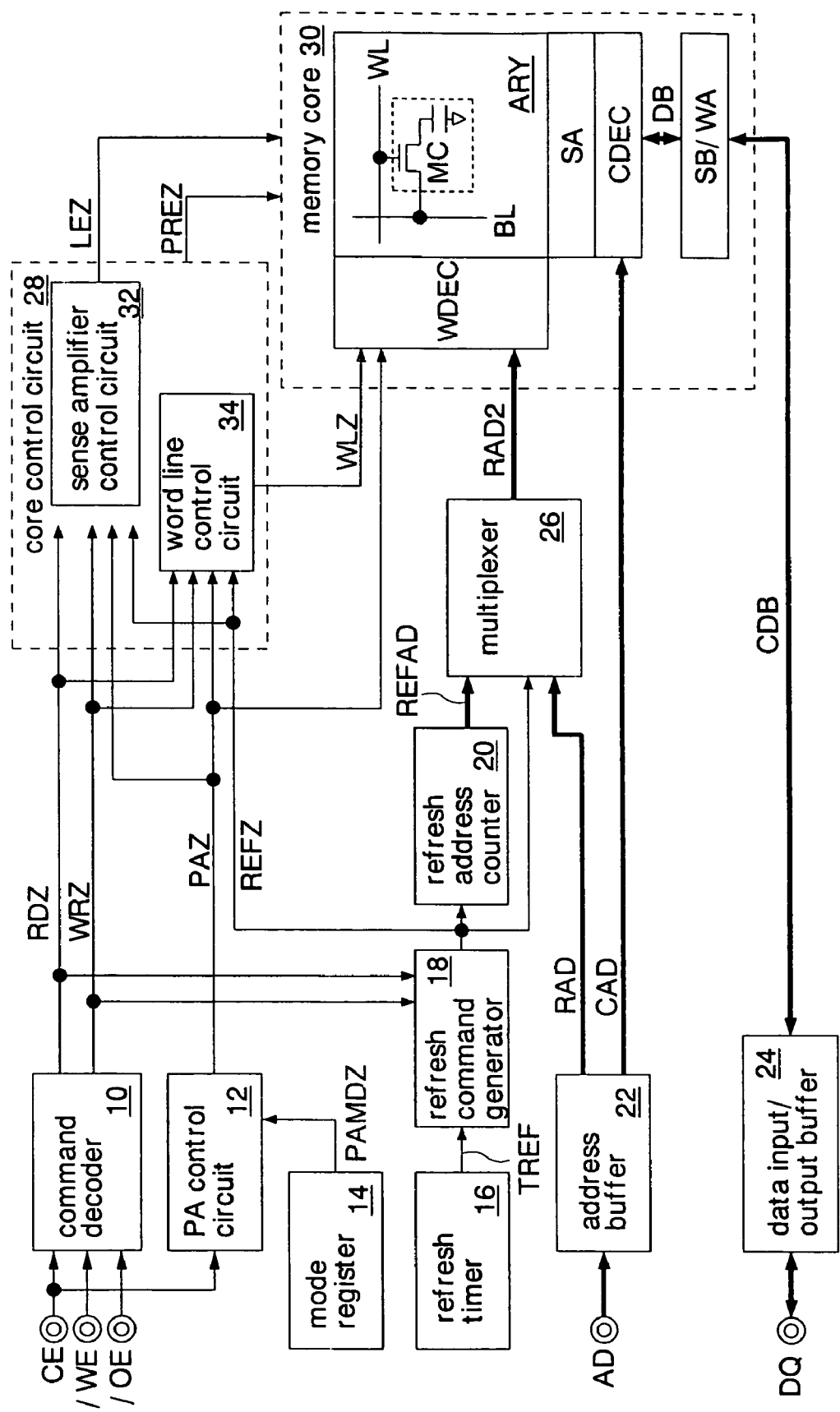
FIG. 1 is a block diagram showing a first embodiment of the semiconductor memory of the present invention.

Hereinafter, embodiments of the present invention will be described with reference to the drawings. In the drawings, each thick line represents a signal line that consists of a plurality of lines. Signals ending in "Z" are of positive logic. Signals with a leading "/" and signals ending in "X" are of negative logic. Double circles in the drawings represent external terminals. In the following description, signal names may be abbreviated like a "CLK signal" for a "clock signal CLK" and a "CE signal" for a "chip enable signal CE".

FIG. 1 shows a first embodiment of the semiconductor memory of the present invention. This semiconductor memory is formed as a pseudo SRAM, which has DRAM memory cells and an SRAM interface, by using CMOS technology. The pseudo SRAM performs refresh operations within the chip at regular time intervals without receiving a refresh command from exterior, thereby retaining data written in its memory cells. This pseudo SRAM is used as a work memory to be mounted on a cellular phone, for example.

The pseudo SRAM includes a command decoder 10, a PA control circuit 12, a mode register 14, a refresh timer 16, a refresh command generator 18, a refresh address counter 20, an address buffer 22, a data input/output buffer 24, a multiplexer 26, a core control circuit 28, and a memory core 30. The refresh timer 16, the refresh command generator 18, and the refresh address counter 20 operate as a refresh control circuit for refreshing memory cells.

The command decoder 10 receives command signals (a chip enable signal CE, a write enable signal /WE, and an output enable signal /OE) from exterior, decodes the received commands, and outputs a read control signal RDZ or a write control signal WRZ. The PA control circuit 12 outputs the inverted logic of the chip enable signal CE as a partial signal PAZ while receiving a mode signal PAMDZ of high level.

The mode register 14 outputs the mode signal PAMDZ of high level when partial mode to be described later (a kind of low power consumption mode) is established by a mode register setting command. When the mode register 14 is set at normal standby mode (another kind of the low power consumption mode), it outputs the mode signal PAMDZ of low level. The pseudo SRAM recognizes the supply of the mode register setting command, for example, when it receives a predetermined combination of command signals a plurality of times. Then, the mode register 14 is set in accordance with the logical value of the data signal supplied to a data terminal DQ at that time.

The refresh timer 16 outputs a refresh request signal TREF (refresh command) at predetermined cycles. The refresh command generator 18 outputs a refresh control signal REFZ in synchronization with the refresh request signal TREF when it receives the refresh request signal TREF in advance of the read control signal RDZ or the write control signal WRZ. When the refresh command generator 18 receives the refresh request signal TREF after the read control signal RDZ or the write control signal WRZ, it outputs the refresh control signal REFZ after a read operation corresponding to the RDZ signal or a write operation corresponding to the WRZ signal. That is, the refresh command generator 18 operates as an arbiter for setting priorities between read/write operations and a refresh operation.

Although not shown in particular, the operation of the refresh timer 16 may be suspended while a partial signal is at high level. This allows a reduction in the power consumption during the partial mode to be described later.

The refresh address counter 20 counts in synchronization with the rising edge of the refresh control signal REFZ, thereby updating a refresh address REFAD.

The address buffer 22 receives an address signal AD through an address terminal, and outputs the received signal as a row address signal RAD (upper address) and a column address signal CAD (lower address). That is, this pseudo SRAM is a memory of address non-multiplex type which receives the upper address and the lower address at the same time.

The data input/output buffer 24 receives read data through a common data bus CDB and outputs the received data to the data terminal DQ. The data input/output buffer 20 receives write data through the data terminal DQ and outputs the received data to the common data bus CDB. The number of bits of the data terminal DQ is 16 bits, for example.

The multiplexer 26 outputs the refresh address signal REFAD as a row address signal RAD2 when the refresh control signal REFZ is at high level. When the refresh control signal REFZ is at low level, the multiplexer 26 outputs the row address signal RAD as the row address signal RAD2.

The core control circuit 28 includes a sense amplifier control circuit 32, a word line control circuit 34, and a not-shown precharge control circuit. The sense amplifier control circuit 32 outputs a sense amplifier activating signal LEZ for activating sense amplifiers SA to be described later when it receives any of the RDZ signal, the WRZ signal, and the REFZ signal, or when it receives the PAZ signal. The word line control circuit 34 outputs a word line control signal WLZ when it receives any of the RDZ signal, the WRZ signal, and the REFZ signal, or when it receives the PAZ signal. The precharge control circuit outputs a precharging signal PREZ when the memory core 30 is not in operation. The core control circuit 28 operates as an operation control circuit for performing read operations, write operations, and refresh operations.

The memory core 30 includes a memory cell array ARY, a word decoder WDEC, sense amplifiers SA, a column decoder CDEC, a sense buffer SB, and a write amplifier WA. The memory cell array ARY has a plurality of volatile memory cells MC (dynamic memory cells), along with a plurality of word lines WL and a plurality of bit lines BL connected to the memory cells MC. The memory cells MC are the same as typical DRAM memory cells, each having a capacitor for retaining data in the form of a charge and a transfer transistor arranged between this capacitor and a bit line BL. The gates of the transfer transistors are connected to the word lines WL. Through the selection of the word lines WL, any of a read operation, a write operation, a refresh operation, and a partial operation to be described later is performed. The memory cell array ARY performs any of the read operation, write operation, and refresh operation before executing a precharge operation for resetting the bit lines BL to a predetermined voltage in response to the precharging signal PREZ.

The word decoder WDEC, when receiving the word line control signal WLZ of high level, selects any of the word lines WL according to the row address signal RAD2 and the partial signal PAZ, and boosts the selected word line WL to a power supply voltage. The column decoder CDEC outputs, in accordance with the column address signal CAD, a column line signal (CLZ in FIG. 4 to be seen later) for turning on column switches (CSW in FIG. 4 to be seen later) which connect the bit lines BL and the data bus DB, respectively.

The sense amplifiers SA amplify the data on the bit lines BL in signal quantity. The data amplified by the sense amplifiers SA is transmitted to the data bus DB through the column switches in a read operation. In a write operation, the data is written to the memory cells MC through the bit lines. Incidentally, as will be described later, the sense amplifiers SA are kept activated in the partial mode.

The sense buffer SB amplifies the read data on the data bus DB in signal quantity, and outputs the resultant to the common data bus CDB. The write amplifier WA amplifies the write data on the common data bus CDB in signal quantity, and outputs the resultant to the data bus DB.

Figure 2:
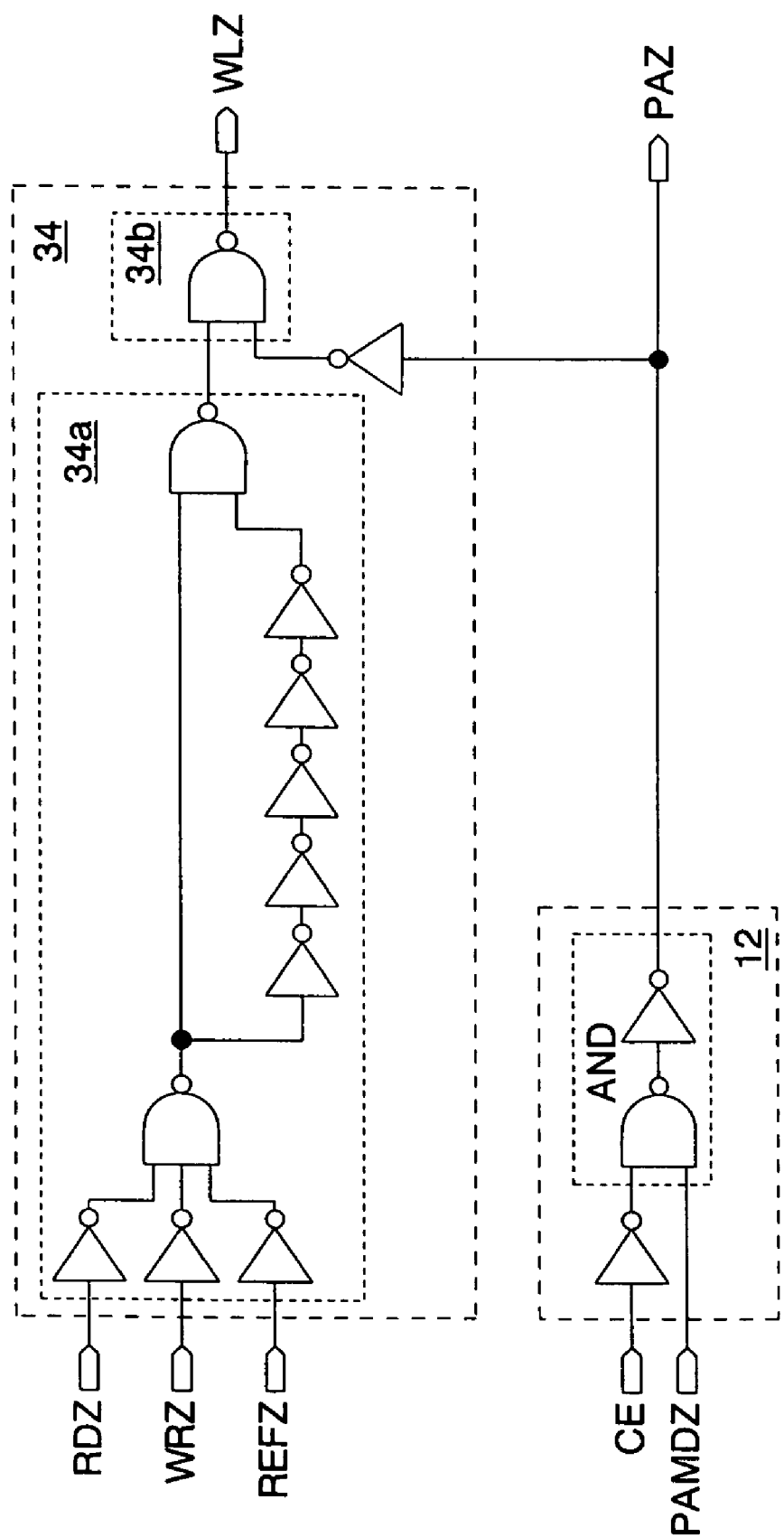
FIG. 2 is a circuit diagram showing the details of the PA control circuit and the word line control circuit shown in FIG. 1.

FIG. 2 shows the details of the PA control circuit 12 and the word line control circuit 34 shown in FIG. 1.

The PA control circuit 12 has an AND circuit which is activated on receiving the mode signal PAMDZ of high level and outputs the logic level of the CE signal as the partial signal PAZ.

The word line control circuit 34 has an edge detecting circuit 34a and a NAND gate 34b. The edge detecting circuit 34a generates a pulse signal of low level in synchronization with the rising edge of the RDZ signal, WRZ signal, or REFZ signal. The NAND gate 34b receives the inverted signal of the partial signal PAZ as well as the pulse signal from the edge detecting circuit 34a, and outputs the word line control signal WLZ. The NAND gate 34b operates as a mask circuit for inhibiting the word line control signal from being activated in response to the REFZ signal during the partial mode.

Specifically, the word line control circuit 34 outputs the word line control signal WLZ of predetermined pulse width in synchronization with the RDZ signal, WRZ signal, or REFZ signal when the partial signal PAZ is at low level. When the partial signal PAZ is at high level, the word line control circuit 34 keeps outputting the word line control signal WLZ of high level.

Figure 3:
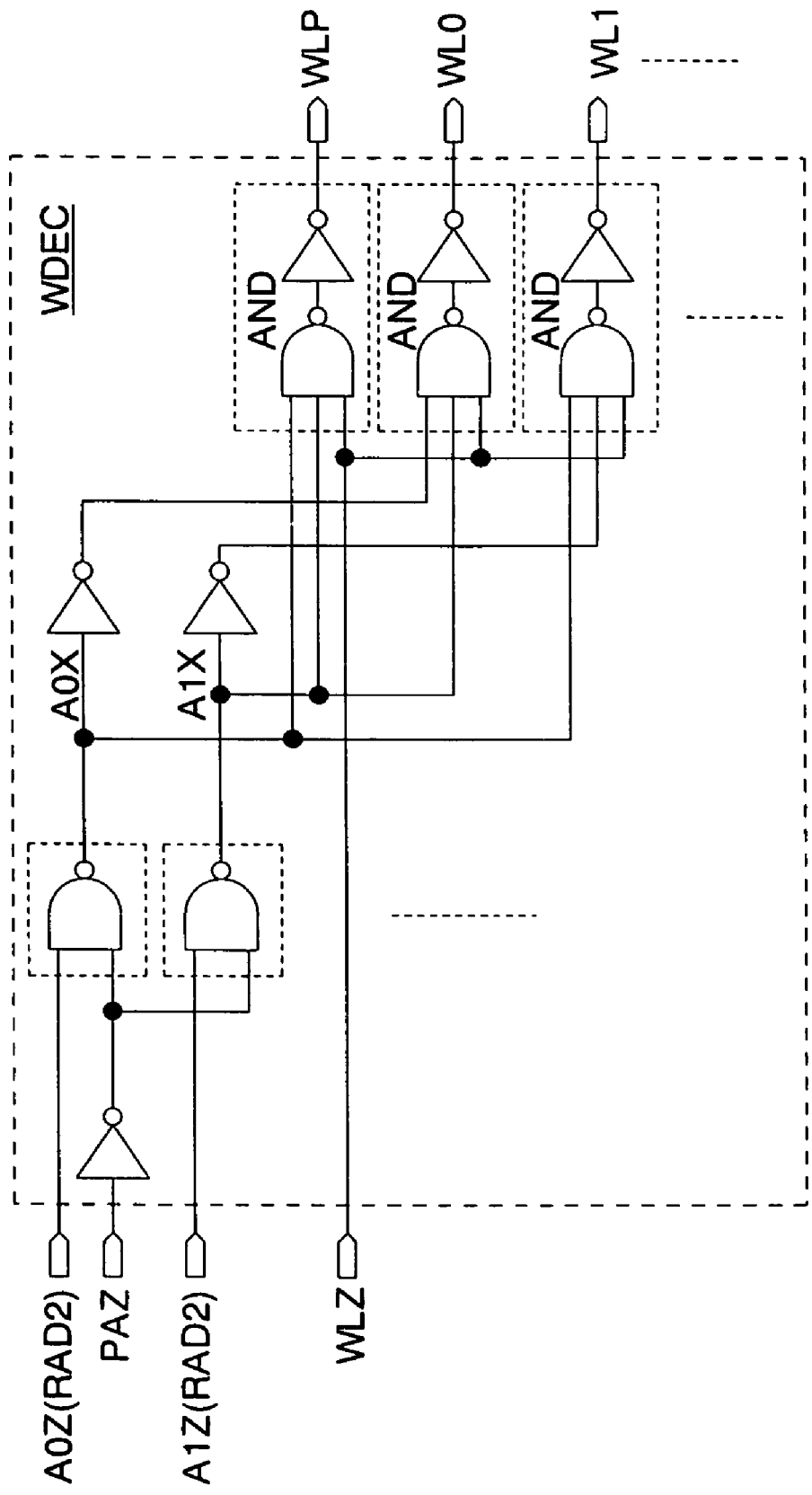
FIG. 3 is a circuit diagram showing the details of the word decoder shown in FIG. 1.

FIG. 3 shows the details of the word decoder WDEC shown in FIG. 1. For the sake of plain explanation, FIG. 3 shows only part of a circuit that corresponds to two bits of row address signals A0Z and A1Z. In fact, the word decoder WDEC receives address signals for selecting all the word lines WL of the memory core 30.

The word decoder WDEC has NAND gates and AND circuits. The NAND gates output the inverted signals of the row address signals A0Z and A1Z as address signals A0X and A1X, respectively, when the partial signal PAZ is at low level. When the partial signal PAZ is at high level, the NAND gates fix the address signals A0X and A1X to high level. The AND circuits decode the address signals A0X, A1X and their inverted signals to select any of the word lines WL (WLP, WL0, WL1, . . . ). When the partial signal PAZ is at low level, any of the word lines WL (WLP, WL0, WL1, . . . ) is selected according to the logic of the row address signals A0Z and A1Z. When the partial signal PAZ is at high level, the word line WLP alone is selected regardless of the logic of the row address signals A0Z and A1Z. The word line WL selected changes to high level.

Figure 4:
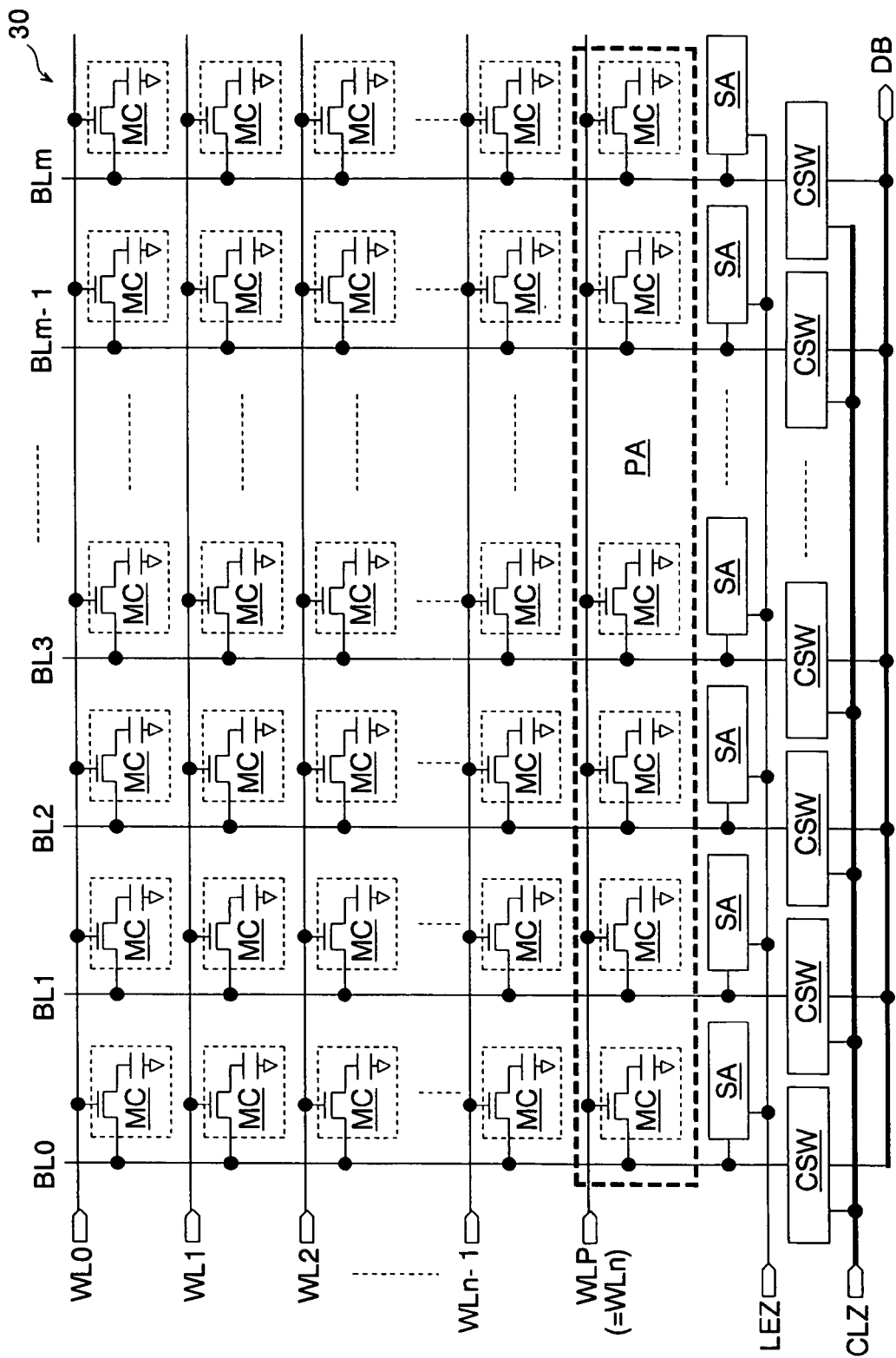
FIG. 4 is a block diagram showing the details of essential parts of the memory core shown in FIG. 1.

FIG. 4 shows the details of essential parts of the memory core 30 shown in FIG. 1.

The memory cell array ARY includes the memory cells MC arranged in a matrix, the plurality of word lines WL (WL0, WL1, . . . , WLP) connected to the memory cells MC, and the plurality of bit lines BL (BL0, BL1, . . . , BLm) connected to the memory cells MC. The memory cells MC aligning vertically in the diagram are connected to the respective same bit lines BL (any of BL0, BL1, . . . , BLm). The memory cells MC aligning horizontally in the diagram are connected to the respective same word lines WL (any of WL0, WL1, . . . WLP (WLn)).

The memory cells MC connected to the single word line WLP (partial word line) constitute a partial area PA (the frame in broken thick lines). The memory cells MC in the partial area PA are connected to different bit lines BL from one another. In this embodiment, when in the partial mode (low power consumption mode), the memory cells MC in the partial area PA retain data while the other memory cells MC lose data.

The sense amplifiers SA are connected to the bit lines BL0, BL1, . . . , BLm, respectively. The column switches CSW are connected to the bit lines BL0, BL1, . . . , BLm, respectively. Receiving the column line signal CLZ of high level, the column switches CSW turn on to connect the bit lines BL and the data bus DB.

Figure 5:
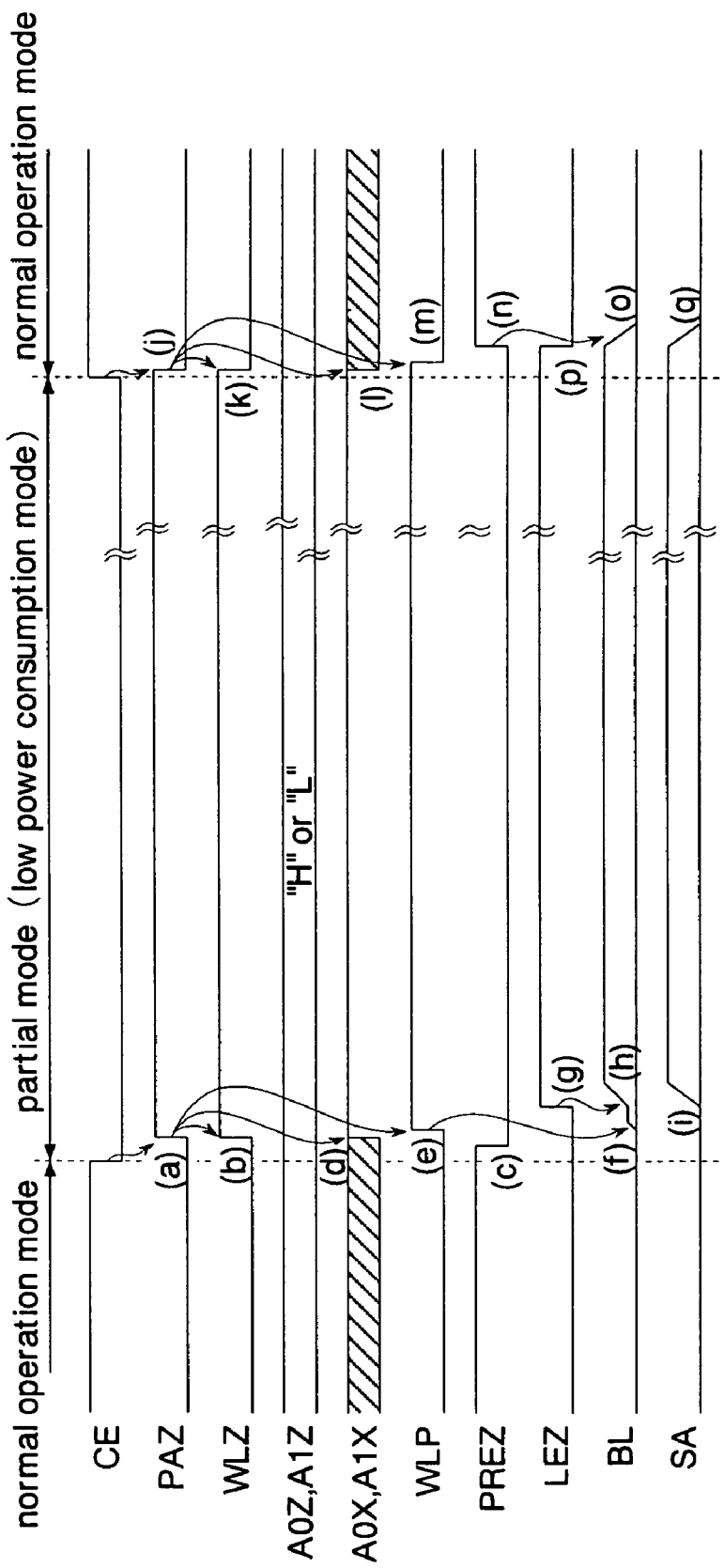
FIG. 5 is a timing chart showing the operation of the pseudo SRAM according to the first embodiment.

FIG. 5 shows the operation of the pseudo SRAM of the first embodiment. In this example, the mode register 14 shown in FIG. 1 is set at the partial mode.

With reference to FIG. 5, description will be given of features of the present invention, or shifting from normal operation mode to the partial mode, the state during the partial mode, and shifting from the partial mode to the normal operation mode. Although not shown in particular, read operations corresponding to read commands from exterior, write operations corresponding to write command from exterior, and refresh operations corresponding to refresh commands occurring internally are performed in the normal operation mode. The read operations, write operations, and refresh operations in the normal operation mode are performed the same as heretofore. Description thereof will thus be omitted here.

Initially, in the normal operation mode, the PA control circuit 12 shown in FIG. 2 changes the partial signal PAZ to high level in response to the chip enable signal CE's changing to low level (FIG. 5(a)). The word line control circuit 34 changes the word line control signal WLZ to high level in response to the partial signal PAZ of high level (FIG. 5(b)).

The core control circuit 28 shown in FIG. 1 changes the precharging signal PREZ to low level in response to the partial signal PAZ of high level (FIG. 5(c)). The change in the precharging signal PREZ releases the bit lines BL from the precharged state.

The word decoder WDEC shown in FIG. 3 fixes the address signals A0X and A1X to high level in response to the partial signal PAZ of high level (FIG. 5(d)). The word decoder WDEC also changes the word line signal WLP to high level in response to the address signals A0X and A1X of high level and the word line control signal WLZ of high level (FIG. 5(e)). That is, because of the shifting from the normal operation mode to the partial mode, the memory cells MC in the partial area PA are selected exclusively.

In accordance with the word line signal WLP's turning to high level, the data retained by the memory cells MC in the partial area PA is read to the bit lines BL (FIG. 5(f)). Subsequently, the sense amplifier control circuit 32 changes the sense amplifier activating signal LEZ to high level in response to the partial signal PAZ (FIG. 5(g)). The change in the LEZ signal activates the sense amplifiers SA, so that the bit lines BL are amplified in signal quantity (FIG. 5(h)). Then, the sense amplifiers SA latch the data retained by the memory cells MC in the partial area PA (FIG. 5(i)).

During the partial mode, the word line signal WLP and the sense amplifier activating signal LEZ are fixed to high level. The sense amplifiers SA, during the partial mode, thus keep latching the data retained by the memory cells MC in the partial area PA. During the partial mode, the internal circuitry of the pseudo SRAM maintains a static state and makes no change in output. Since the internal circuitry is composed of CMOS circuits, the power consumption under the static state falls to nearly zero. Consequently, the power consumption during the partial mode becomes significantly smaller than in conventional partial mode where self refresh is performed. Next, in the partial mode, the PA control circuit 12 changes the partial signal PAZ to low level in response to the chip enable signal CE's turning to high level (FIG. 5(j)). The word line control circuit 34 changes the word line control signal WLZ to low level in response to the partial signal PAZ of low level (FIG. 5(k)).

The word decoder WDEC releases the address signals A0X and A1X from the fixed high level in response to the partial signal PAZ of low level (FIG. 5(l)). The word decoder WDEC also changes the word line signal WLP to low level in response to the word line control signal WLZ of low level (FIG. 5(m)). The word line signal WLP's changing to low level causes release of the connection between the individual memory cells MC in the partial area PA and the bit lines BL, so that the memory cells MC retain the data that has been retained before the shifting to the partial mode. That is, the data of the memory cells MC in the partial area PA is retained during the partial mode.

The core control circuit 28 changes the precharging signal PREZ to high level in response to the partial signal PAZ of low level (FIG. 5(n)). The change in the precharging signal PREZ precharges the bit lines BL (FIG. 5(o)). The sense amplifier control circuit 32 changes the sense amplifier activating signal LEZ to low level in response to the partial signal PAZ (FIG. 5(p)). The change in the LEZ signal inactivates the sense amplifiers SA, so that the data latched in the sense amplifiers SA disappears (FIG. 5(q)).

As above, according to the present embodiment, the data retained by the memory cells MC in the partial area PA is kept latched in the sense amplifiers SA during the partial mode. This can eliminate the need for a refresh operation to retain the data in the memory cells MC. The sense amplifiers are composed of CMOS circuits. Thus, the sense amplifiers SA are low in power consumption even if they keep latching data. Consequently, the power consumption during the partial mode can be reduced significantly as compared to heretofore.

During the partial mode, the word decoder WDEC disables the selection of the word lines WL other than in the partial area PA. Consequently, the word lines WL can be prevented from multiple selection in the partial mode, avoiding data crash.

While the sense amplifiers SA keep latching data during the partial mode, the word line control circuit 34 keeps selecting the partial word line WLP. This simplifies the selecting/deselecting control of the word lines, allowing a reduction in the scale of the word line control circuit 34.

In accordance with the chip enable signal CE for operating the pseudo SRAM, the operation mode shifts to the normal operation mode or the partial mode. Thus, the operation mode of the pseudo SRAM can be shifted by simple control. As a result, the control circuit of a system implementing the pseudo SRAM can be configured simply.

Figure 6:
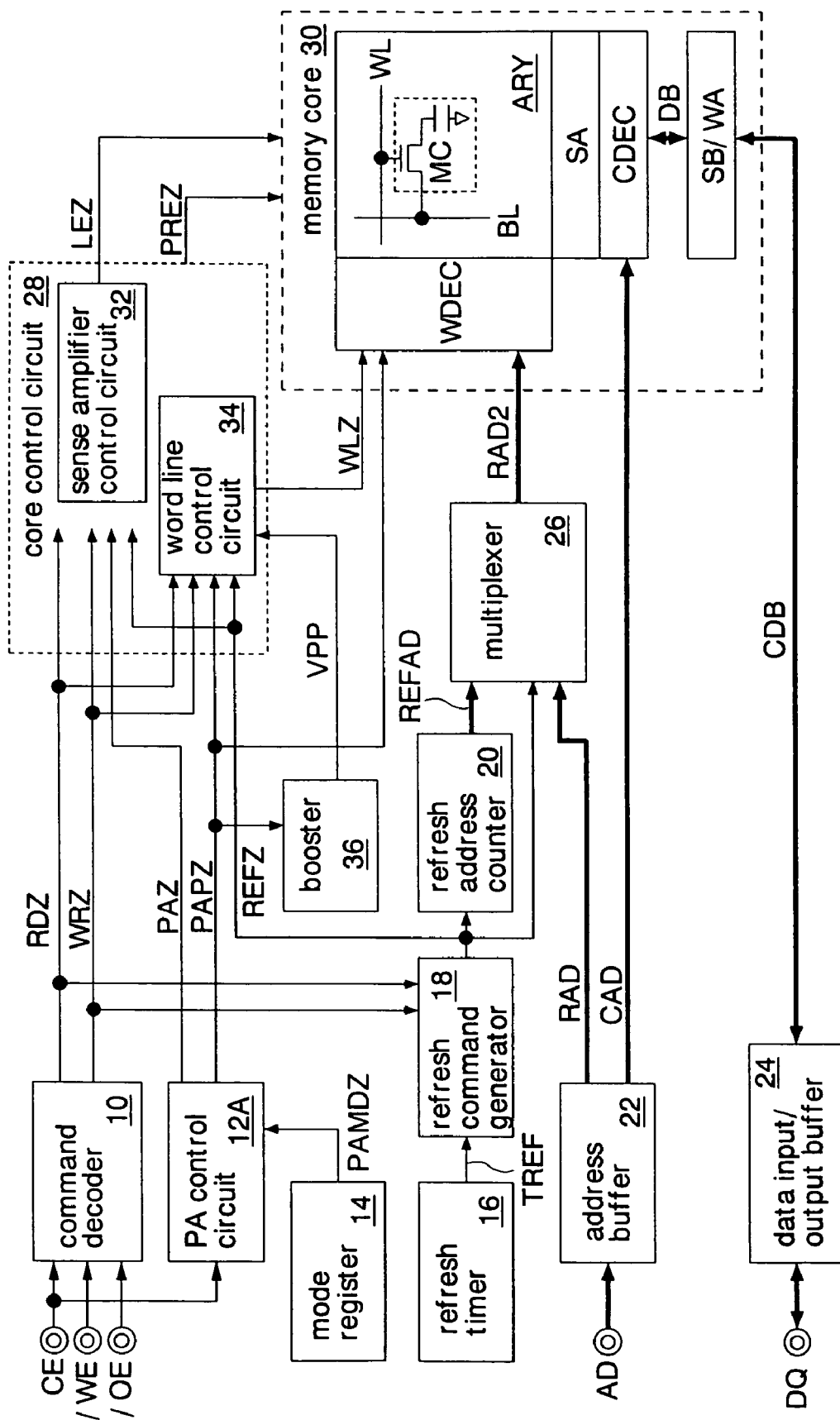
FIG. 6 is a block diagram showing a second embodiment of the semiconductor memory of the present invention.

FIG. 6 shows a second embodiment of the semiconductor memory of the present invention. The same elements as those described in the first embodiment will be designated by identical reference numbers or symbols. Detailed description thereof will be omitted here.

In this embodiment, a PA control circuit 12A is formed instead of the PA control circuit 12 of the first embodiment. There is also provided a booster 36 for supplying the word lines WL with a boost voltage VPP which is higher than the power supply voltage. The rest of the configuration is almost the same as in the first embodiment. That is, the semiconductor memory of the present embodiment is formed as a pseudo SRAM with DRAM memory cells and an SRAM interface, by using CMOS technology.

The PA control circuit 12A outputs the partial signal PAZ and a pulse signal PAPZ. When the pulse signal PAPZ is at high level, the booster 36 is activated to operate, generating the boost voltage VPP. The boost voltage VPP is supplied to the word decoder WDEC.

Figure 7:
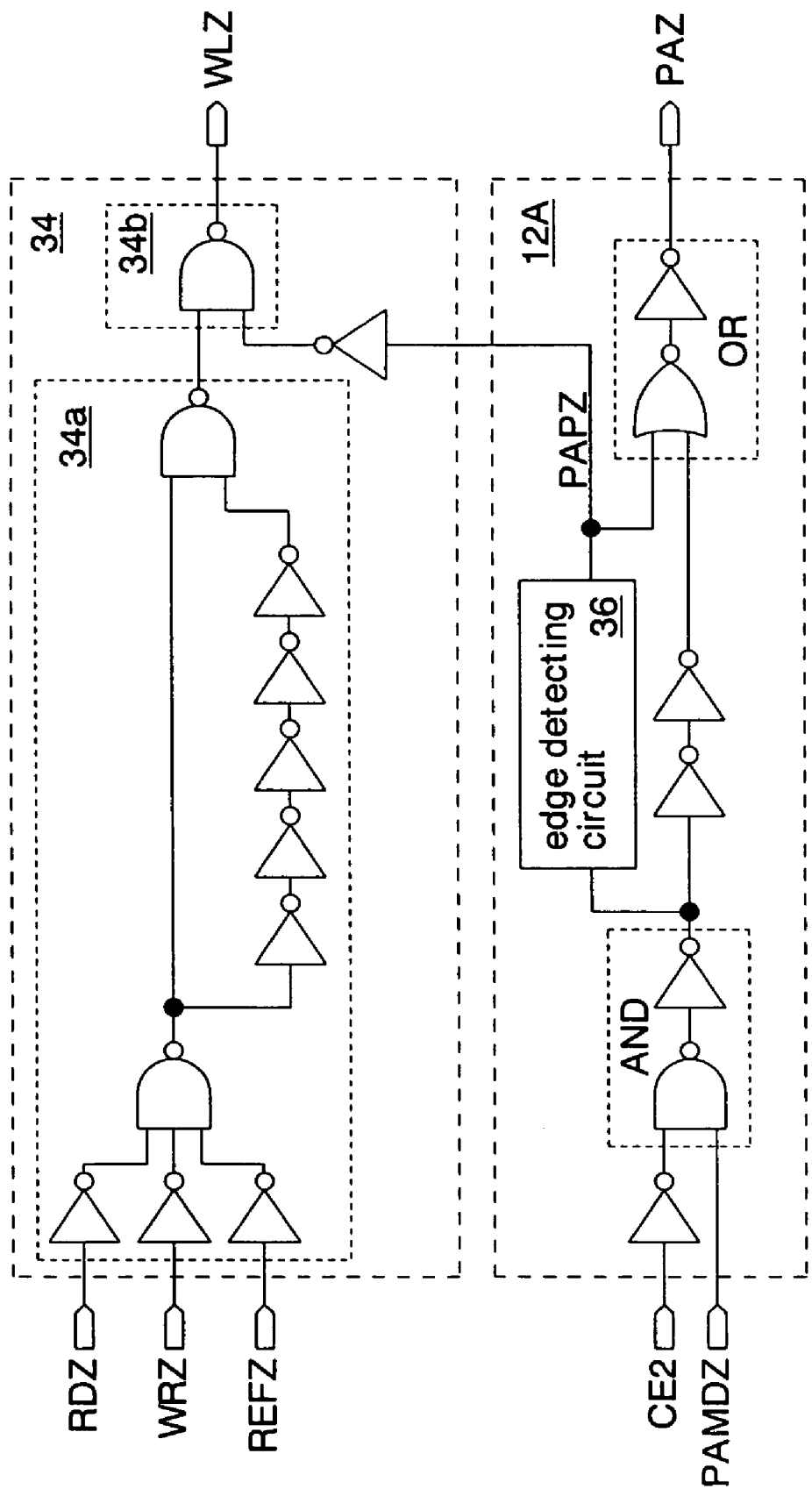
FIG. 7 is a circuit diagram showing the details of the PA control circuit and the word line control circuit shown in FIG. 6.

FIG. 7 shows the details of the PA control circuit 12A and the word line control circuit 34 shown in FIG. 6.

The PA control circuit 12A has an edge generating circuit 36 which receives the output of an AND circuit, and an OR circuit which receives the output of the edge generating circuit 36 and the output of the AND circuit. The edge generating circuit 36 outputs the pulse signal PAPZ of high level in synchronization with the transition edges of the signal that is output from the AND circuit. The OR circuit outputs, as the partial signal PAZ, the OR logic between the inverted signal of the chip enable signal CE and the pulse signal PAPZ when the mode signal PAMDZ is at high level.

The word line control circuit 34 outputs the word line control signal WLZ of predetermined pulse width in synchronization with the RDZ signal, WRZ signal, or REFZ signal when the pulse signal PAPZ is at low level. In synchronization with the period where the pulse signal PAPZ is at high level, the word line control circuit 34 changes the word line control signal WLZ to high level.

Figure 8:
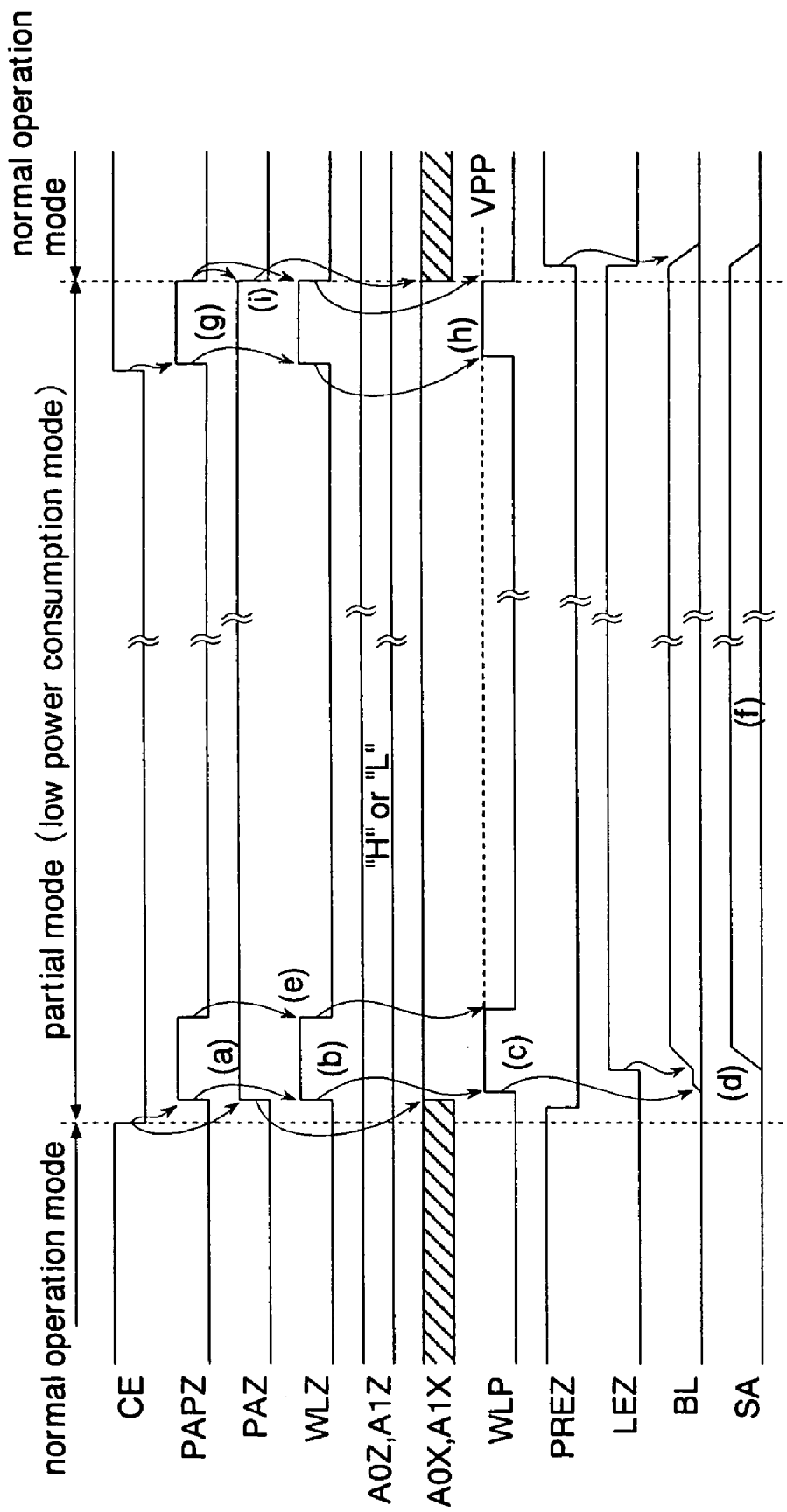
FIG. 8 is a timing chart showing the operation of the pseudo SRAM according to the second embodiment.

FIG. 8 shows the operation of the pseudo SRAM of the second embodiment. Description will be omitted of the same operation as in the first embodiment (FIG. 5). In this example, the mode register 14 shown in FIG. 6 is set at the partial mode.

Initially, in the normal operation mode, the PA control circuit 12A shown in FIG. 6 changes the pulse signal PAPZ to high level for a predetermined period and changes the partial signal PAZ to high level in response to the chip enable signal CE's turning to low level (FIG. 8(a)). The word line control circuit 34 changes the word line control signal WLZ to high level in response to the high-level period of the pulse signal PAPZ (FIG. 8(b)).

In response to the change in the word line control signal WLZ, the word line WLP rises to the boost voltage (FIG. 8(c)). Then, as in FIG. 5, the data retained by the memory cells MC in the partial area PA is read to the bit lines BL and latched into the sense amplifiers SA (FIG. 8(d)).

Incidentally, the selection of the word lines WL by using the boost voltage higher than the power supply voltage can lower the ON resistance of the transfer transistors in the memory cells MC. This can increase the charges to be retained by the memory cells MC, with extended refresh intervals in the normal operation mode.

Next, the word line control signal WLZ changes to low level in response to the pulse signal PAPZ's changing to low level (FIG. 8(e)). The word line signal WLP's changing to low level causes release of the connection between the memory cells MC in the partial area PA and the bit lines BL. That is, the data retained by the memory cells MC in the partial area PA disappears gradually. Moreover, after the pulse signal PAPZ changes to low level, the booster 36 for generating the boost voltage to be supplied to the word lines WL stops operating. This allows a reduction in the power consumption of the booster 36 in the partial mode.

Meanwhile, the sense amplifier activating signal LEZ is kept at high level while the partial signal PAZ is at high level. Thus, the sense amplifiers SA keep retaining the data (FIG. 8(f)). Subsequently, the pulse signal PAPZ changes to high level again in synchronization with the chip enable signal CE's changing to high level (FIG. 8(g)). In response to the pulse signal PAPZ of high level, the word line control signal WLZ and the word line signal WLP change to high level in succession (FIG. 8(h)). Then, the memory cells MC in the partial area PA and the bit lines BL are connected with each other, so that the data latched in the sense amplifiers SA is written to the memory cells MC. That is, the data having been written in the memory cells MC in the partial area PA before the shifting to the partial mode is retained without loss.

Subsequently, the partial signal PAZ changes to low level in response to the pulse signal PAPZ's changing to low level (FIG. 8(i)). The change in the partial signal PAZ inactivates the sense amplifiers SA and precharges the bit lines BL. The operation mode of the pseudo SRAM thus shifts from the partial mode to the normal operation mode.

As above, this embodiment can offer the same effects as those of the first embodiment described above. Besides, in this embodiment, the word line WLP is selected for a predetermined period on shifting to the partial mode so that the data retained by the memory cells MC is latched into the sense amplifiers SA. At the time of returning from the partial mode to the normal operation mode, the word line WLP is selected for a predetermined period again so that the data latched in the sense amplifiers SA is written to the memory cells MC. Since the word line WLP need not be maintained at high level throughout the partial mode, power consumption can be reduced of the circuitry for generating the high level of the word line WLP. In particular, for the case of a pseudo SRAM in which the word lines WL are supplied with the boost voltage, the power consumption of the booster 36 for generating the boost voltage can be reduced in the partial mode. This consequently allows a further reduction in the power consumption of the pseudo SRAM in the partial mode.

Figure 9:
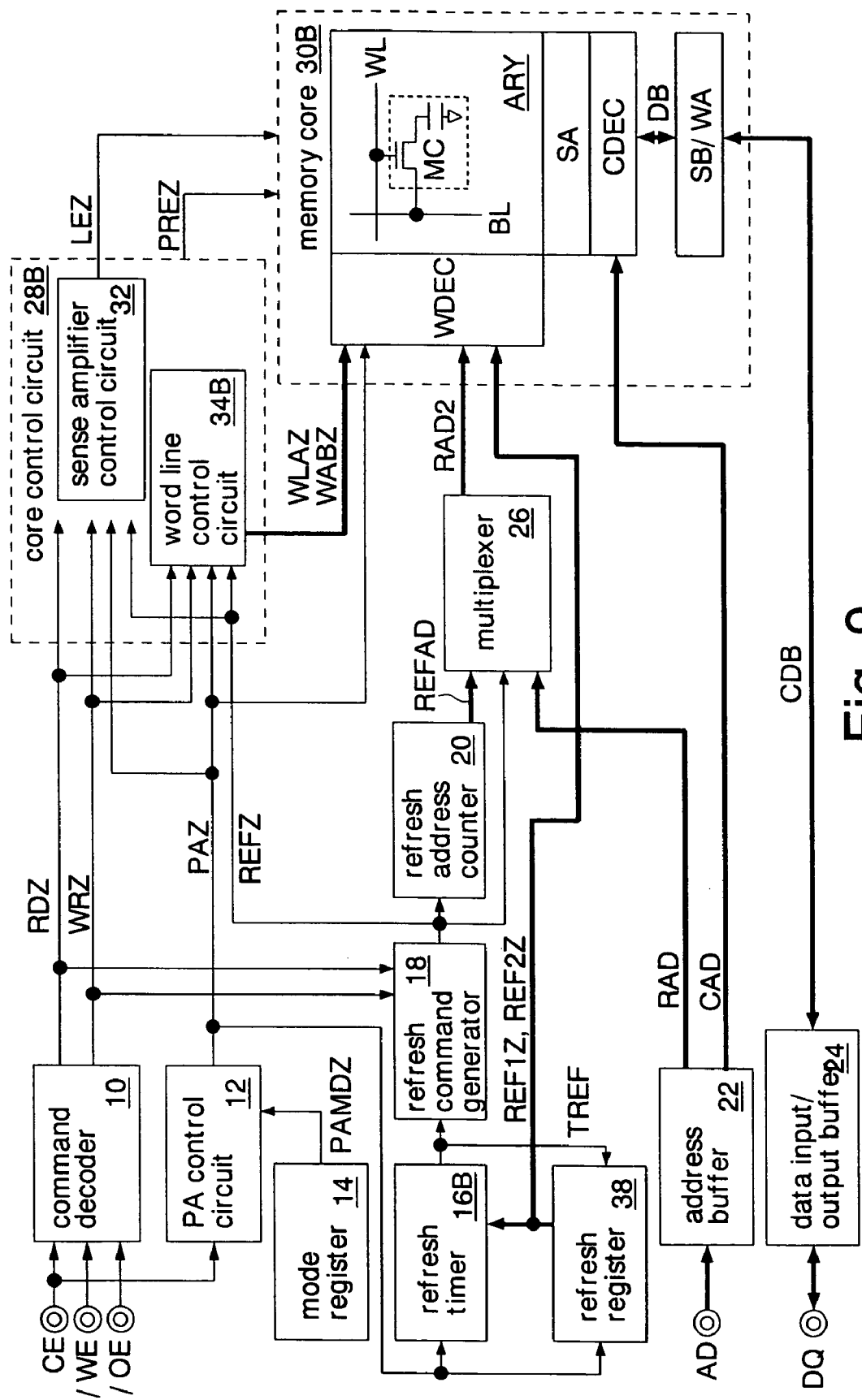
FIG. 9 is a block diagram showing a third embodiment of the semiconductor memory of the present invention.

FIG. 9 shows a third embodiment of the semiconductor memory of the present invention. The same elements as those described in the first embodiment will be designated by identical reference numbers or symbols. Detailed description thereof will be omitted here.

The pseudo SRAM of this embodiment has a refresh timer 16B, a core control circuit 28B, a word line control circuit 34B, and a memory core 30B instead of the refresh timer 16, the core control circuit 28, the word line control circuit 34, and the memory core 30 of the first embodiment. Moreover, a refresh register 38 is formed additionally. The rest of the configuration is almost the same as in the first embodiment.

The refresh register 38 receives the partial signal PAZ from the PA control circuit 12 and the refresh request signal TREF from the refresh timer 16B, and outputs refresh control signals REF1Z and REF2Z. The refresh timer 16B receives the partial signal PAZ and the refresh control signals REF1Z and REF2Z, and outputs the refresh request signal TREF.

The word line control circuit 34B of the core control circuit 28B receives the read control signal RDZ, the write control signal WRZ, the refresh control signal REFZ, and the partial control signal PAZ, and outputs word line control signals WLAZ and WLBZ. The memory core 30B has a word decoder WDEC that is different from the one in the first embodiment. The rest of the configuration is the same as in the first embodiment. Like the first embodiment, the core control circuit 28B operates as an operation control circuit for performing read operations, write operations, and refresh operations.

Figure 10:
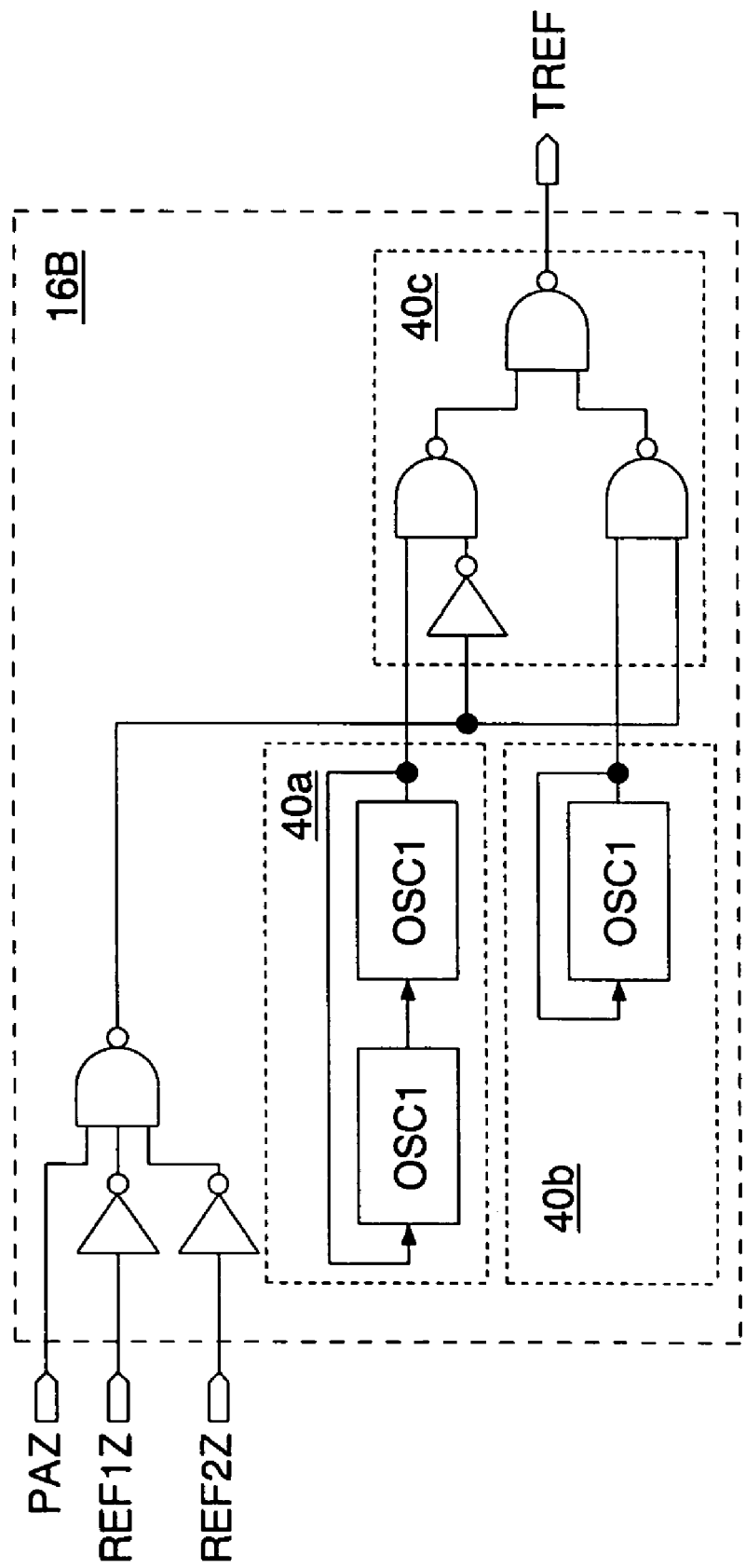
FIG. 10 is a circuit diagram showing the details of the refresh timer shown in FIG. 9.

FIG. 10 shows the details of the refresh timer 16B shown in FIG. 9.

The refresh timer 16B includes an oscillating circuit 40a consisting of two oscillators OSC1 connected in series, an oscillating circuit 40b consisting of a single oscillator OSC1, and a selector 40c for selecting either of the outputs of the oscillating circuits 40a and 40b and outputting it as the refresh request signal TREF. The three oscillators OSC1 have the same oscillation cycle. When the refresh timer 16B receives the PAZ signal of high level and the REF1Z signal and REF2Z signal of low level, it outputs the refresh request signal TREF having the cycle of the oscillating circuit 40a. When the refresh timer 16B receives the PAZ signal of low level, the REF1Z signal of high level, or the REF2Z signal of high level, it outputs the refresh request signal TREF having the cycle of the oscillating circuit 40b.

Figure 11:
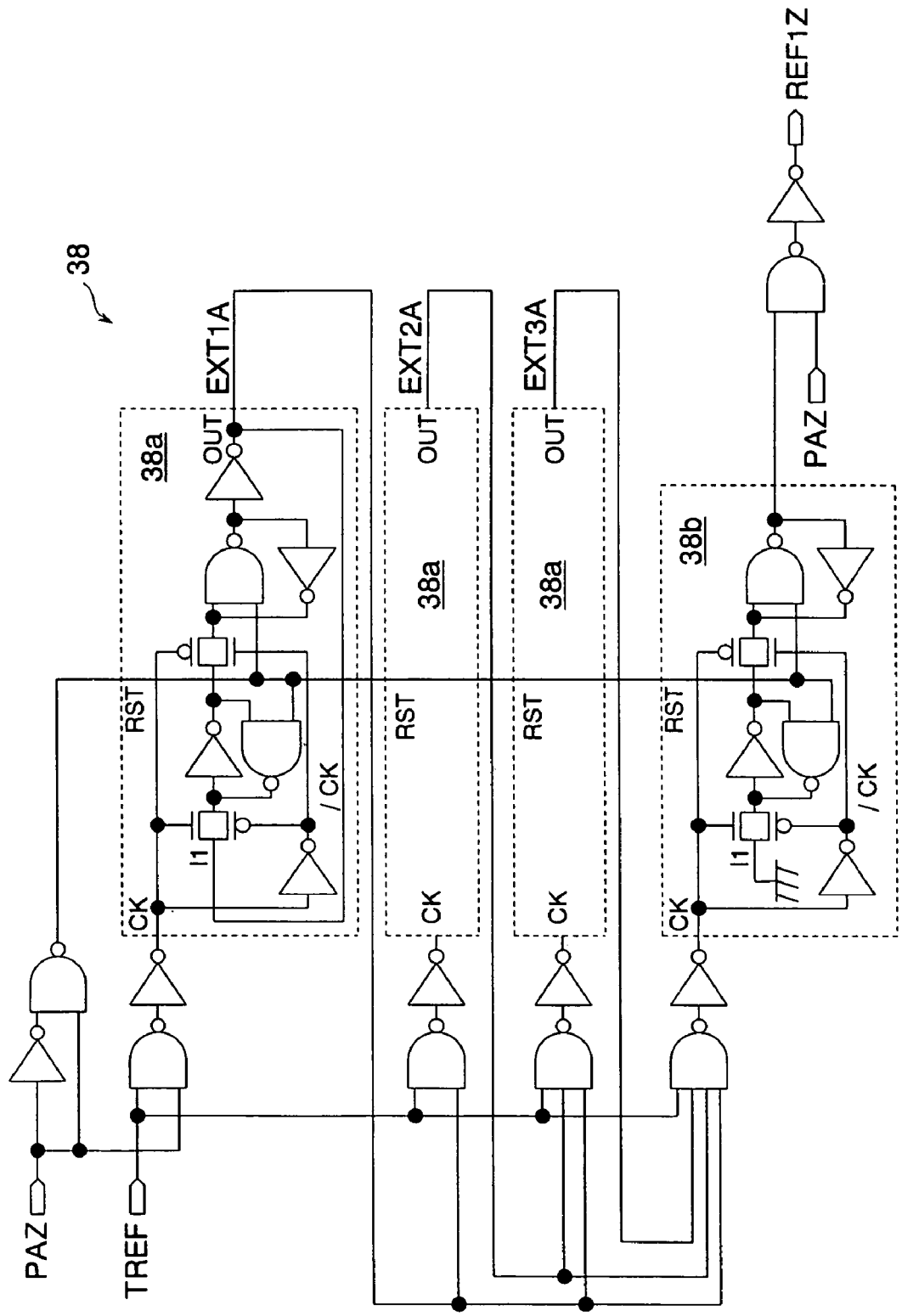
FIG. 11 is a circuit diagram showing the details of the refresh register shown in FIG. 9.
Figure 12:
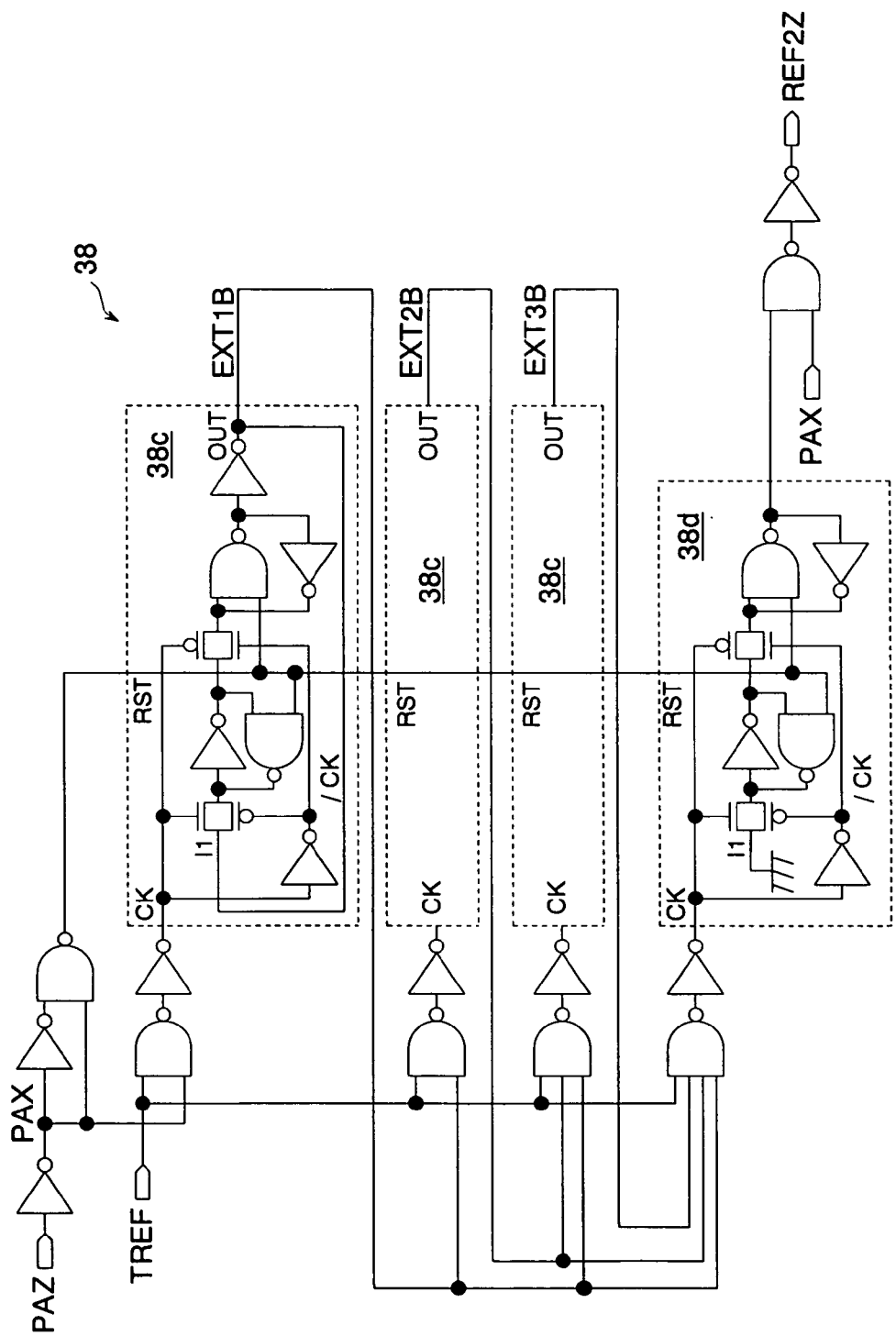
FIG. 12 is a circuit diagram showing the details of the refresh register shown in FIG. 9.

FIGS. 11 and 12 show the details of the refresh register 38 shown in FIG. 9. FIG. 11 shows a circuit for generating the refresh control signal REF1Z, and FIG. 12 a circuit for generating the refresh control signal REF2Z. For ease of explanation, FIGS. 11 and 12 deal with the case where the pseudo SRAM has eight word lines WL and all the memory cells MC are refreshed by eight refresh request signals TREF. In fact, the pseudo SRAM has 2048 word lines WL, for example. In this case, the numbers of latches 38a and 38c shown in FIGS. 11 and 12 are eleven each (11-bit counters).

In FIG. 11, the refresh register 38 has a latch 38b. The latch 38b receives the outputs of the respective latches 38a constituting a 3-bit counter and the output of the counter, and outputs the refresh control signal REF1Z when the partial signal PAZ is at high level. The latches 38a and 38b are initialized in synchronization with the rising edge of the partial signal PAZ. The latches 38a, when initialized, reset their respective output signals EXT1A, EXT2A, and EXT3A to low level.

The latch 38a at the initial stage operates receiving the refresh request signal TREF at its clock terminal CK when the partial signal PAZ is at high level. The second latch 38a operates receiving the refresh request signal TREF at its clock terminal CK when the partial signal PAZ and the output signal EXT1A are at high level. The third latch 38a operates receiving the refresh request signal TREF at its clock terminal CK when the partial signal PAZ and the output signals EXT1A, EXT2A are at high level. The latch 38b operates receiving the refresh request signal TREF at its clock terminal CK when the partial signal PAZ and the output signals EXT1A, EXT2A, and EXT3A are at high level.

In FIG. 12, the refresh register 38 has a latch 38d. The latch 38d receives the outputs of the respective latches 38c constituting a 3-bit counter and the output of the counter, and outputs the refresh control signal REF2Z when the partial signal PAZ is at low level. The latches 38c and 38d are initialized in synchronization with the falling edge of the partial signal PAZ. The latches 38c, when initialized, reset their respective output signals EXT1B, EXT2B, and EXT3B to low level.

The latch 38c at the initial stage operates receiving the refresh request signal TREF at its clock terminal CK when the partial signal PAZ is at low level. The second latch 38c operates receiving the refresh request signal TREF at its clock terminal CK when the partial signal PAZ is at low level and the output signal EXT1B is at high level. The third latch 38c operates receiving the refresh request signal TREF at its clock terminal CK when the partial signal PAZ is at low level and the output signals EXT1B, EXT2B are at high level. The latch 38d operates receiving the refresh request signal TREF at its clock terminal CK when the partial signal PAZ is at low level and the output signals EXT1B, EXT2B, and EXT3B are at high level.

Figure 13:
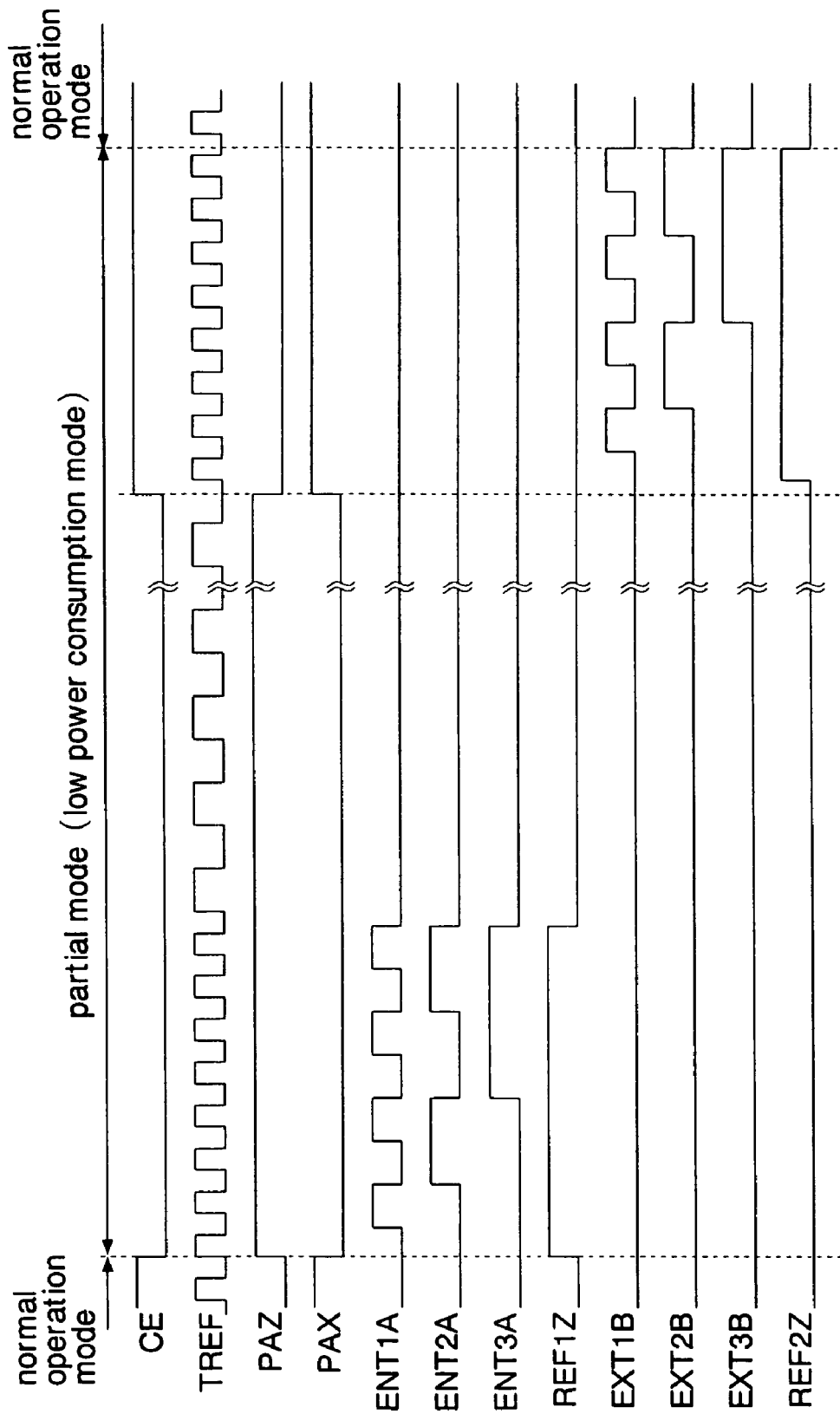
FIG. 13 is a timing chart showing the operation of the refresh timer and the refresh register.

FIG. 13 shows the operation of the refresh timer 16B and the refresh register 38.

The refresh register 38 starts counting the refresh request signal TREF in synchronization with the rising edge of the partial signal PAZ, which varies in synchronization with the chip enable signal CE. The refresh register 38 maintains the refresh control signal REF1Z at high level while counting eight refresh request signals TREF.

Moreover, the refresh register 38 starts to count the refresh request signal TREF in synchronization with the falling edge of the partial signal PAZ. The refresh register 38 maintains the refresh control signal REF2Z at high level while counting eight refresh request signals TREF.

The refresh timer 16B outputs the refresh request signal TREF with the cycle of the oscillator OSC1 when the partial signal PAZ is at low level and when the refresh control signals REF1Z, REF2Z are at high level. The refresh timer 16B outputs the refresh request signal TREF with the cycle twice that of the oscillator OSC1 when the partial signal PAZ is at high level and the refresh control signals REF1Z, REF2Z are at low level.

Consequently, at the start and end of the partial mode, the refresh request signal TREF is output with the same cycle as in the normal operation mode. In the middle of the partial mode, the refresh request signal TREF is output with the cycle twice as much as in the normal operation mode. In fact, the refresh control signals REF1Z and REF2Z are maintained at high level while 2048 refresh request signals TREF are output.

Figure 14:
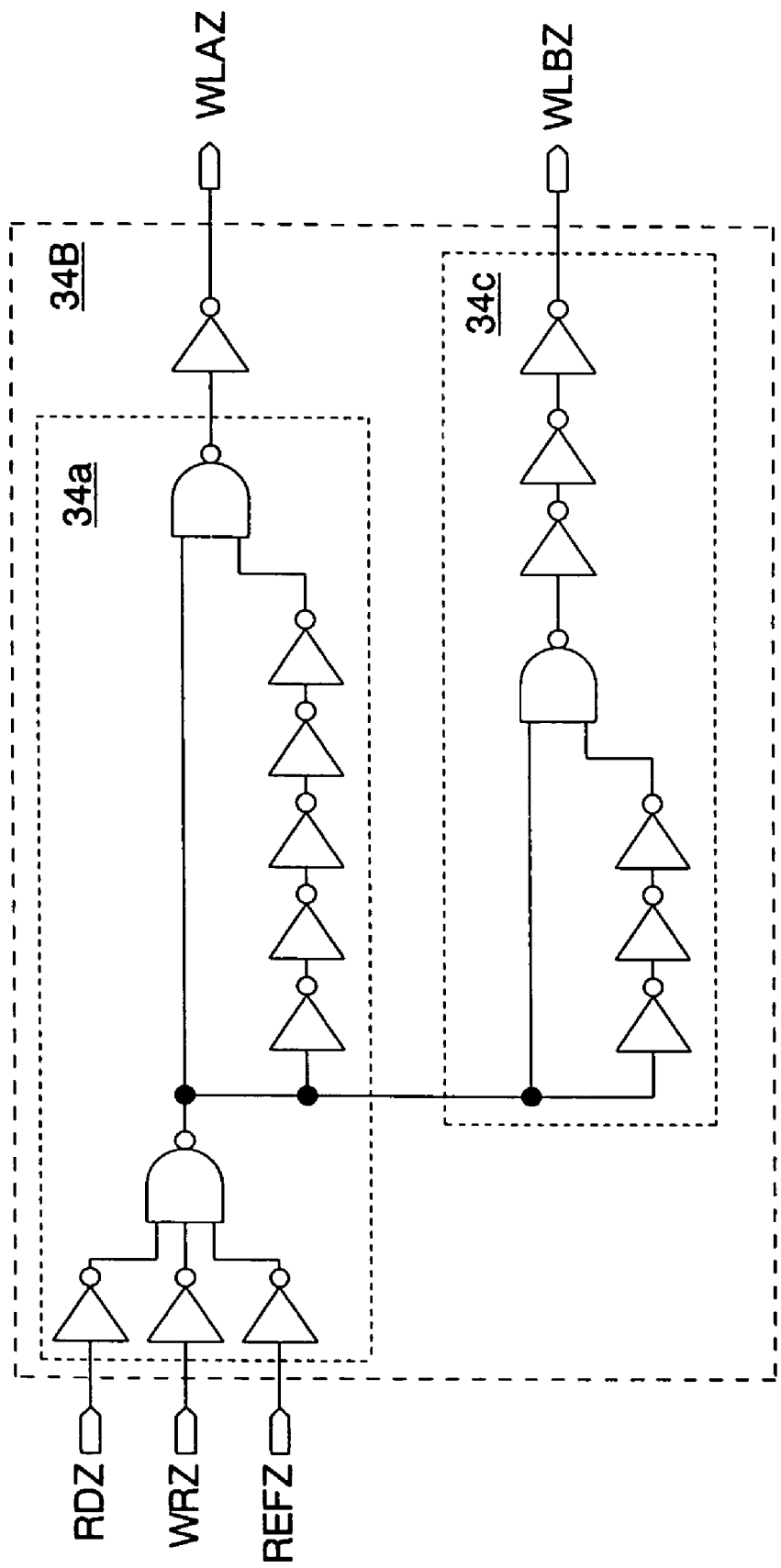
FIG. 14 is a circuit diagram showing the details of the word line control circuit shown in FIG. 9.

FIG. 14 shows the details of the word line control circuit 34B shown in FIG. 9.

The word line control circuit 34B is formed by adding a new edge detecting circuit 34c to the edge detecting circuit 34a of the word line control circuit 34 in the first embodiment. When the edge detecting circuit 34c detects the transition edges of the RDZ signal, the WRZ signal, and the REFZ signal, it generates a detecting signal of smaller pulse width than the edge detecting circuit 34a does. Then, the edge detecting circuit 34a outputs the word line control signal WLAZ on detecting the transition edges of the RDZ signal, the WRZ signal, and the REFZ signal. The edge detecting circuit 34c outputs the word line control signal WLBZ having the pulse width smaller than that of the word line control signal WLAZ, on receiving the transition edges of the RDZ signal, the WRZ signal, and the REFZ signal. Besides, the word line control signal WLBZ is generated after the word line control signal WLAZ.

Figure 15:
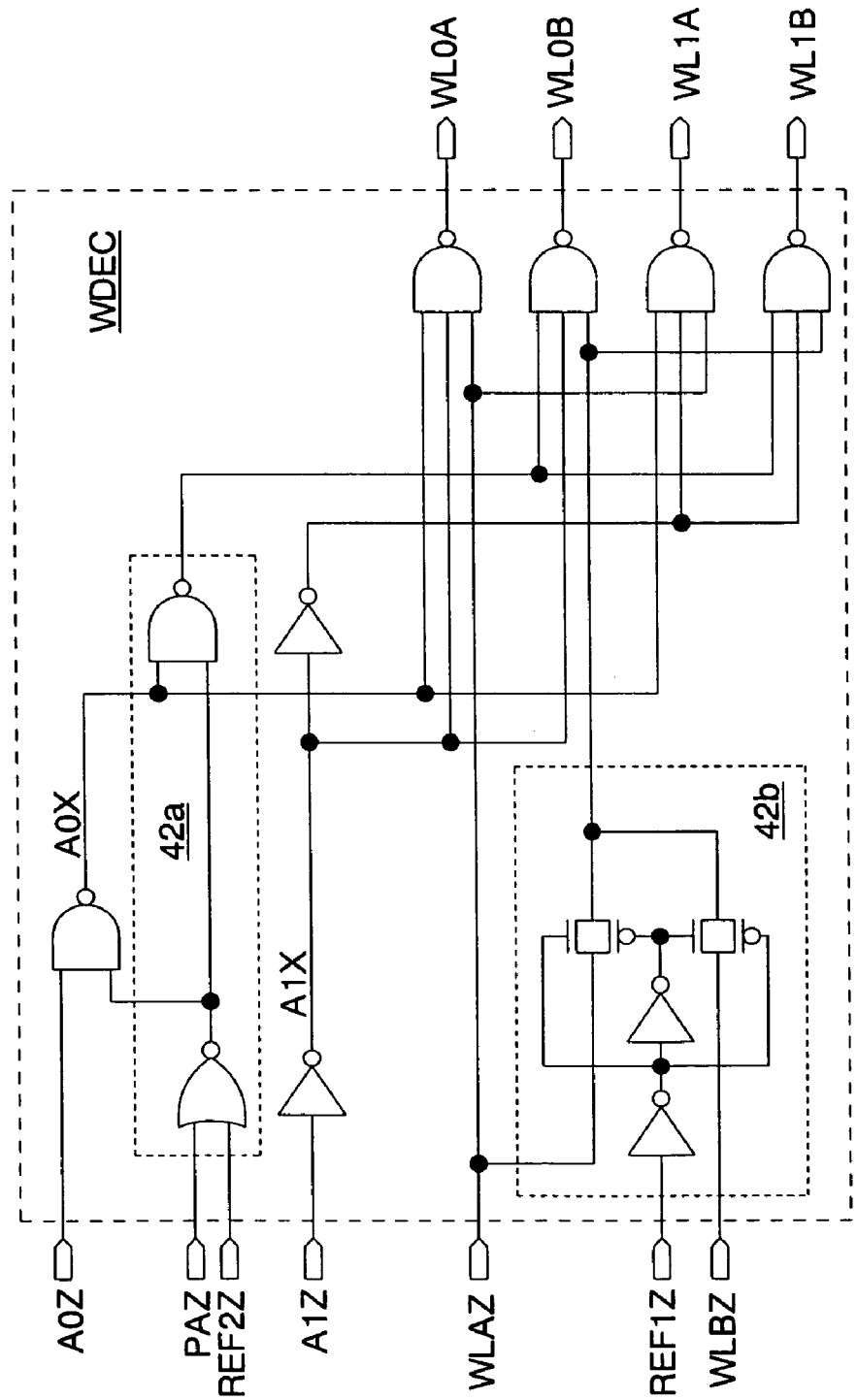
FIG. 15 is a circuit diagram showing the details of the word decoder shown in FIG. 9.

FIG. 15 shows the details of the word decoder WDEC shown in FIG. 9. For the sake of plain explanation, FIG. 15 shows only part of a circuit that corresponds to two bits of row address signals A0Z and A1Z. In fact, the word decoder WDEC receives address signals for selecting all the word lines WL in the memory core 30.

The word decoder WDEC has a gate circuit 42a and a selector 42b. The gate circuit 42a masks the address signal A0Z to output high level when the partial signal PAZ and the refresh control signal REF1Z are at high level. The selector 42b selects the word line control signal WLBZ when the refresh control signal REF1Z is at high level, and selects the word line control signal WLAZ when the refresh control signal REF1Z is at low level.

Then, in the normal operation mode, any of the word lines (word line signals) WL0A, WL0B, WL1A, and WL1B changes to high level according to the address signals A0X and A1X. During the partial mode, the lower address signal A0X is masked so that two word lines (for example, WL0A and WL0B) are selected according to the address signal A1X.

Furthermore, on shifting from the normal operation mode to the partial mode (PAZ, REF1Z="H"), the word lines WL ending in "A" are supplied with a high-level pulse that has the same pulse width as that of the word line control signal WLAZ. The word lines WL ending in "B" are supplied with a high-level pulse that has the same pulse width as that of the word line control signal WLBZ (a pulse width smaller than that of the word line control signal WLAZ). At the time of returning from the partial mode to the normal operation mode (REF2Z="H"), the lower address signal A0X is masked so that two word lines (for example, WL0A and WL0B) are selected according to the address signal A1X. The two word lines are supplied with a high-level pulse having the same pulse width as that of the word line control signal WLAZ.

Figure 16:
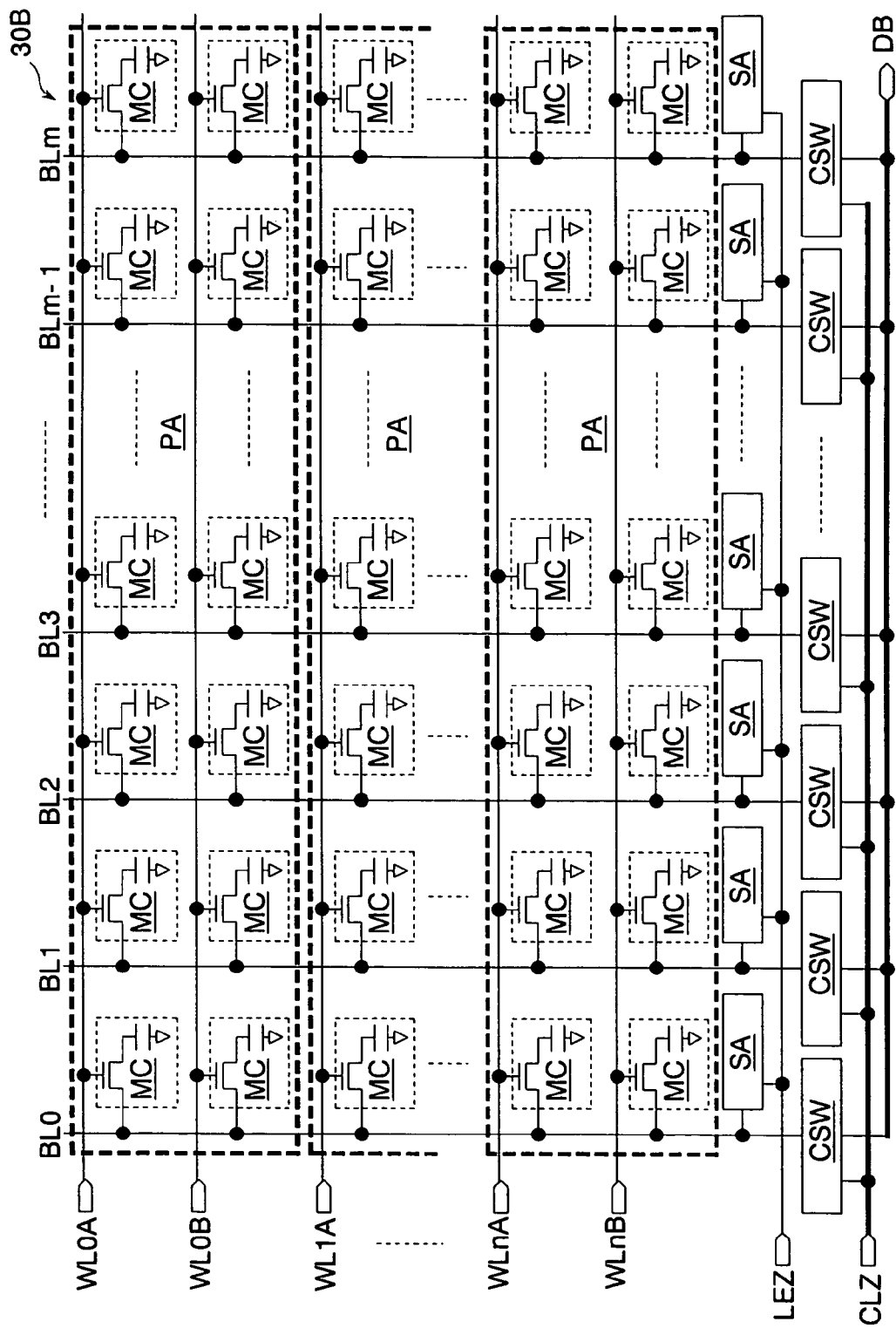
FIG. 16 is a block diagram showing the details of essential parts of the memory core shown in FIG. 9.

FIG. 16 shows the details of essential parts of the memory core 30B shown in FIG. 9.

In this embodiment, partial areas PA are established for two word lines each (for example, WL0A and WL0B). During the partial mode, data is retained by the memory cells MC (first memory cells) connected to the word lines WL ending in "A" (first word lines) and the memory cells MC (second memory cells) connected to the word lines WL ending in "B" (second word lines). That is, the data capacity available for retention during the partial mode is a half of the memory capacity of the memory core 30B. The rest of the basic configuration is the same as that of the memory core 30 in the first embodiment.

Figure 17:
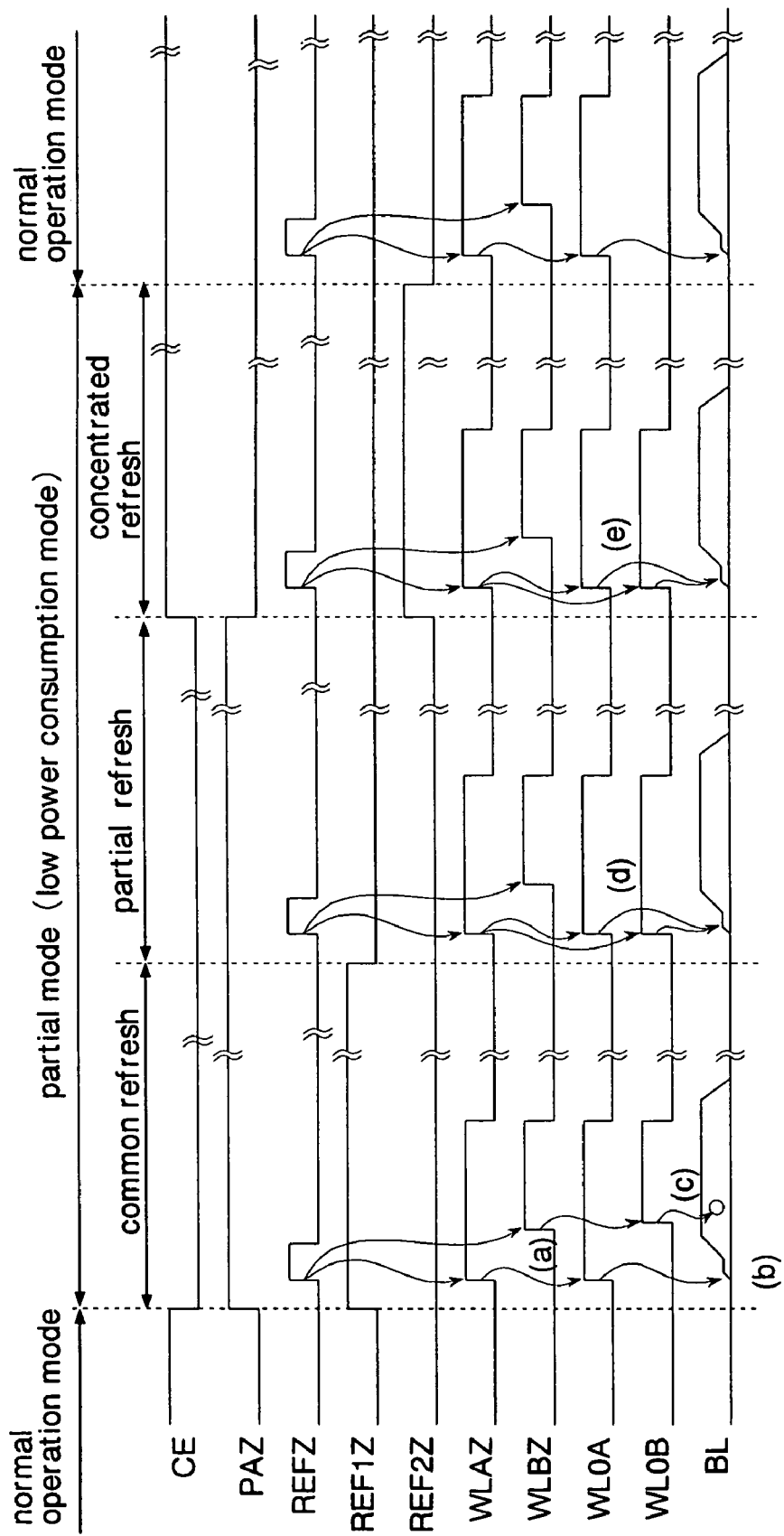
FIG. 17 is a timing chart showing the refresh operations of the pseudo SRAM according to the third embodiment.

FIG. 17 shows an overview of refresh operations in the pseudo SRAM of the third embodiment.

At the start of the partial mode, the word line control signal WLAZ is output, and then the word line control signal WLBZ is output (FIG. 17(a)). Thus, the word line WL0A is selected before the word line WL0B is. The data in the memory cells MC connected to the word line WL0A is then read to the bit lines BL (FIG. 17(b)). After the word line WL0A is selected, the sense amplifiers SA start operating before the selection of the word line WL0B. By this operation, the data in the memory cells connected to the word line WL0A can be surely transferred to the memory cells connected to the word line WL0B.

The data amplified by the sense amplifiers SA is written to the memory cells MC connected to the word line WL0B through the selection of the word line WL0B (FIG. 17(c)). This operation can be repeated so that the data retained in a single memory cell is shared between two memory cells MC (common refresh).

During the partial mode, the word lines WL0A and WL0B are simultaneously selected in synchronization with the word line control signal WLAZ (FIG. 17(d)), whereby a refresh operation is performed on two memory cells MC at a time (partial refresh). The sense amplifiers SA start operating after the selection of the word lines WL0A and WL0B. At the end of the partial mode, the word lines WL0A and WL0B are simultaneously selected in synchronization with the word line control signal WLAZ (FIG. 17(e)), whereby a refresh operation is performed on two memory cells MC at a time (concentrated refresh). Subsequently, in the normal operation mode, each single word line WL is selected successively in synchronization with the word line control signal WLAZ. Refresh operations are performed on the memory cells MC connected to the word lines WL in succession.

Figure 18:
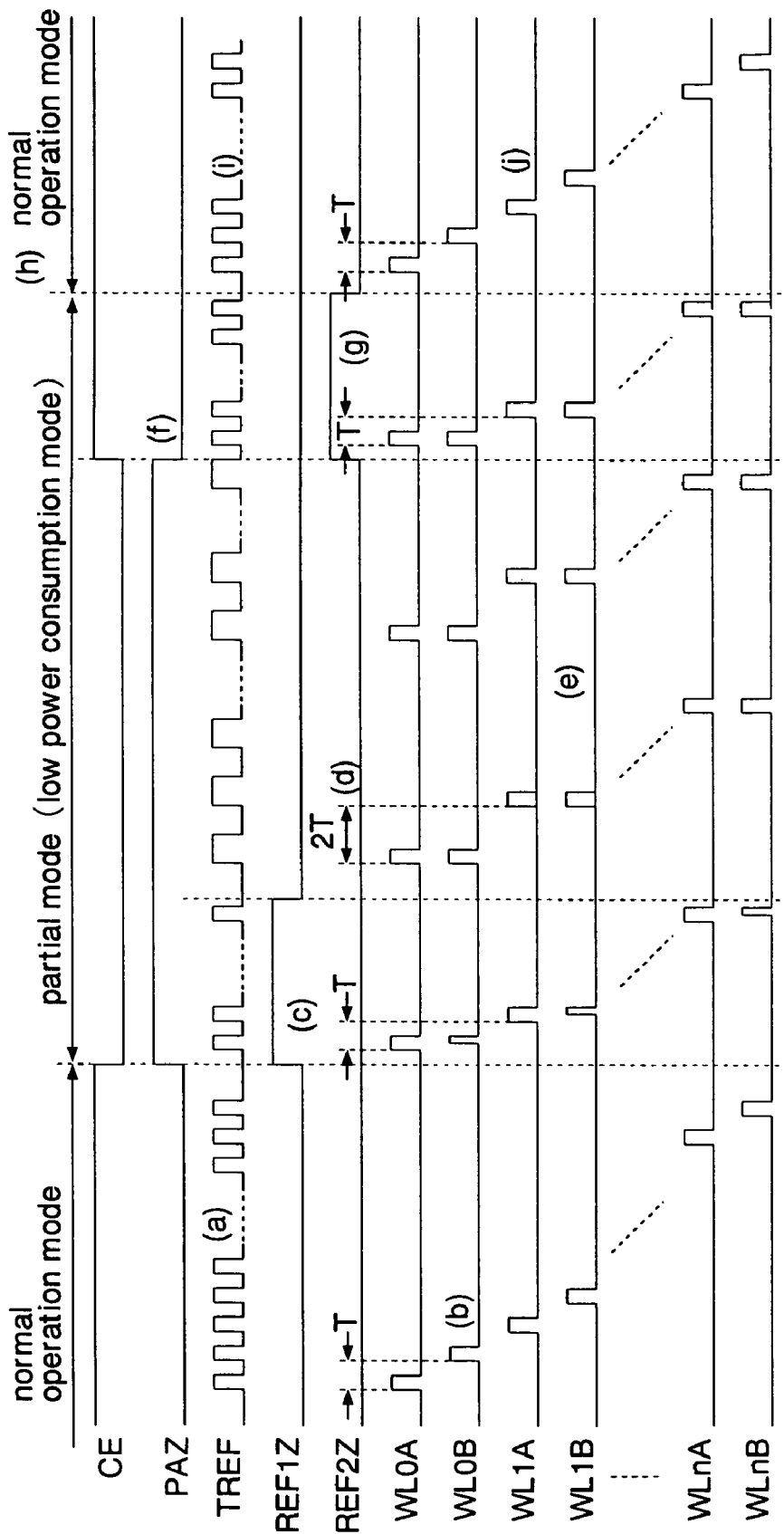
FIG. 18 is a timing chart showing the operation of the pseudo SRAM according to the third embodiment.

FIG. 18 shows the operation of the pseudo SRAM of the third embodiment. With reference to FIG. 18, description will be given of features of the present invention, or refresh operations on shifting from the normal operation mode to the partial mode, during the partial mode, and on shifting from the partial mode to the normal operation mode.

Initially, in the normal operation mode, the refresh request signal TREF is output at an oscillation cycle T of the oscillating circuit 40b shown in FIG. 10 (FIG. 18(a)). In accordance with the refresh request signal TREF, the word lines WL are selected one by one so that refresh operations are performed during intervals between read and write operations (FIG. 18(b)).

On shifting from the normal operation mode to the partial mode, the refresh register 38 shown in FIG. 11 changes the refresh control signal REF1Z to high level in synchronization with high-level changes of the partial signal PAZ, until the refresh request signal TREF is output a predetermined number of times (FIG. 18(c)). In synchronization with the refresh request signal TREF, the word decoder WDEC shown in FIG. 15 selects the word lines WL in two. Here, a word line WL ending in "B" is selected after a word line WL ending in "A". Consequently, the data in the memory cells MC connected to the word line WL ending in "A" is written to the memory cells MC connected to the word line WL ending in "B" (common refresh operation). That is, in the partial mode, the data is retained by every two memory cells MC in the partial area PA.

The common refresh operation is performed on all the partial areas PA in succession with the same cycle as that of the refresh request signal TREF in normal operations. This prevents the data retained in the memory cells MC from disappearing while common refresh operations are performed.

After the common refresh operations are completed of all the partial areas PA, the data is retained by using every two memory cells MC. Thus, the time for which data can be retained becomes twice longer than when data is retained by using each single memory cell MC. In fact, the data retention characteristic is the sum of the retention characteristics of two memory cells MC. The time for which data can be retained thus becomes more than twice as much as when data is retained by using each single memory cell MC.

During the partial mode, the refresh timer 16B outputs the refresh request signal TREF with the oscillation cycle 2T of the oscillating circuit 40a (FIG. 18(d)). In response to the refresh request signal TREF, the two word lines WL in each partial area PA are selected at the same time. A refresh operation is performed simultaneously on two memory cells MC with respect to each bit line BL (partial refresh operation). The simultaneous selection of two memory cells MC makes the signal quantities to be transmitted to the bit lines BL twice as much as in normal operations. Consequently, during the partial mode, the data retained in the memory cells MC will not disappear even if the refresh interval is rendered twice as much as in normal operations. Subsequently, partial refresh operations are performed successively in response to the refresh request signals TREF (FIG. 18(e)).

In the case of shifting from the partial mode to the normal operation mode, the chip enable signal CE of high level is supplied to change the partial signal PAZ to low level (FIG. 18(f)). The refresh register 38 shown in FIG. 12 changes the refresh control signal REF2Z to high level in synchronization with the partial signal PAZ's changing to low level, until the refresh request signal TREF is output a predetermined number of times (FIG. 18(g)). In synchronization with the refresh request signal TREF, the word decoder WDEC selects the word lines WL in two at the same timing. Then, refresh operations are performed on the memory cells MC in all the partial areas PA (concentrated refresh operation).

The refresh control signal REF2Z changes to low level, at a point in time at which the operation mode of the pseudo SRAM shifts from the partial mode to the normal operation mode (FIG. 18(h)). The refresh timer 16B outputs the refresh request signal TREF with the oscillation cycle T of the oscillating circuit 40b (FIG. 18(i)). In accordance with the refresh request signal TREF, the word lines WL are selected one by one so that refresh operations are performed during intervals between read and write operations (FIG. 18(j)).

As above, this embodiment can offer the same effects as those of the first embodiment described above. Besides, in this embodiment, data retained in a single memory cell MC is retained by using a plurality of memory cells MC during the partial mode. This allows an increase in the retention time for which data can be retained. Consequently, in the partial mode, the refresh interval can be made longer than in the normal operation mode. The lower frequency of refresh operations can reduce the power consumption during the partial mode.

In the first refresh operation under the partial mode (in common refresh), it is possible to prevent the data in the second memory cells MC from being read first to destroy the data retained in the first memory cells MC. That is, the pseudo SRAM can be prevented from malfunctioning.

In second and subsequent refresh operations on each partial area PA in the partial mode, the first and second word lines WLA and WLB are selected simultaneously. The word line control circuit 34B can thus be configured simply.

In second and subsequent refresh operations in the partial mode, the refresh timer 16B outputs the refresh request signal TREF at intervals longer than in the normal operation mode. This can lower the refresh frequency during the partial mode, with a reduction in power consumption.

Figure 19:
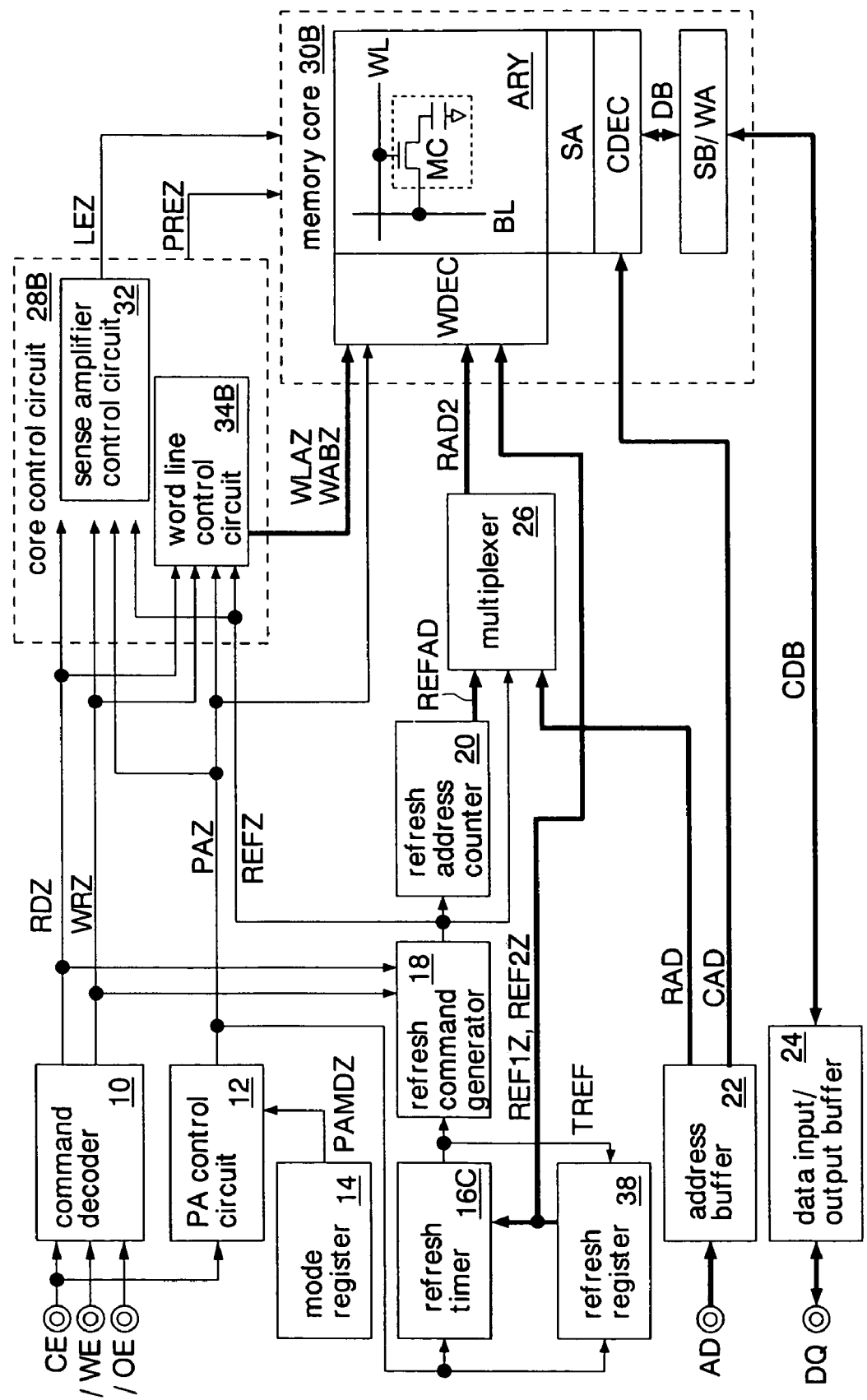
FIG. 19 is a block diagram showing a fourth embodiment of the semiconductor memory of the present invention.

FIG. 19 shows a fourth embodiment of the semiconductor memory of the present invention. The same elements as those described in the first and third embodiments will be designated by identical reference numbers or symbols. Detailed description thereof will be omitted here.

In this embodiment, a refresh timer 16C is formed instead of the refresh timer 16B of the third embodiment. The rest of the configuration is almost the same as in the third embodiment. That is, the semiconductor memory of the present embodiment is formed as a pseudo SRAM with DRAM memory cells and an SRAM interface, by using CMOS technology.

Figure 20:
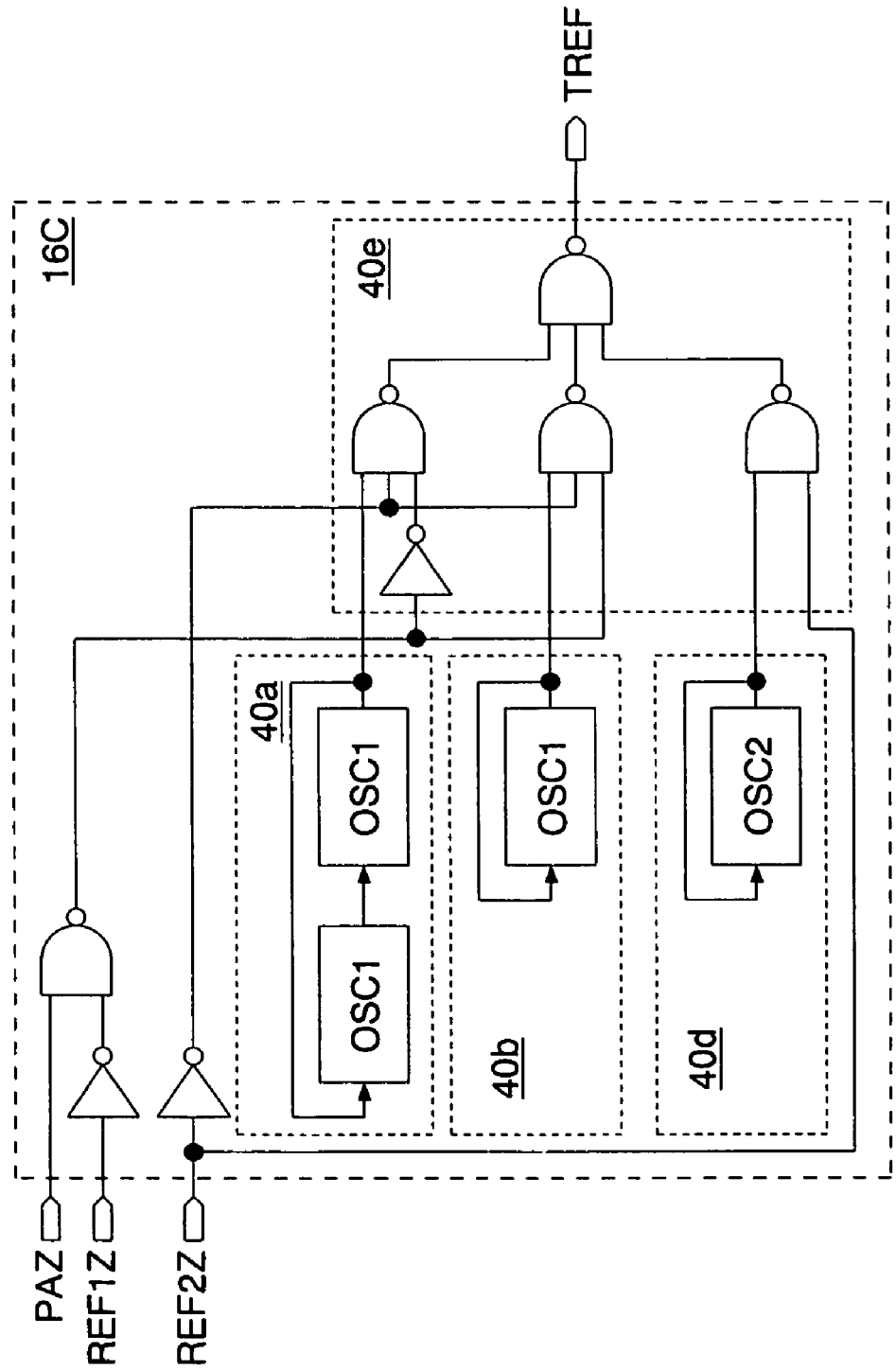
FIG. 20 is a circuit diagram showing the details of the refresh timer shown in FIG. 19.

FIG. 20 shows the details of the refresh timer 16C shown in FIG. 19.

The refresh timer 16C has oscillating circuits 40a, 40b, and 40d, and a selector 40e. The oscillating circuits 40a and 40b are the same as in the third embodiment (FIG. 10). The oscillating circuit 40d has an oscillator OSC2 which is shorter than the oscillator OSC1 in oscillation cycle. The oscillation cycle of the oscillator OSC2 is set at approximately the same as the cycle time tRC in read operations.

The selector 40e outputs the output of the oscillating circuit 40d as the refresh request signal TREF in returning from the partial mode to the normal operation mode (the REF2Z signal="H").

Figure 21:
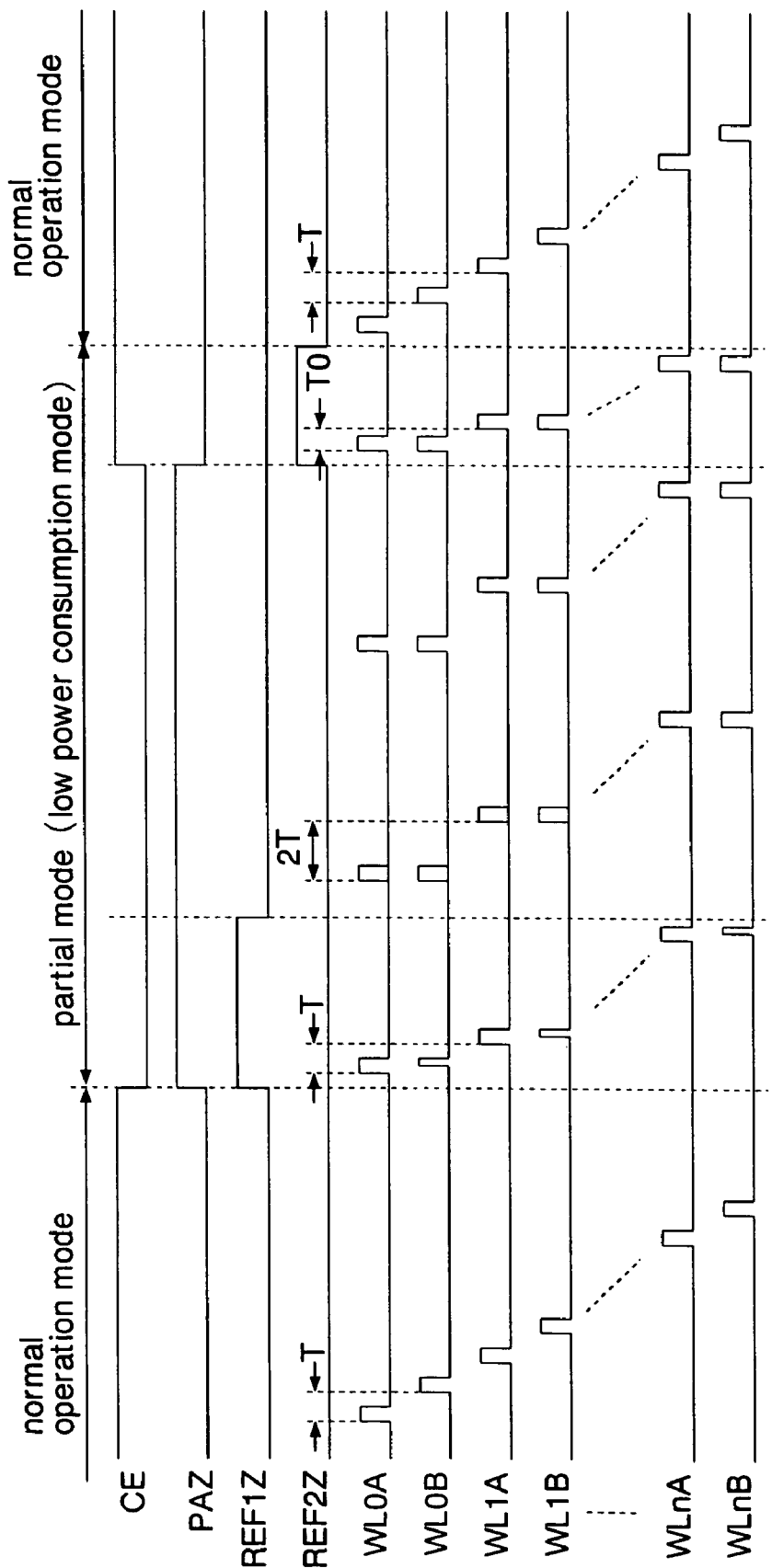
FIG. 21 is a timing chart showing the operation of the pseudo SRAM according to the fourth embodiment.

FIG. 21 shows the operation of the pseudo SRAM of the fourth embodiment.

As compared to the third embodiment, this embodiment is significantly reduced in the period of concentrated refresh operations in returning from the partial mode to the normal operation mode. The rest of the timing is the same as in the third embodiment. During the concentrated refresh operations, each single refresh operation is performed in the cycle time tRC (several tens of ns). On the contrary, normal refresh intervals are several tens of μs. The period of the concentrated refresh operations in this embodiment can thus be reduced significantly as compared to the period of the concentrated refresh operations in the third embodiment.

As above, this embodiment can offer the same effects as those obtained from the first and third embodiments described above. Moreover, in this embodiment, the refresh timer 16C outputs the refresh request signal TREF at shorter intervals on shifting from the partial mode to the normal operation mode than in the normal operation mode. This allows quick return from the partial mode to the normal operation mode, with an improvement in the operation efficiency of the system implementing the pseudo SRAM.

Figure 22:
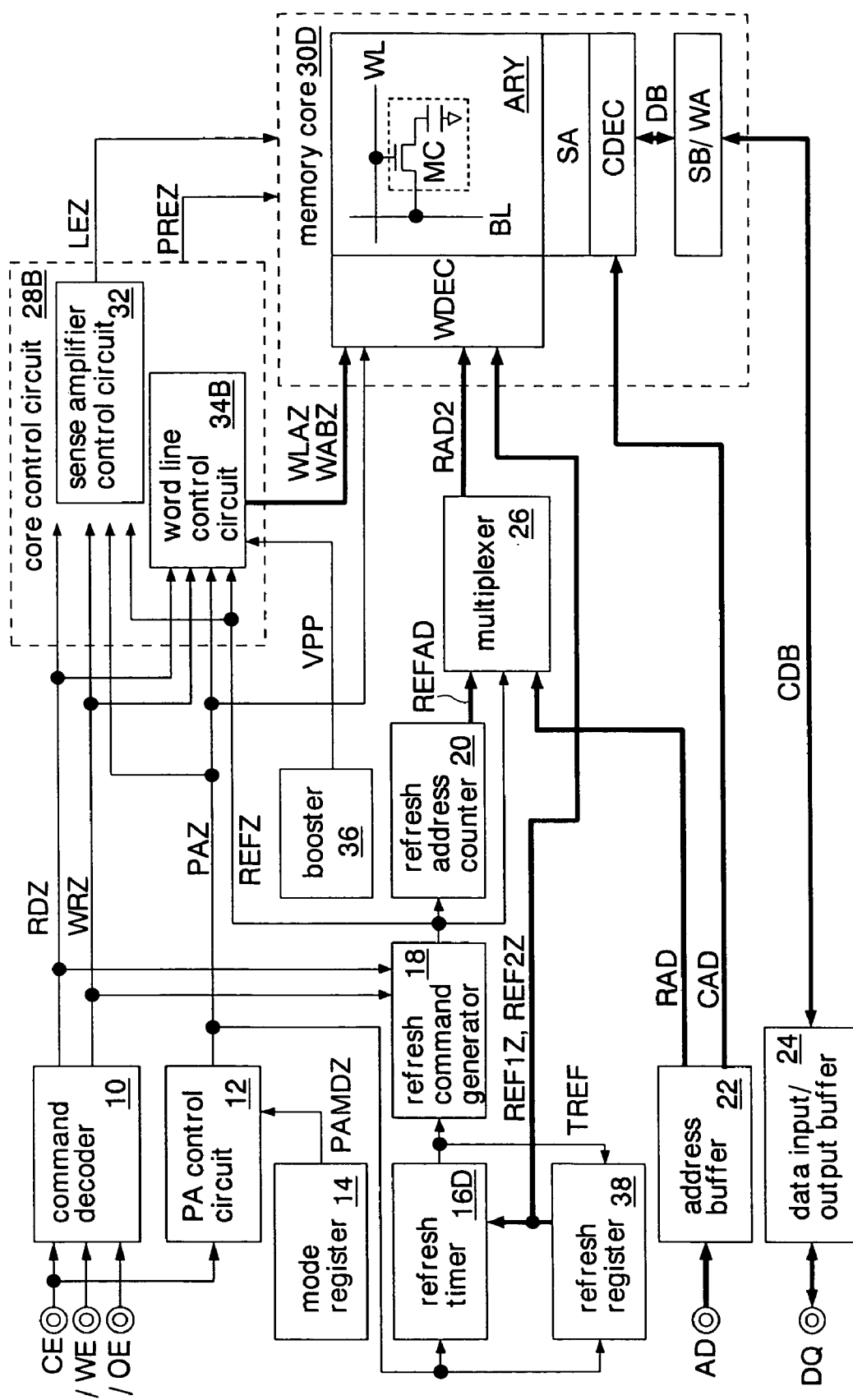
FIG. 22 is a block diagram showing a fifth embodiment of the semiconductor memory of the present invention.

FIG. 22 shows a fifth embodiment of the semiconductor memory of the present invention. The same elements as those described in the first and third embodiments will be designated by identical reference numbers or symbols. Detailed description thereof will be omitted here.

In this embodiment, a refresh timer 16D and a memory core 30D are formed instead of the refresh timer 16B and the memory core 30B of the third embodiment. There is also provided the booster 36 of the second embodiment. The rest of the configuration is almost the same as in the third embodiment.

Figure 23:
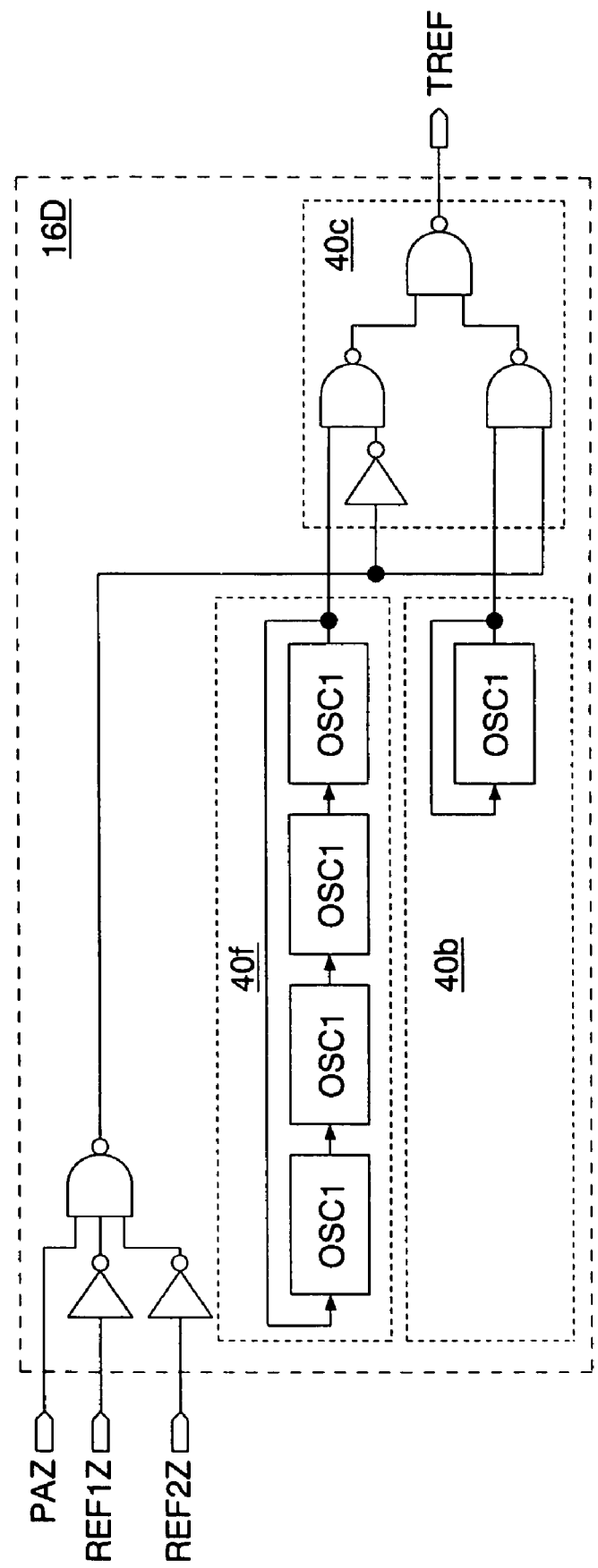
FIG. 23 is a circuit diagram showing the details of the refresh timer shown in FIG. 22.

FIG. 23 shows the details of the refresh timer 16D shown in FIG. 22.

The refresh timer 16D has an oscillating circuit 40f instead of the oscillating circuit 40a in the refresh timer 16B (FIG. 10) of the third embodiment. The rest of the configuration is the same as that of the refresh timer 16B. The oscillating circuit 40f consists of four oscillators OSC1 connected in series, and outputs a signal having a cycle four times longer than that of the oscillators OSC1.

The refresh timer 16D outputs the refresh request signal TREF having the cycle of the oscillating circuit 40b in normal operation mode, at the start of partial mode (in common refresh), and at the end of the partial mode (in concentrated refresh). During the partial mode (during partial refresh), the refresh timer 16D outputs the refresh request signal TREF having the cycle of the oscillating circuit 40f. Thus, the refresh interval during the partial mode is four times longer than the refresh interval in normal operations. This is twice as much as in the third embodiment.

Figure 24:
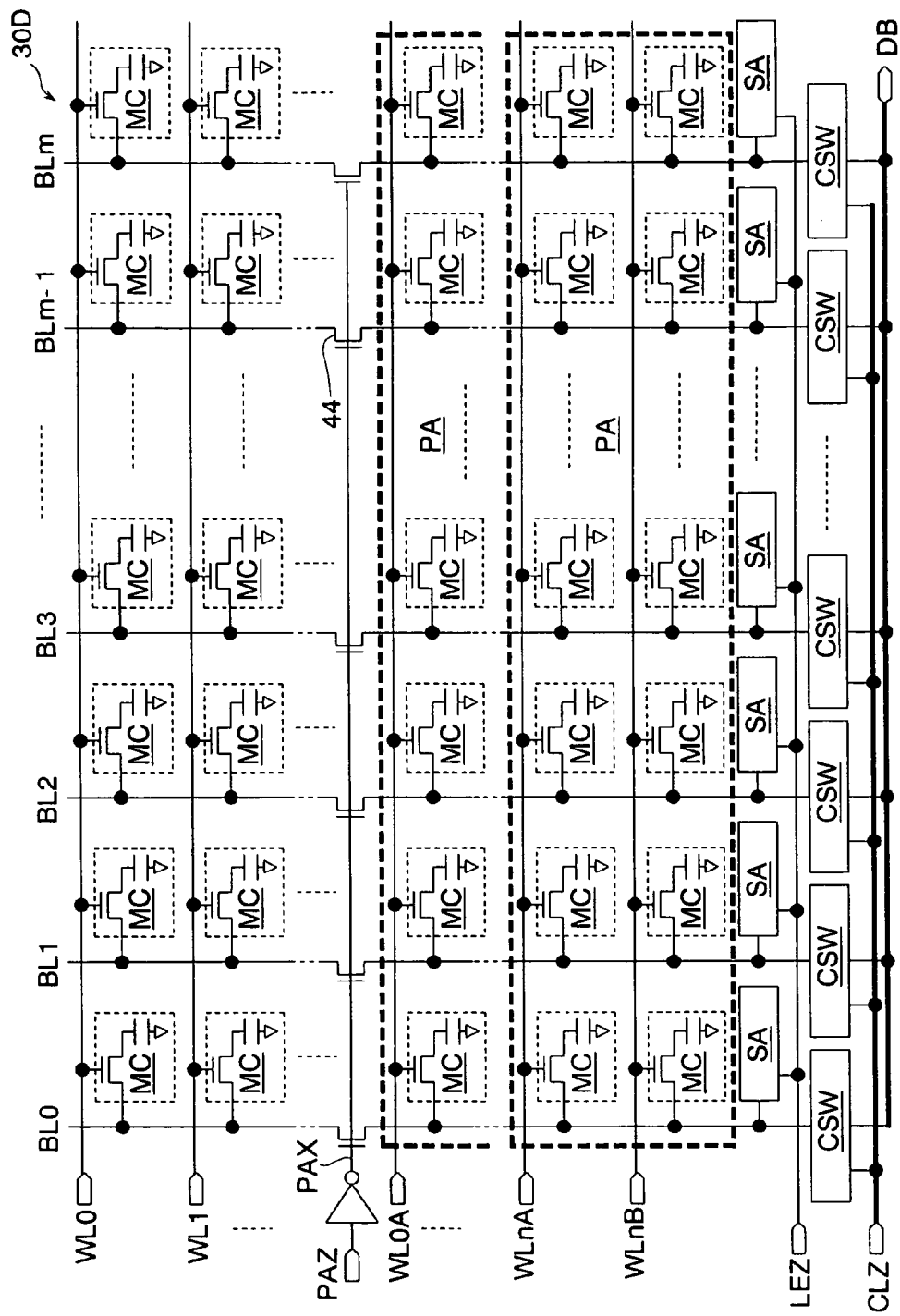
FIG. 24 is a block diagram showing the details of essential parts of the memory core shown in FIG. 22.

FIG. 24 shows the details of essential parts of the memory core 30D shown in FIG. 22.

The memory core 30D has a switch circuit 44 consisting of nMOS transistors. The switch circuit 44 is positioned to divide the bit lines BL (BL0, BL1, BL2, . . . , BLm) into two equal parts each. That is, each bit line BL is divided into first and second bit lines across the switch circuit 44. Then, the memory cells MC connected to the bit lines BL on the side of the switch circuit 44 closer to the sense amplifiers SA (first bit lines) form a plurality of partial areas PA.

The switch circuit 44 is connected to the partial signal PAZ through an inverter that has the function of converting the voltage level. The inverter changes a partial signal PAX to the boost voltage when the partial signal PAZ is at low level, and changes the partial signal PAX to a ground voltage when the partial signal PAZ is at high level. Thus, the switch circuit 44 turns on in response to the partial signal PAZ of low level, and turns off in response to the partial signal PAZ of high level. The inverter for generating the partial signal PAX and the PA control circuit 12 shown in FIG. 22 operate the switch circuit 44 as a switch control circuit that turns on in the normal operation mode and turns off in the partial mode.

As in the third embodiment (FIG. 16), the partial areas PA are established for two word lines each (for example, WL0A and WL0B). The operation of each partial area PA is almost the same as in the third embodiment. That is, in the partial mode, the memory cells MC connected to the word lines WL ending in "A" retain data. The word decoder WDEC, in the partial mode, fixes the top single bit of address to high level. Consequently, only a half of the word lines WL lying closer to the sense amplifiers SA are selected successively in response to the refresh request signal TREF.

Since a half of the memory cells MC formed in the memory core 30D are assigned for the partial areas PA, the data capacity available for retention in the partial mode is a fourth of the memory capacity of the memory core 30D.

In this embodiment, the bit lines BL connected with the memory cells MC in the partial areas PA have a length half as much as in the third embodiment. Thus, the bit line capacitances also become a half. The data retained by the memory cells MC is read out by sharing the charges stored in the memory cells MC between the memory cell capacitances and the bit line capacitances, and amplifying the charges on the bit lines. Consequently, reducing the bit line capacitances by half can double the charges on the bit lines during read relatively. As a result, the refresh interval (the cycle of occurrence of the refresh request signal TREF) during the partial mode can be rendered twice as much as in the third embodiment. Hence, the oscillation cycle of the oscillating circuit 40f may be four times longer than that of the oscillators OSC1.

This embodiment can offer the same effects as those obtained from the first and third embodiments described above. Moreover, in this embodiment, the refresh interval during the partial mode can be rendered twice as much as in the third embodiment. This allows a further reduction in the power consumption during the partial mode.

Figure 25:
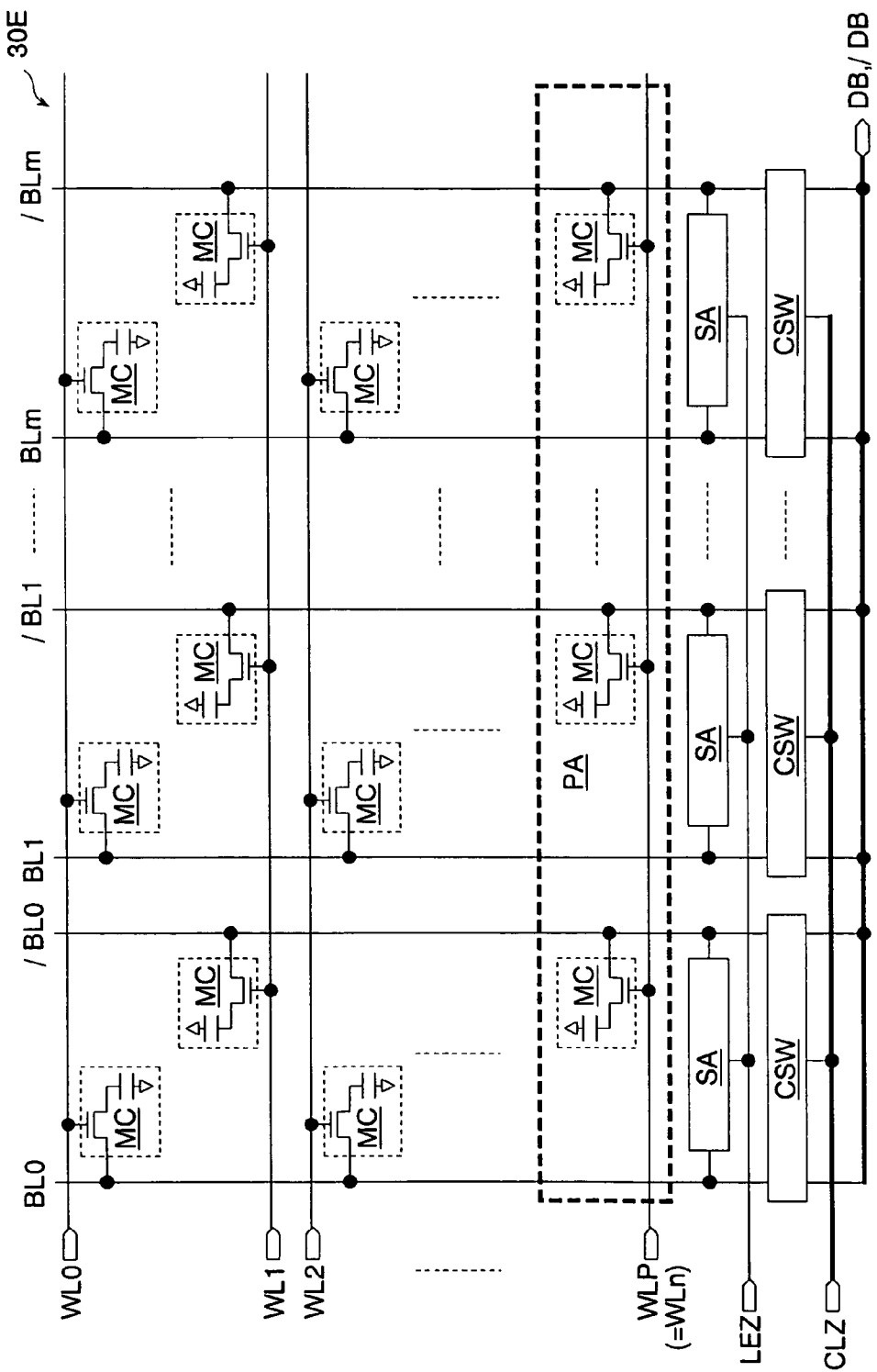
FIG. 25 is a block diagram showing the details of essential parts of the memory core according to a sixth embodiment of the semiconductor memory of the present invention.

FIG. 25 shows the memory core according to a sixth embodiment of the semiconductor memory of the present invention. The same elements as those described in the first embodiment will be designated by identical reference numbers or symbols. Detailed description thereof will be omitted here.

In this embodiment, the memory core 30E has a bit line pair structure in which the memory cells MC are connected to complementary bit lines BL and /BL alternately. For example, to read data from the memory cells MC connected to the bit lines BL, the bit lines /BL are supplied with a reference voltage. The sense amplifiers SA are connected to the bit lines BL and /BL, and amplify the voltage differences between the bit lines BL and /BL differentially. The partial area PA is composed of the memory cells MC that are connected to a word line WLP which is the closest to the sense amplifiers SA.

Figure 26:
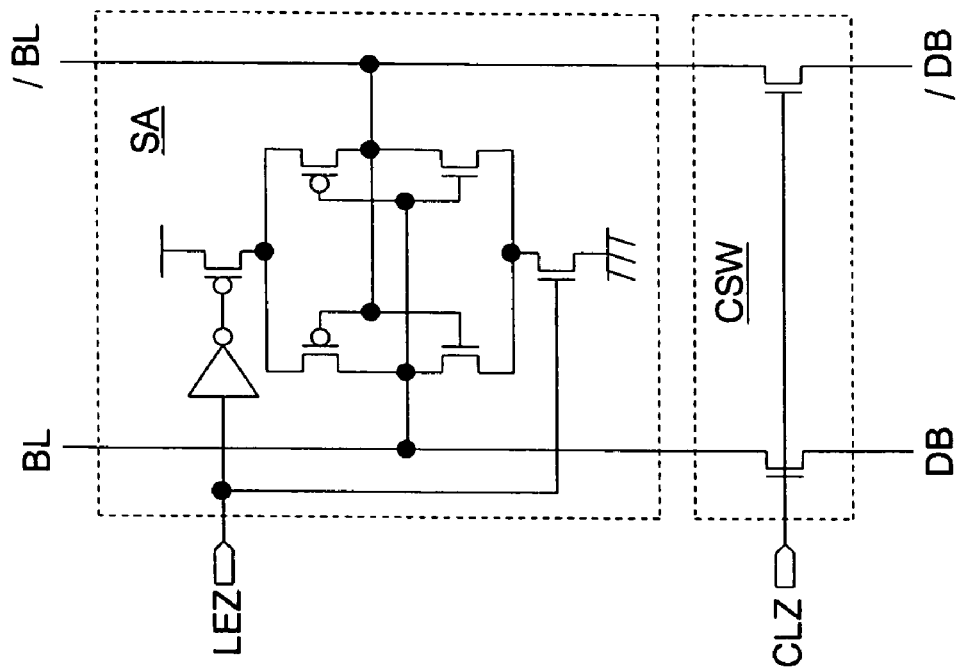
FIG. 26 is a circuit diagram showing the details of the sense amplifiers and column switches shown in FIG. 25.

FIG. 26 shows the details of the sense amplifiers SA and the column switches CSW shown in FIG. 25.

A sense amplifier SA includes two CMOS inverters connected to each other at their inputs and outputs, a pMOS transistor (pMOS switch) for connecting the sources of the pMOS transistors of the CMOS inverters to a power supply line, and an nMOS transistor (nMOS switch) for connecting the sources of the nMOS transistors of the CMOS inverters to a ground line. The inputs (or outputs) of the CMOS inverters are connected to the bit lines BL and /BL, respectively. The pMOS switch and the nMOS switch turn on when the sense amplifier activating signal LEZ is at high level, thereby activating the CMOS inverters. The activation of the CMOS inverters amplifies a voltage difference between the bit lines BL and /BL differentially.

A column switch CSW has nMOS transistors for connecting the bit lines BL, /BL and the data bus DB, /DB, respectively. The nMOS transistors turn on when the column line signal CLZ is at high level.

Figure 27:
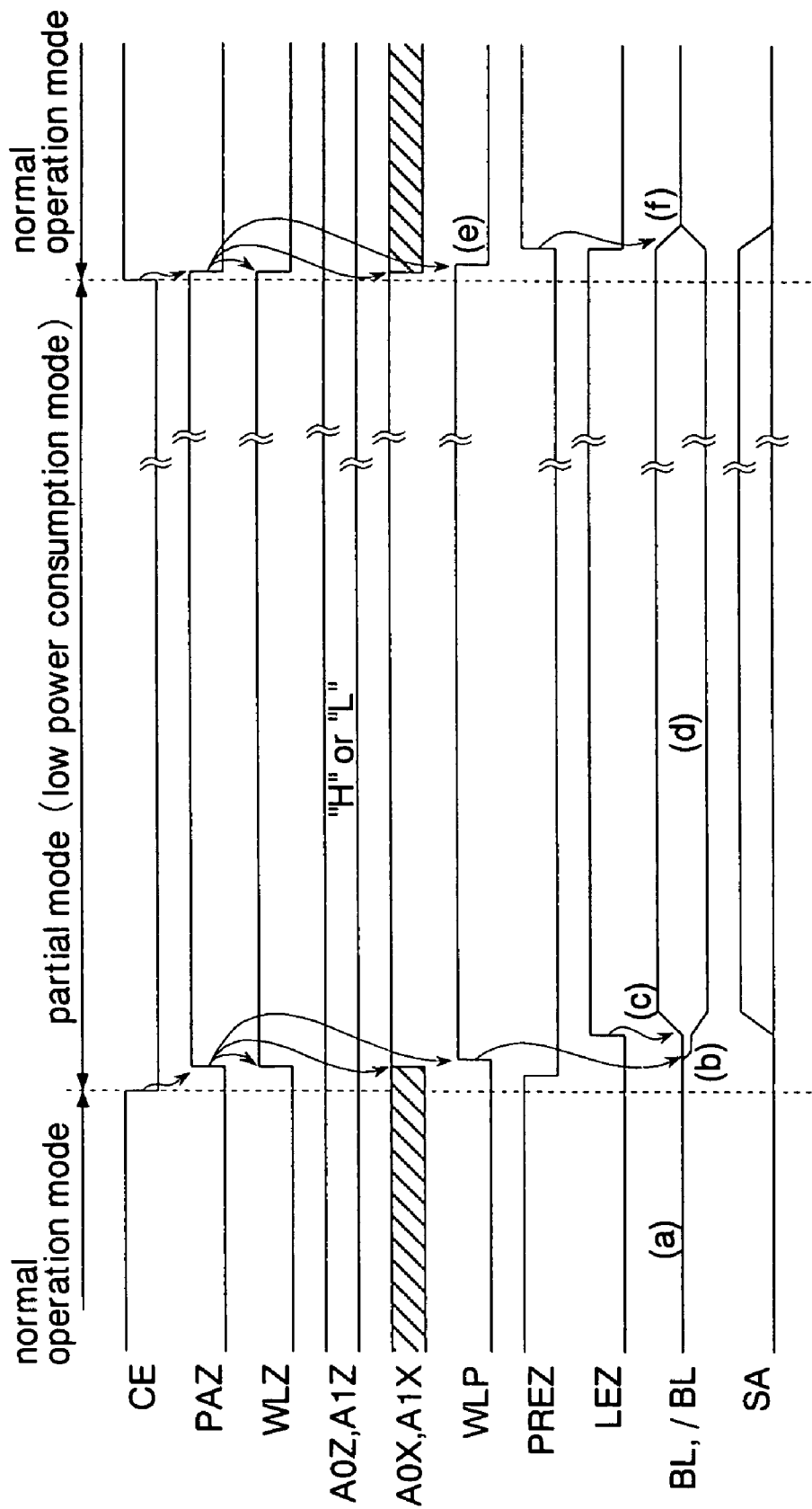
FIG. 27 is a timing chart showing the operation of the pseudo SRAM according to the sixth embodiment.

FIG. 27 shows the operation of the pseudo SRAM of the sixth embodiment. Description will be omitted of the same operation as in the first embodiment.

At an initial state, the bit lines BL and /BL are precharged to the reference voltage (FIG. 27(a)). On shifting from the normal operation mode to the partial mode, the data retained by the memory cells MC is read to the bit lines /BL in synchronization with the selection of the word line WLP (FIG. 27(b)). Subsequently, the sense amplifier activating signal LEZ changes to high level so that voltage differences between the bit lines BL and /BL are amplified (FIG. 27(c)). Then, the sense amplifiers SA latch the data retained by the memory cells MC in the partial area PA. During the partial mode, the data that the sense amplifiers SA read from the memory cells MC in the partial area PA is kept latched for data retention (FIG. 27(d)).

At the time of returning from the partial mode to the normal operation mode, the word line WLP is deselected and the data is retained by the memory cells MC in the partial area PA (FIG. 27(e)). Next, the sense amplifier activating signal LEZ changes to low level so that the sense amplifiers SA are inactivated. The precharging signal PREZ changes to high level, and the bit lines BL and /BL are precharged to the reference voltage (FIG. 27(f)).

This embodiment can offer the same effects as those of the first embodiment described above. Besides, in this embodiment, the pseudo SRAM having a memory core of bit line pair structure can be reduced significantly in the power consumption during the partial mode as compared to heretofore.

Figure 28:
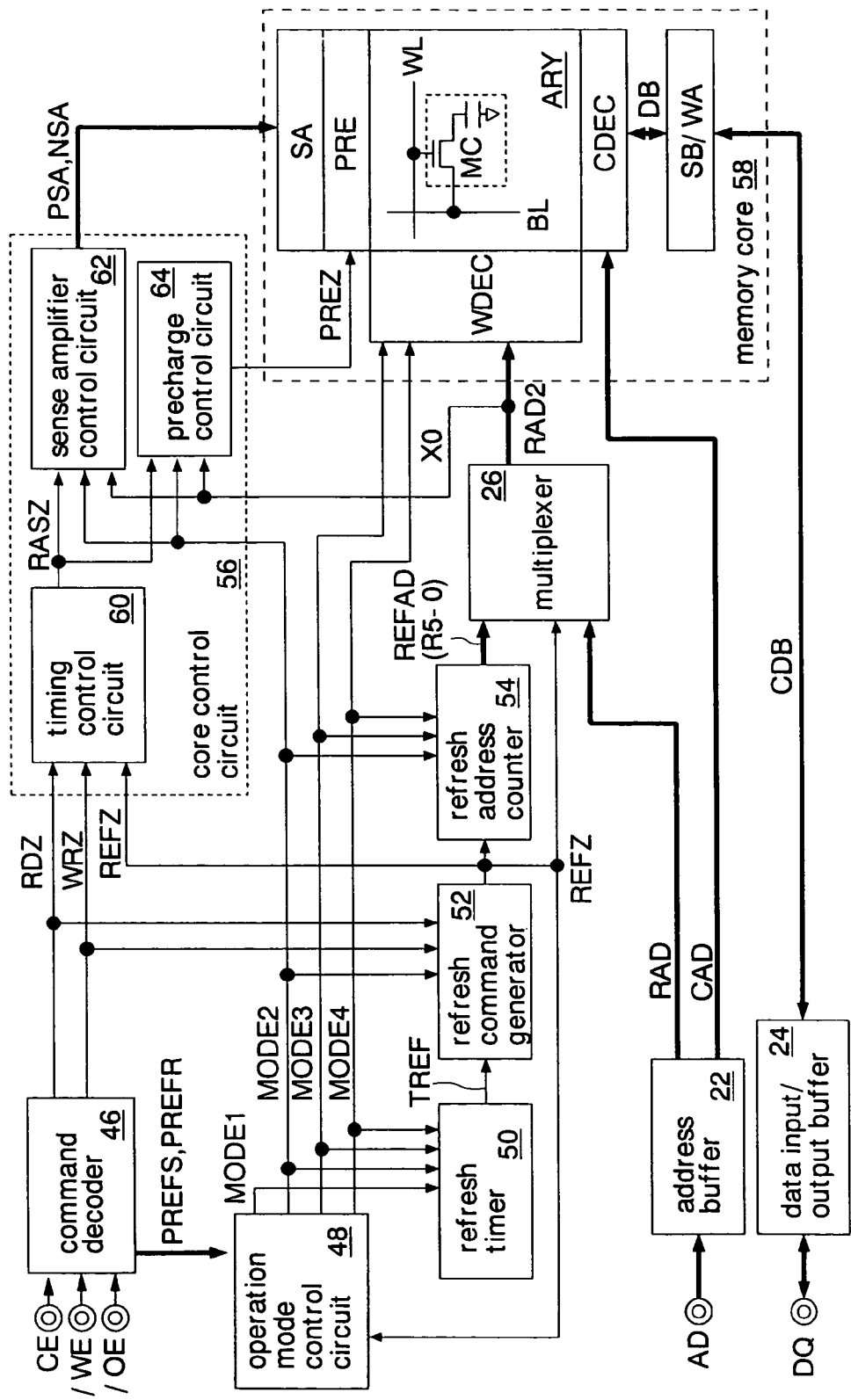
FIG. 28 is a block diagram showing a seventh embodiment of the semiconductor memory of the present invention.

FIG. 28 shows a seventh embodiment of the semiconductor memory of the present invention. The same elements as those described in the first embodiment will be designated by identical reference numbers or symbols. Detailed description thereof will be omitted here.

This semiconductor memory is formed as a pseudo SRAM with DRAM memory cells and an SRAM interface, by using CMOS technology.

The pseudo SRAM includes a command decoder 46, an operation mode control circuit 48, a refresh timer 50, a refresh command generator 52, a refresh address counter 54, an address buffer 22, a data input/output buffer 24, a multiplexer 26, a core control circuit 56, and a memory core 58. The refresh timer 50, the refresh command generator 52, and the refresh address counter 54 operate as a refresh control circuit for refreshing memory cells. In addition, the operation mode control circuit 48, the refresh timer 50, the refresh address counter 54, and the core control circuit 56 operate as an operation control circuit for generating the selecting timing of word lines WL. Furthermore, the core control circuit 56 operates as an operation control circuit for performing read operations, write operations, and refresh operations.

The command decoder 46 receives command signals (a chip enable signal CE, a write enable signal /WE, and an output enable signal /OE) through external terminals, decodes the received commands, and outputs a read control signal RDZ or a write control signal WRZ. The command decoder 46 also outputs a partial mode starting signal PREFS (pulse signal) in synchronization with the falling edge of the CE signal, and outputs a partial mode releasing signal PREFR (pulse signal) in synchronization with the rising edge of the CE signal.

The operation mode control circuit 48 outputs mode signals MODE1, MODE2, MODE3, and MODE4 in accordance with the partial mode starting signal PREFS, the partial mode releasing signal PREFR, and the refresh control signal REFZ. The refresh timer 50 outputs the refresh request signal TREF having oscillation cycles corresponding to the mode signals MODE1-4. The refresh address counter 54 updates the refresh address signal REFAD (R5-0) in synchronization with the refresh control signal REFZ. The update specification of the refresh address signal REFAD is modified in accordance with the mode signals MODE2-4.

The number of bits of the refresh address signal REFAD corresponds to the number of word lines WL (64, in this example) formed in the memory core 58. Hence, the number of bits of the refresh address signal REFAD is not limited to 6 bits but set in accordance with the number of word lines WL formed in the memory core 58.

The core control circuit 56 includes a timing control circuit 60, a sense amplifier control circuit 62, and a precharge control circuit 64. The timing control circuit 60 outputs a row activating signal RASZ when it receives any of the RDZ signal, the WRZ signal, and the REFZ signal. The sense amplifier control circuit 62 outputs the sense amplifier activating signals PSA and NSA for activating sense amplifiers SA in synchronization with the RASZ signal. The precharge control circuit 64 outputs the precharging signal PREZ in synchronization with the RASZ signal. The operation timing of the sense amplifier control circuit 62 and the precharge control circuit 64 is changed in accordance with the mode signal MODE2 and the least significant bit X0 of the refresh address signal REFAD.

The memory core 58 includes the sense amplifiers SA, a precharge circuit PRE, a memory cell array ARY, a word decoder WDEC, a column decoder CDEC, a sense buffer SB, and a write amplifier WA. The sense amplifiers SA operate in accordance with the sense amplifier activating signals PSA and NSA. The precharge circuit PRE operates in accordance with the precharging signal PREZ. The memory cell array ARY has a plurality of volatile memory cells MC (dynamic memory cells), along with a plurality of word lines WL and a plurality of bit lines BL connected to the memory cells MC. The memory cells MC are the same as typical DRAM memory cells, each having a capacitor for retaining data in the form of a charge and a transfer transistor arranged between this capacitor and a bit line BL. The gates of the transfer transistors are connected to the word lines WL.

The word decoder WDEC selects one or two of the word lines WL according to the row address signal RAD2 and the mode signals MODE3-4, and boosts the selected word line(s) WL to a power supply voltage. The column decoder CDEC, the sense buffer SB, and the write amplifier WA are the same circuits as in the first embodiment.

Figure 29:
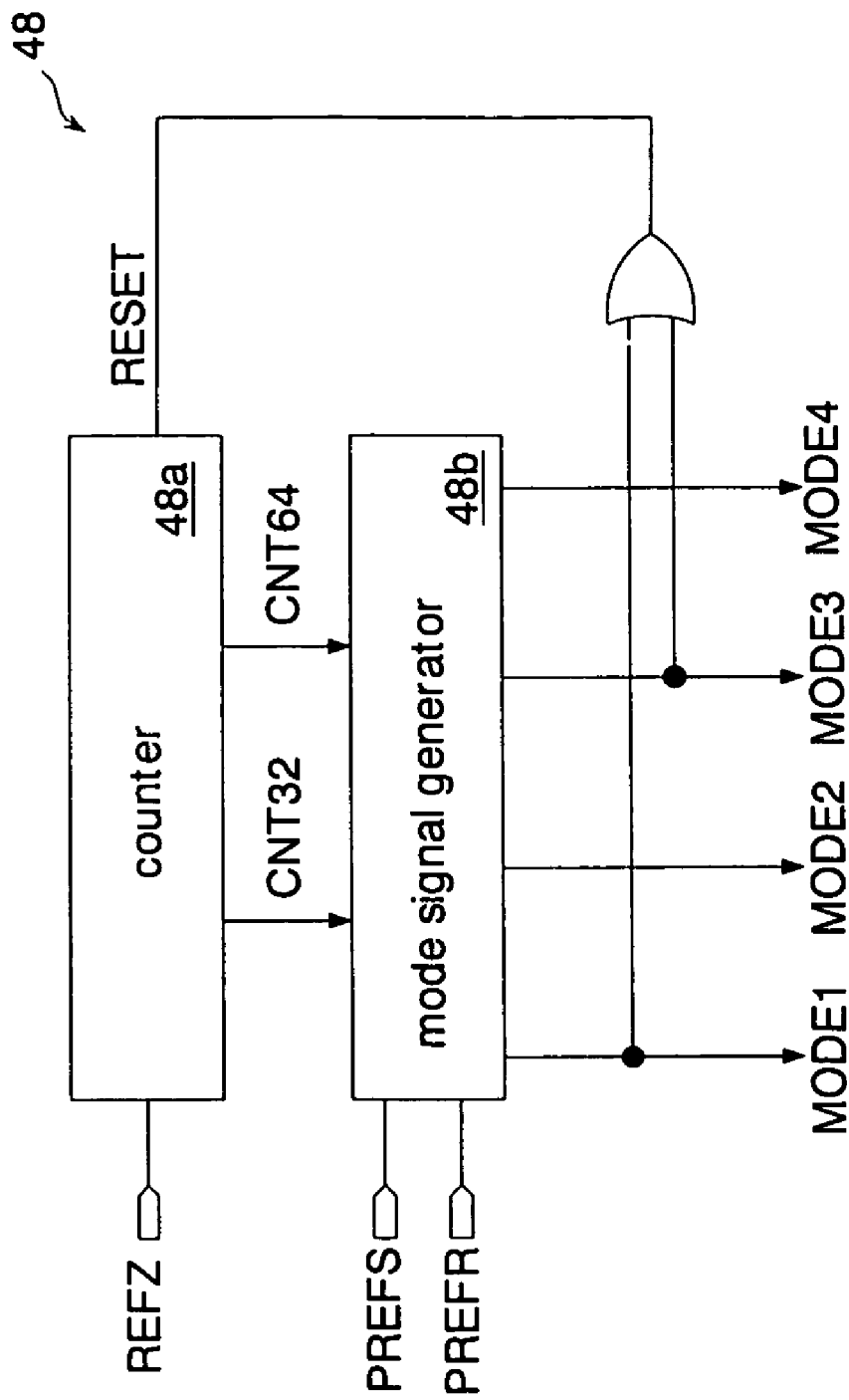
FIG. 29 is a block diagram showing the details of the operation mode control circuit shown in FIG. 28.

FIG. 29 shows the details of the operation mode control circuit 48 shown in FIG. 28.

The operation mode control circuit 48 has a counter 48a and a mode signal generator 48b. The counter 48a counts in synchronization with the rising edge of the refresh control signal REFZ. The counter 48a outputs a counter signal CNT32 at the 32nd count and a counter signal CNT64 at the 64th count. The counter 48a is reset in response to a reset signal RESET. The reset signal RESET is output when the mode signal MODE1 or the mode signal MODE3 is at high level.

Note that the count "64" corresponds to the number of word lines WL formed in the memory core 58. For plain explanation, the present embodiment is given 64 word lines WL. In fact, there are provided 2048 word lines WL, for example. In this case, the counter 48a outputs counter signals at the 1024th count and the 2048th count, respectively.

The mode signal generator 48b outputs the mode signals MODE1-4 according to the partial mode starting signal PREFS, the partial mode releasing signal PREFR, and the counter signals CNT32 and CNT64.

Figure 30:
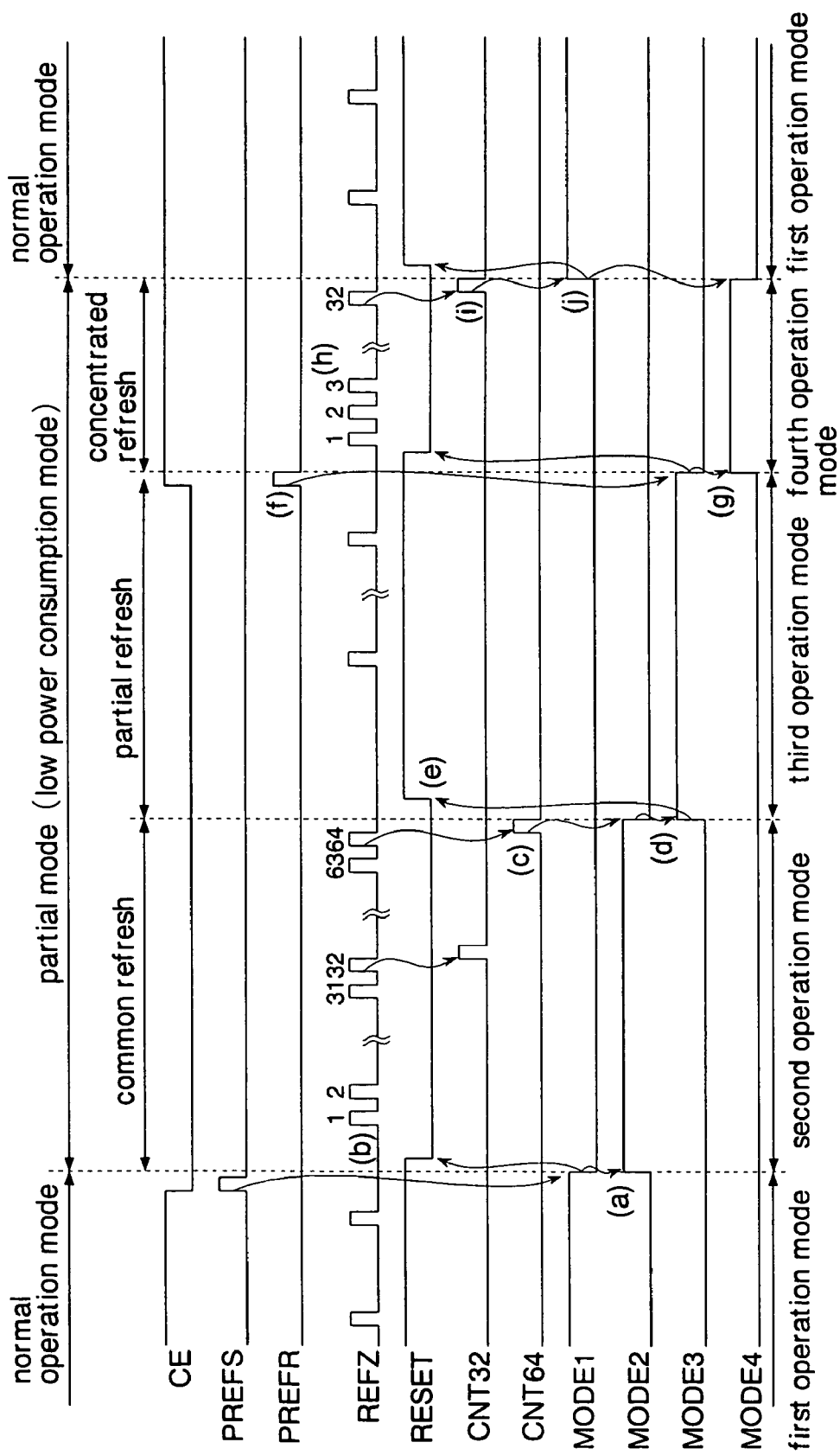
FIG. 30 is a timing chart showing the operation of the operation mode control circuit shown in FIG. 28.

FIG. 30 shows the operation of the operation mode control circuit 48 shown in FIG. 28.

As in the third embodiment described above, the pseudo SRAM of this embodiment enters the normal operation mode when the CE signal is at high level, and enters the partial mode (low power consumption mode) when the CE signal is at low level. Then, at the start of the partial mode, common refresh is performed (common refresh mode). After the common refresh, partial refresh is performed (partial refresh mode). At the end of the partial mode, concentrated refresh is performed (concentrated refresh mode). During the normal operation mode, a single memory cell is refreshed each time a sense amplifier SA operates (single cell operation). During the low power consumption mode, two memory cells are refreshed each time a sense amplifier SA operates (twin cell operation).

The pseudo SRAM recognizes the normal operation mode (first operation mode) when the mode signal MODE1 is at high level, recognizes the common refresh mode (second operation mode) when the mode signal MODE2 is at high level, recognizes the partial refresh mode (third operation mode) when the mode signal MODE3 is at high level, and recognizes the concentrated refresh mode (fourth operation mode) when the mode signal MODE4 is at high level.

When the operation mode control circuit 48 receives the partial mode setting signal PREFS during the normal operation mode, it changes the mode signals MODE1 and MODE2 to low level and high level, respectively. The operation mode thus shifts from the normal operation mode to the common refresh mode (partial mode) (FIG. 30(*a*)). The reset signal RESET is inactivated in synchronization with the mode signal MODE1's changing to low level.

In response to the low level of the reset signal RESET, the counter 48*a* is released from a reset state, and starts to count in synchronization with the refresh control signal REFZ (FIG. 30(*b*)). Refresh operations are performed in response to the refresh control signal REFZ. Since all the word lines WL in the memory core 58 must be selected in the common refresh mode, the refresh control signal REFZ is output 64 times. Incidentally, the operation of the refresh timer 50 and the refresh command generator 52 for generating the refresh control signal REFZ will be described in FIG. 32 to be seen later.

The counter 48*a* outputs the counter signal CNT64 in synchronization with the 64th count operation (FIG. 30(*c*)). In synchronization with the counter signal CNT64, the operation mode control circuit 48 changes the mode signal MODE2 to low level and changes the mode signal MODE3 to high level (FIG. 30(*d*)). Then, the operation mode shifts from the common refresh mode to the partial refresh mode. The reset signal RESET is activated in synchronization with the mode signal MODE3's changing to high level (FIG. 30(*e*)). The counter 48*a* is reset in response to the high level of the reset signal RESET. While the mode signal MODE3 is at high level, partial refresh is performed successively.

The partial mode releasing signal PREFR is output in response to the CE signal's changing to high level supplied through the external terminal (FIG. 30(*f*)). When the operation mode control circuit 48 receives the partial mode releasing signal PREFR during the partial refresh mode, it changes the mode signals MODE3 and MODE4 to low level and high level, respectively. The operation mode thus shifts to the concentrated refresh mode (FIG. 30(*g*)). The reset signal RESET is inactivated in synchronization with the mode signal MODE3's turning to low level. In response to the low level of the reset signal RESET, the counter 48*a* is released from the reset state, and starts counting again in synchronization with the refresh control signal REFZ (FIG. 30(*h*)).

In the concentrated refresh mode, two word lines WL (a partial word line and a normal word line adjacent to this partial word line) are selected at the same time. To select all the word lines WL in the memory core 58, the refresh control signal REFZ is output 32 times.

The counter 48*a* outputs the counter signal CNT32 in synchronization with the 32nd count operation (FIG. 30(*i*)). In synchronization with the counter signal CNT32, the operation mode control circuit 48 changes the mode signals MODE4 and MODE1 to low level and high level, respec- tively (FIG. 30(*j*)). Then, the operation mode shifts from the concentrated refresh mode (partial mode) to the normal operation mode.

Figure 31:
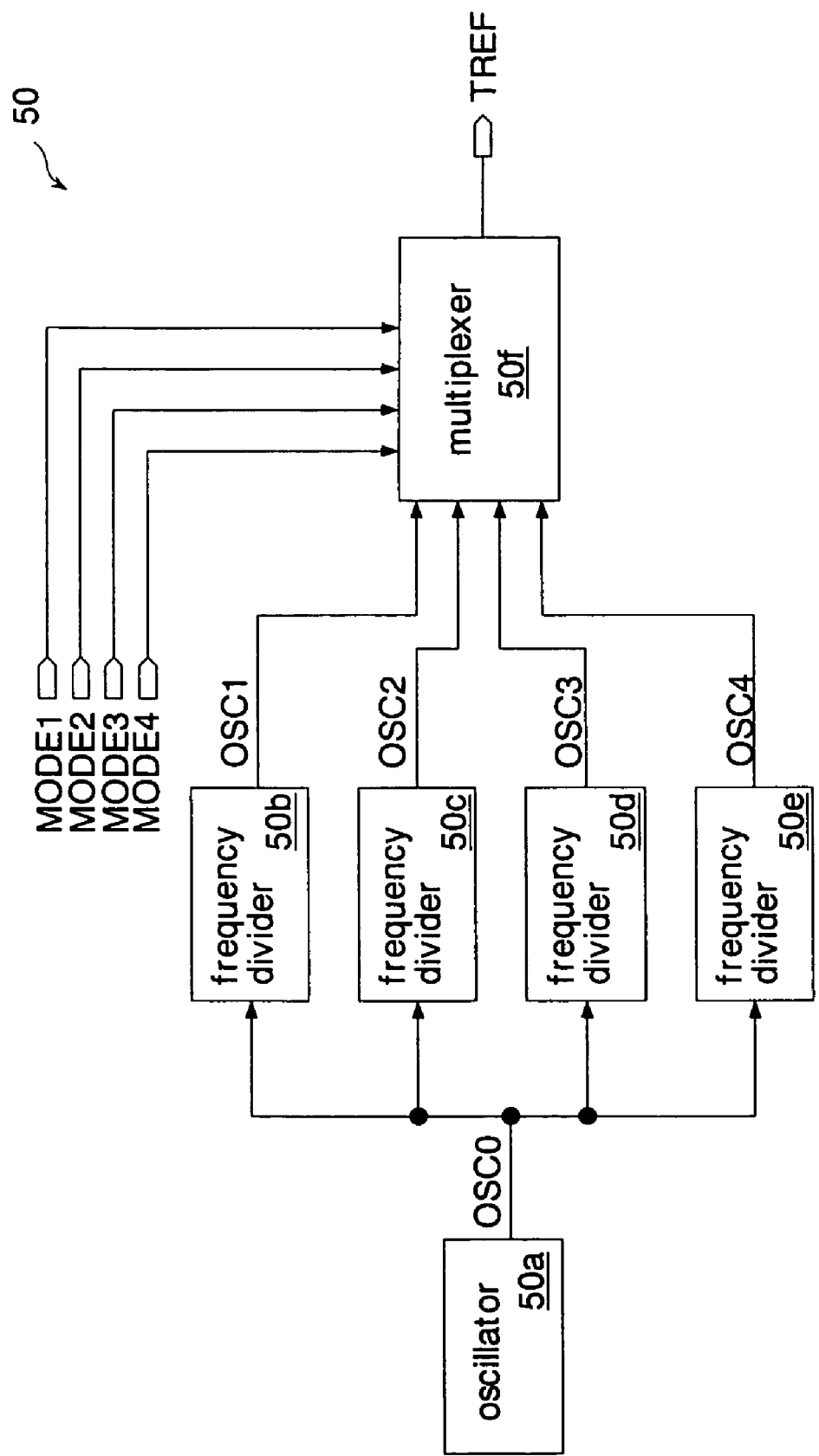
FIG. 31 is a block diagram showing the details of the refresh timer shown in FIG. 28.

FIG. 31 shows the details of the refresh timer 50 shown in FIG. 28.

The refresh timer 50 includes an oscillator 50*a* for generating an oscillation signal OSC0, frequency dividers 50*b*, 50*c*, 50*d*, and 50*e* for dividing the OSC0 signal in frequency to generate oscillation signals OSC1, OSC2, OSC3, and OSC4, respectively, and a multiplexer 50*f* for selecting the oscillation signals OSC1, OSC2, OSC3, and OSC4 according to the mode signals MODE1-4 and outputting the resultant as the refresh request signal TREF. The frequency dividers 50*b*, 50*c*, 50*d*, and 50*e* convert the OSC0 signal to /1;8, /1;16, /1;32, and ½ in frequency, respectively.

Figure 32:
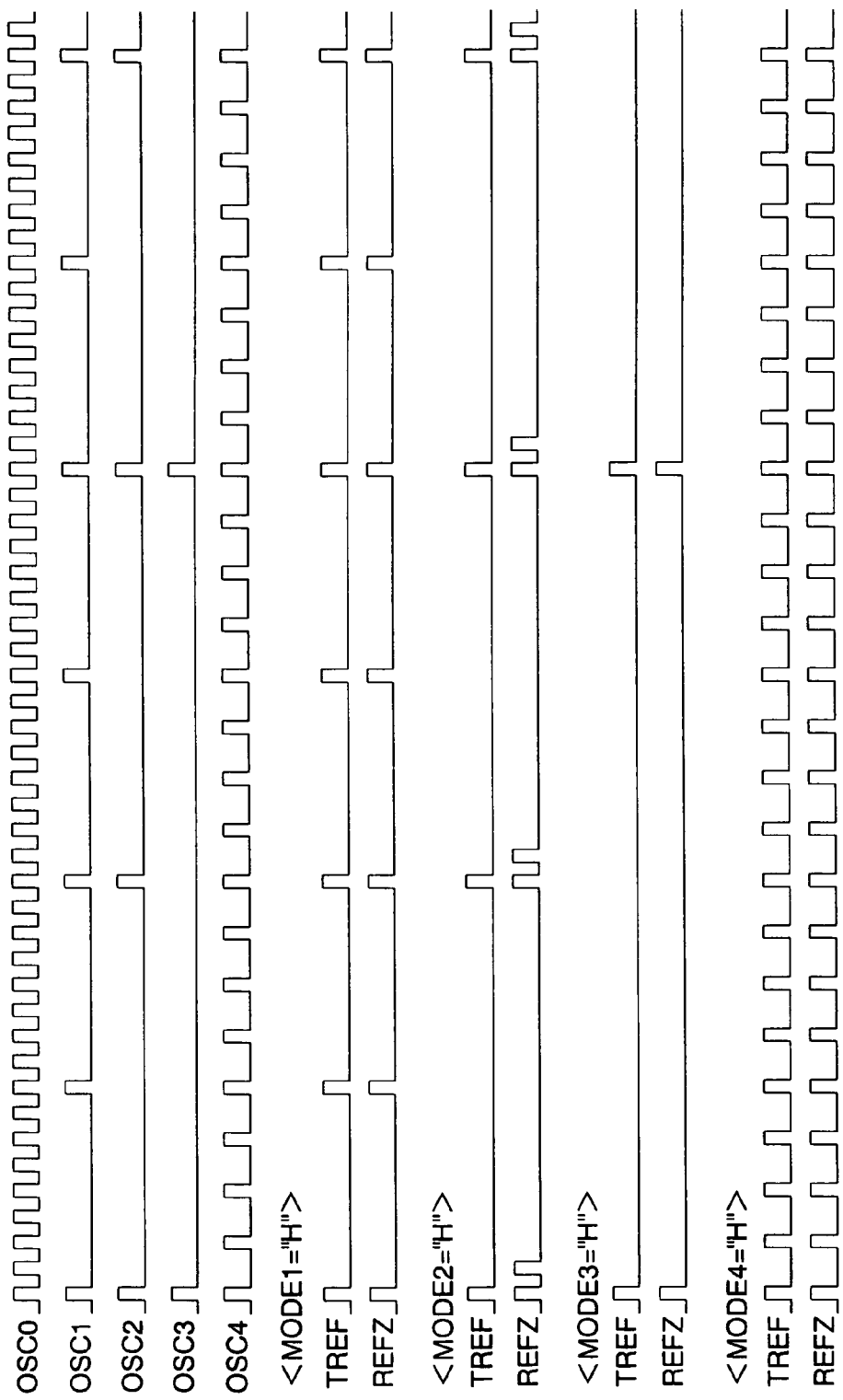
FIG. 32 is a timing chart showing the operation of the refresh timer and the refresh command generator according to the seventh embodiment.

FIG. 32 shows the operation of the refresh timer 50 and the refresh command generator 52.

The refresh timer 50 outputs the oscillation signals OSC1, OSC2, OSC3, and OSC4 as the refresh request signal TREF when the mode signals MODE1, MODE2, MODE3, and MODE4 are at high level, respectively. The refresh command generator 52 outputs the refresh request signal TREF as the refresh control signal REFZ when the mode signals MODE1, MODE3, and MODE4 are at high level, respectively. When the mode signal MODE2 is at high level, the refresh command generator 52 outputs the refresh control signal REFZ twice in synchronization with the refresh request signal TREF.

Figure 33:
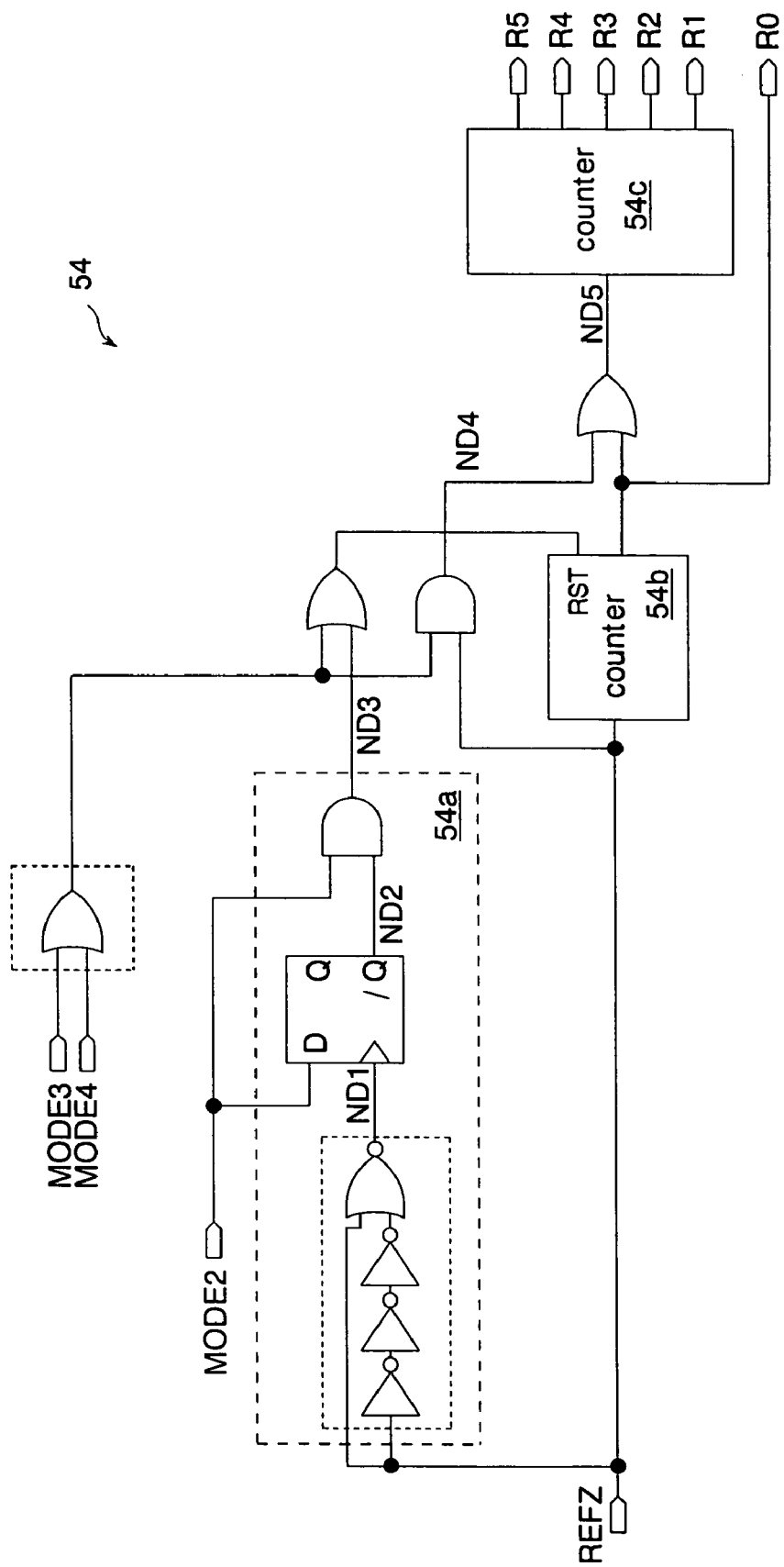
FIG. 33 is a block diagram showing the details of the refresh address counter shown in FIG. 28.

FIG. 33 shows the details of the refresh address counter 54 shown in FIG. 28.

The refresh address counter 54 has a resetting circuit 54*a*, counters 54*b* and 54*c*, and logic gates for controlling the counters 54*b* and 54*c*. The resetting circuit 54*a* includes a pulse generator for generating a positive pulse in synchronization with the falling edge of the refresh control signal REFZ, a D flip-flop for latching the mode signal MODE2 in synchronization with the output signal of the pulse generator, and a NAND gate for detecting the rising edge of the mode signal MODE2.

The counter 54*b* counts in synchronization with the refresh control signal REFZ to generate the least significant bit R0 of the refresh address signal REFAD. The counter 54*b* is reset when the mode signal MODE3 or MODE4 is at high level, or in synchronization with the rising edge of the mode signal MODE2.

The counter 54*c* counts in synchronization with the refresh control signal REFZ to update the bits R5-1 of the refresh address signal REFAD when the mode signal MODE3 or MODE4 is at high level. When the mode signal MODE1 or MODE2 is at high level (except in a predetermined period after the rising edge of the mode signal MODE2), the counter 54*c* counts in synchronization with the address signal R0 which is output from the counter 54*b*, thereby updating the bits R5-1.

Figure 34:
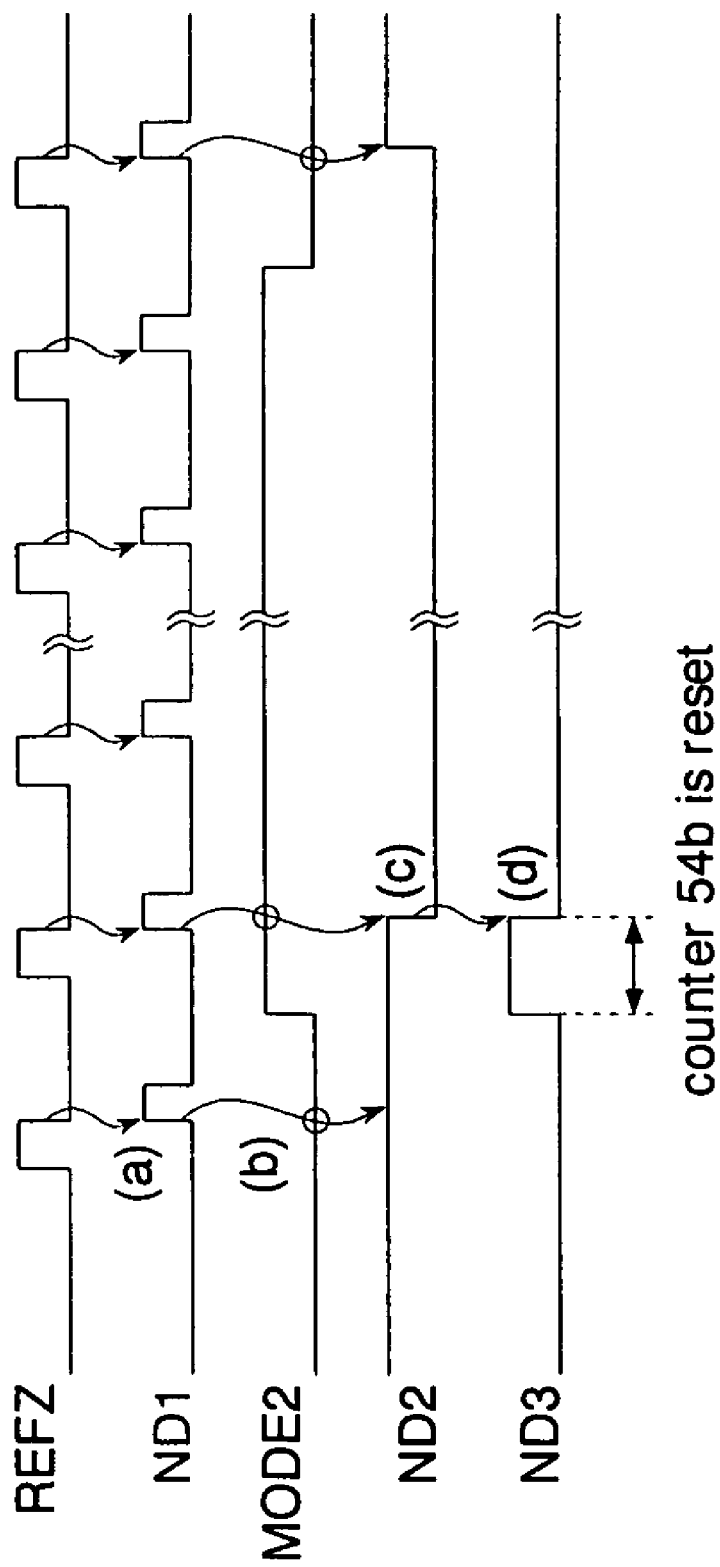
FIG. 34 is a timing chart showing the operation of the resetting circuit shown in FIG. 33.

FIG. 34 shows the operation of the resetting circuit 54*a* shown in FIG. 33.

The pulse generator outputs a pulse signal to the node ND1 in synchronization with the falling edge of the refresh control signal REFZ (FIG. 34(*a*)). The D flip-flop latches the mode signal MODE2 in synchronization with the pulse signal on the node ND1, and outputs the inverted logic of the mode signal MODE2 to the node ND2 (FIG. 34(*b*)). Consequently, the node ND2 changes to low level in synchronization with the first refresh control signal REFZ after the mode signal MODE2 changes to high level(FIG. 34(*c*)). Then, the AND logic of the logic levels of the mode signal MODE2 and the node ND2 is output to the node ND3. The counter 54b shown in FIG. 33 is reset while the node ND3 is at high level, i.e., in the first refresh operation period after the mode signal MODE2 changes to high level.

FIG. 35 shows the operation of the refresh address counter 54 shown in FIG. 33.

The refresh address counter 54 successively counts up the 6-bit refresh address signal R5-0 in synchronization with the refresh control signal REFZ when the mode signal MODE1 or MODE2 is at high level, i.e., in the normal operation mode (first operation mode) and in the common refresh mode (second operation mode). Besides, the refresh address counter 54 successively counts up the 5-bit refresh address signal R5-1 in synchronization with the refresh control signal REFZ when the mode signal MODE3 or MODE4 is at high level, i.e., in the partial mode (third operation mode) and in the concentrated refresh mode (fourth operation mode). Here, the refresh address signal R0 is fixed to low level.

Figure 36:
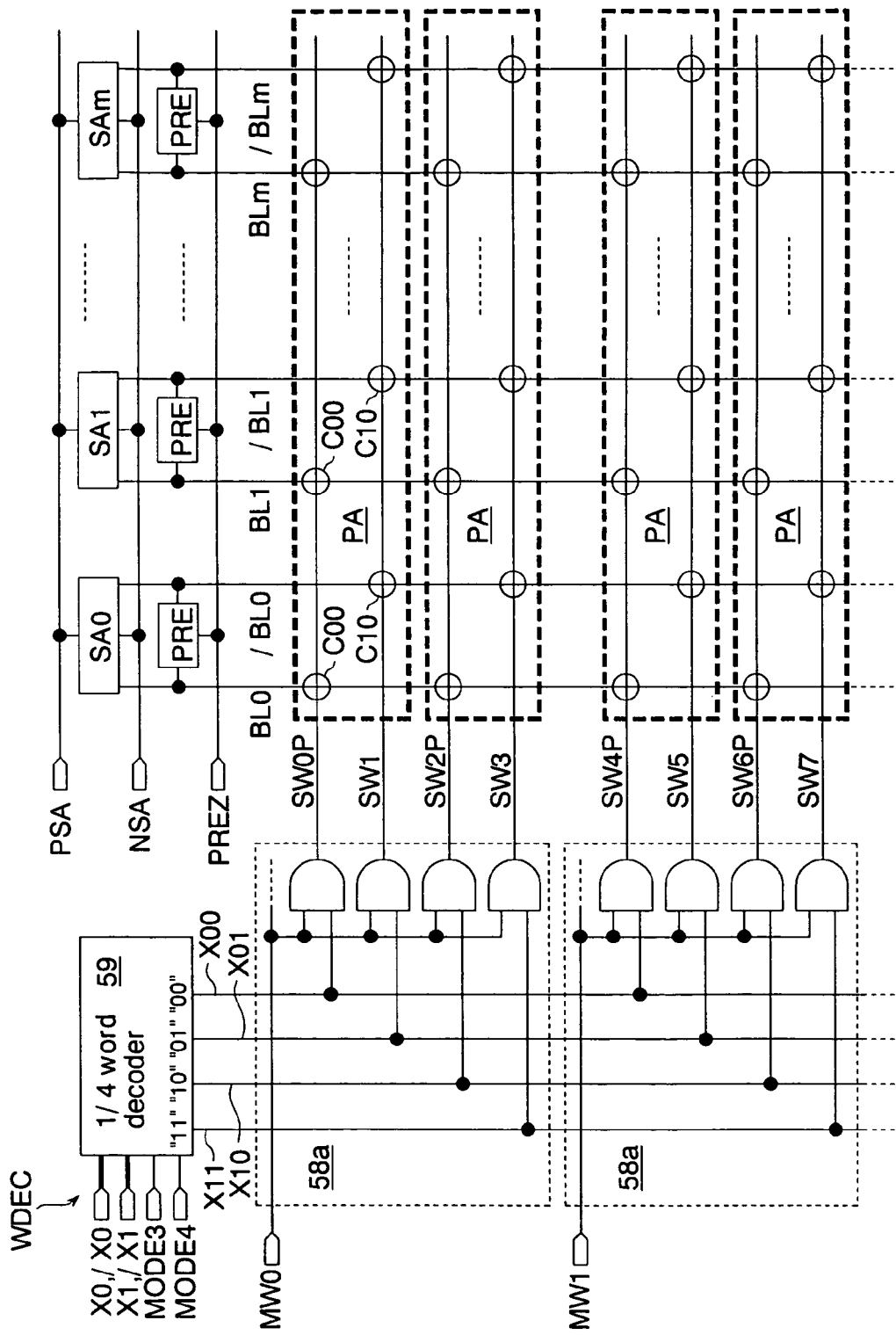
FIG. 36 is a block diagram showing the details of essential parts of the memory core shown in FIG. 28.

FIG. 36 shows the details of essential parts of the memory core 58 shown in FIG. 28.

The word decoder WDEC of the memory core 58 has a ¼ word decoder 59 and a plurality of sub word decoders 58a corresponding to main word lines MW (MW0, MW1, . . . ), respectively. The ¼ word decoder 59 outputs any of decoding signals X11, X10, X01, and X00 according to the lower two bits X1 and X0 of the row address signal RAD2 and the inverted bits /X1 and /X0 thereof when the mode signals MODE3 and MODE4 are at low level. When either of the mode signals MODE3 and MODE4 is at high level, the ¼ word decoder 59 outputs two decoding signals X11 and X10, or X01 and X00 according to the lower one bit X1 of the row address signal RAD2 and the inverted bit /X1 thereof.

The sub word decoders 58a are activated when the respective main word lines MW are at high level, selecting a sub word line SW (SW0P, SW1, SW2P, SW3, . . . ) according to the decoding signals X11, X10, X01, and X00. The main word lines MW are selected by a not-shown predecoder, in accordance with the upper bits of the row address signal RAD2. Then, the memory cells MC connected to the selected sub word line SW are accessed. As above, in this embodiment the word lines WL shown in FIG. 28 consist of the main word lines MW and the sub word lines SW.

The sub word lines SW ending in "P" represent partial word lines. During the partial mode, data written in the memory cells MC connected to the partial word lines SWP (partial memory cells C00) is retained. The sub word lines SW with no last "P" represent common word lines. Data in the memory cells MC connected to the common word lines SW (common memory cells C10) will not be retained during the partial mode.

The partial word lines SWP and the normal sub word lines SW are laid alternately. That is, the word lines SWP and SW are arranged adjacent to each other. As will be described later, during the partial mode, the word lines SWP and SW are selected in synchronization with each other so that two memory cells are accessed at a time (twin cell operation). Consequently, the adjacent, alternate arrangement of these word lines SWP and SW prevents the word decoder WDEC from having intricate wiring layout therein. In particular, it is easy to design the wiring layout of the sub word decoders 58a.

In this embodiment, a half of the memory cells MC formed in the memory core 58 are partial memory cells. That is, data as much as a half of the memory capacity of the pseudo SRAM is retained during the partial mode.

Figure 37:
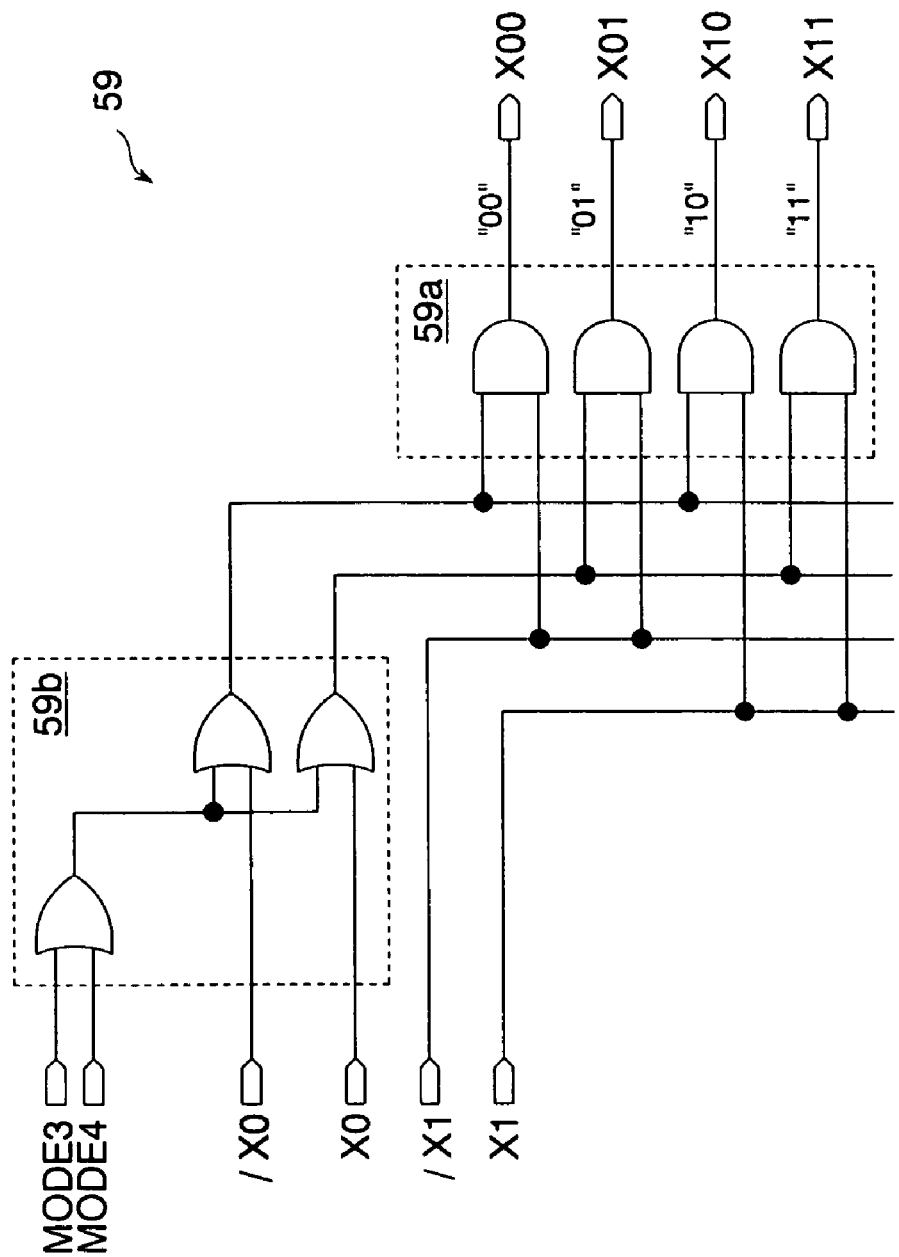
FIG. 37 is a circuit diagram showing the details of the ¼ word decoder shown in FIG. 36.

FIG. 37 shows the details of the ¼ word decoder 59 shown in FIG. 36.

The ¼ word decoder 59 has a decoder 59a and a mask circuit 59b. The decoder 59a decodes the row address signals X0, /X0, X1, and /X1 to generate the decoding signals X11, X10, X01, and X00. The mask circuit 59b masks the row address signals X0 and /X0 to output high level to the decoder 59a when the mode signal MODE3 or MODE4 is at high level.

Figure 38:
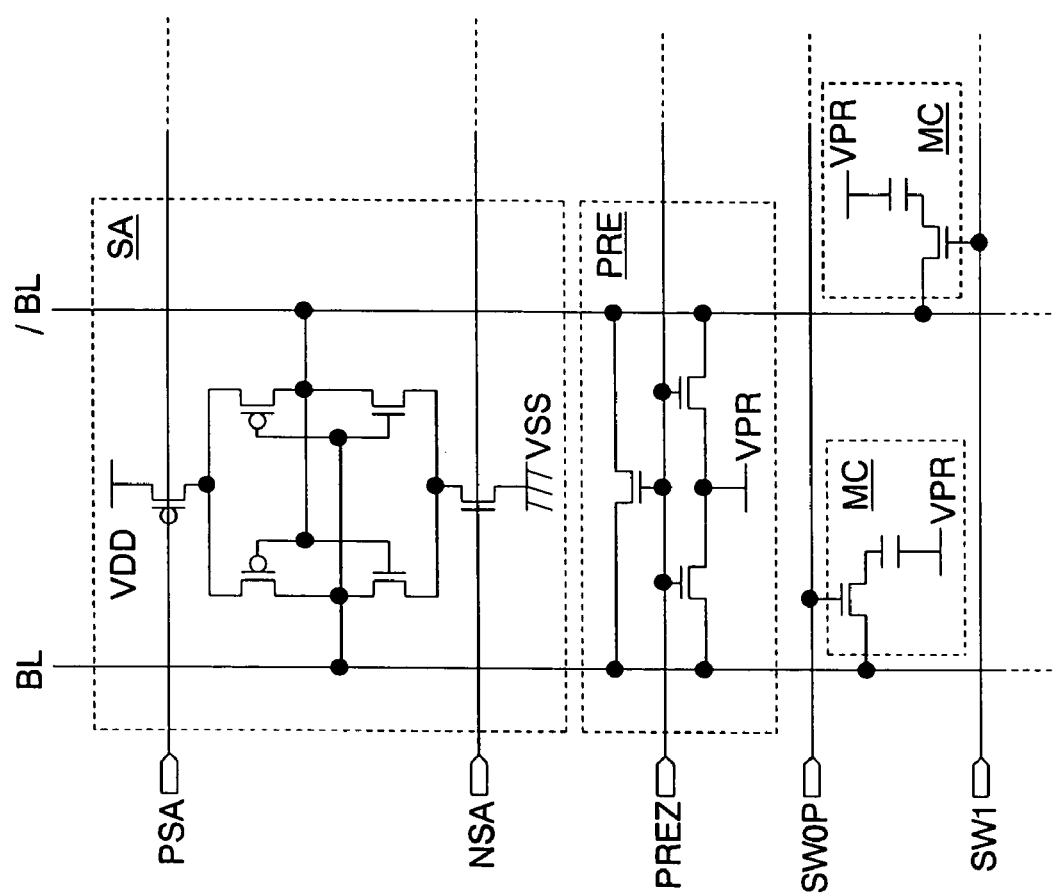
FIG. 38 is a circuit diagram showing the details of the sense amplifiers and precharge circuits shown in FIG. 36.

FIG. 38 shows the details of the sense amplifiers SA and the precharge circuits PRE shown in FIG. 36.

The sense amplifiers SA are the same as those of the sixth embodiment (FIG. 26) except in that the pMOS switch and the nMOS switch are controlled by the sense amplifier activating signals PSA and NSA, respectively. The pMOS switch turns on when the sense amplifier activating signal PSA is at low level. The nMOS switch turns on when the sense amplifier activating signal NSA is at high level.

Each precharge circuit PRE includes an nMOS transistor for connecting the bit lines BL and /BL to each other, and nMOS transistors for connecting the bit lines BL, /BL to a precharge voltage line VPR, respectively. The nMOS transistors turn on when the precharging signal PREZ is at high level, thereby connecting the bit lines BL, /BL to the precharge voltage line VPR.

Figure 39:
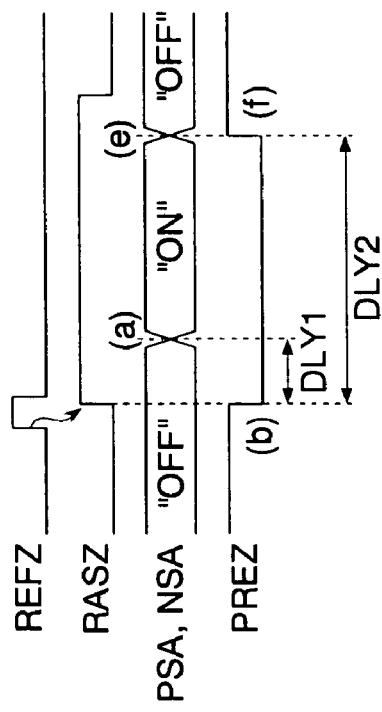
FIG. 39 is a timing chart showing the operation of the sense amplifier control circuit and the precharge control circuit shown in FIG. 28.
Figure 39:
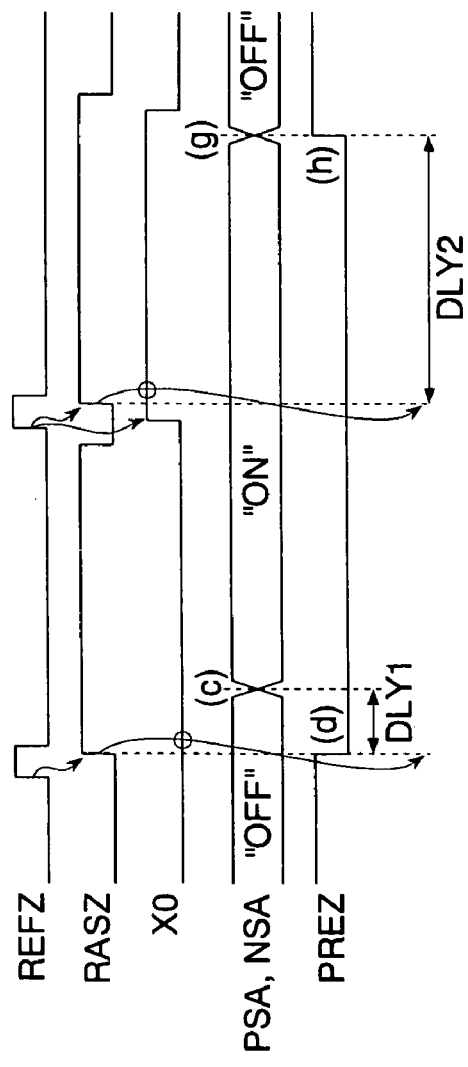

FIG. 39 shows the operation of the sense amplifier control circuit 62 and the precharge control circuit 64 shown in FIG. 28.

Regardless of the logic level of the mode signal MODE2, the sense amplifier control circuit 62 changes the sense amplifier activating signals PSA and NSA a delay time DLY1 after the rising edge of the RASZ signal, thereby activating the sense amplifiers SA (FIG. 39(a, b)). Regardless of the logic level of the mode signal MODE2, the precharge control circuit 64 changes the precharging signal PREZ to low level in synchronization with the rising edge of the RASZ signal, thereby stopping a precharge operation (FIG. 39(c, d)).

When the mode signal MODE2 is at low level (when in the first operation mode, the third operation mode, and the fourth operation mode), the sense amplifier control circuit 62 changes the sense amplifier activating signals PSA and NSA a delay time DLY2 after the rising edge of the RASZ signal, thereby inactivating the sense amplifiers SA (FIG. 39(e)). When the mode signal MODE2 is at low level, the precharge control circuit 64 changes the precharging signal PREZ to high level the delay time DLY2 after the rising edge of the RASZ signal, thereby starting a precharge operation (FIG. 39(f)).

When the mode signal MODE2 is at high level (when in the second operation mode), the sense amplifier control circuit 62 changes the sense amplifier activating signals PSA and NSA the delay time DLY2 after the rising edge of the RASZ signal, after the row address signal X0 changes to high level. This inactivates the sense amplifiers SA (FIG. 39(g)). When the mode signal MODE2 is at high level, the precharge control circuit 64 changes the precharging signal PREZ to high level the delay time DLY2 after the rising edge of the RASZ signal, after the row address signal X0 changes to high level, thereby starting a precharge operation (FIG. 39(h)).

That is, during the second operation mode (common refresh mode), in order that the data retained by the partial memory cells C00 be written to the partial memory cells and the adjacent common memory cells C10, the sense amplifiers SA are activated and precharging of the bit lines BL, /BL is inhibited while the RASZ signal is output twice. More specifically, the data latched into the sense amplifiers SA in synchronization with the refresh control signal REFZ that is output under the row address signal X0 of an even number is retained until an operation corresponding to the refresh control signal REFZ that is output after the row address signal X0 changes to an odd number.

Figure 40:
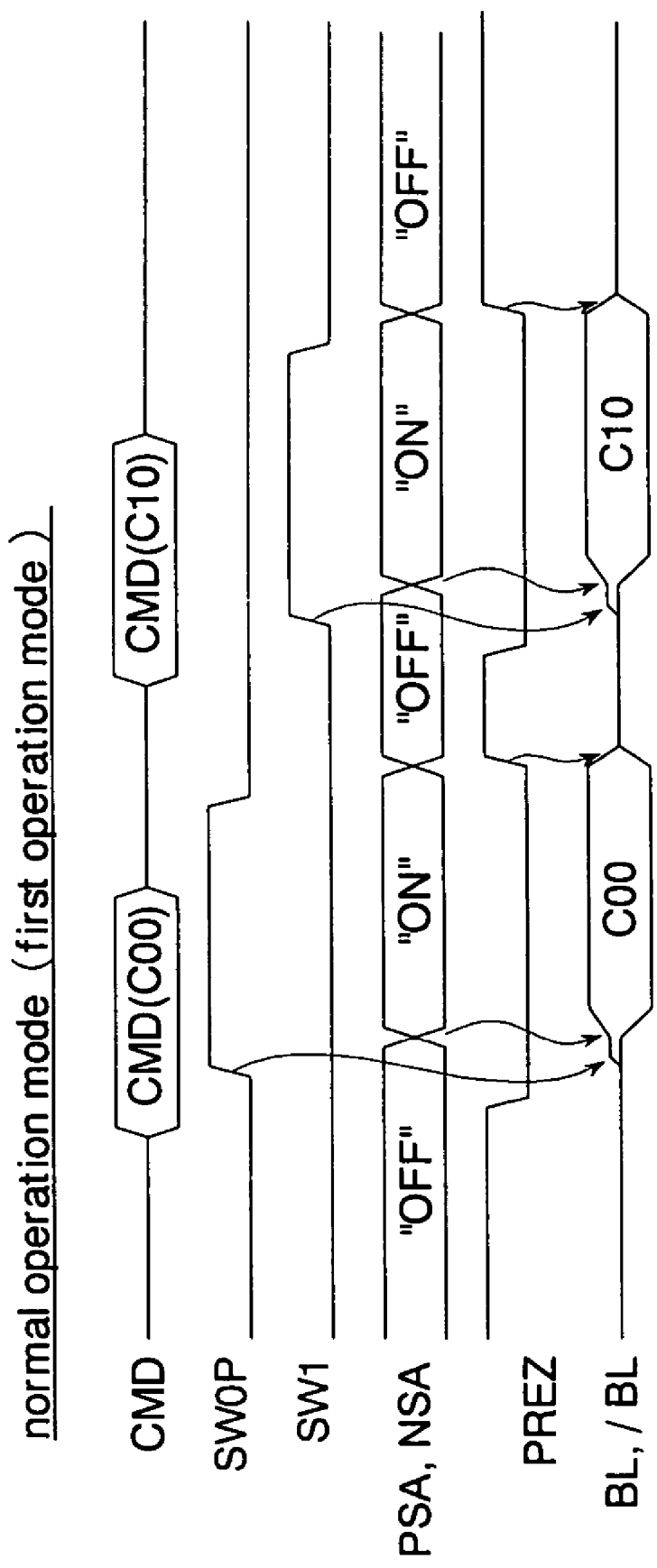
FIG. 40 is a timing chart showing the operation of the seventh embodiment in normal operation mode.

FIG. 40 shows the operation of the seventh embodiment in the normal operation mode.

Among the commands CMD to be issued to operate the pseudo SRAM in the normal operation mode are a read command and a write command supplied through external terminals, and a refresh command (REFZ signal) from the refresh command generator 52.

For example, the partial memory cells C00 are accessed by the first command CMD, and the common memory cells C10 are accessed by the next command CMD. The word lines SW0P and SW1 are selected independently according to the row address signal RAD2.

When the command signals CMD are read commands, the data amplified on the bit lines BL and /BL is output to exterior through the data bus DB. When the commands CMD are write commands, data supplied through the external terminal is amplified by the write amplifier WA and the sense amplifiers SA, and written to the memory cells. When the commands CMD are refresh commands, data amplified by the sense amplifiers SA is rewritten to the memory cells.

Figure 41:
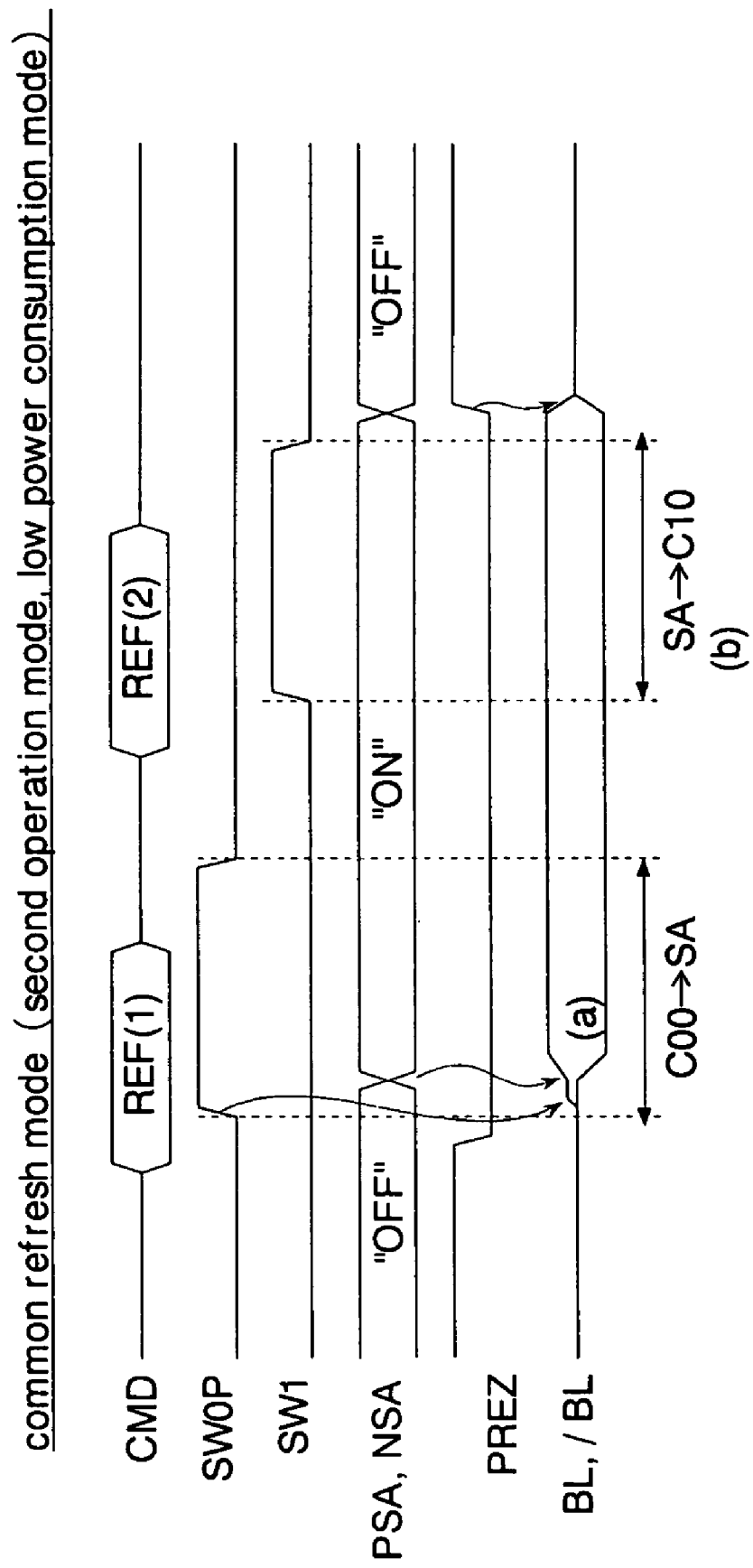
FIG. 41 is a timing chart showing the operation of the seventh embodiment in common refresh mode.

FIG. 41 shows the operation of the seventh embodiment in the common refresh mode.

In the common refresh mode, the partial memory cells C00 are initially accessed so that data retained by the partial memory cells C00 is latched into the sense amplifiers SA (FIG. 41(a)). Next, with the sense amplifiers SA activated, the common memory cells C10 are accessed so that the data (complementary data) latched in the sense amplifiers SA is written to the common memory cells C10 (FIG. 41(b)). Consequently, the partial memory cells C00 and the common memory cells C10 retain mutually complementary data. Then, the foregoing operation is performed on all the partial areas PA.

Figure 42:
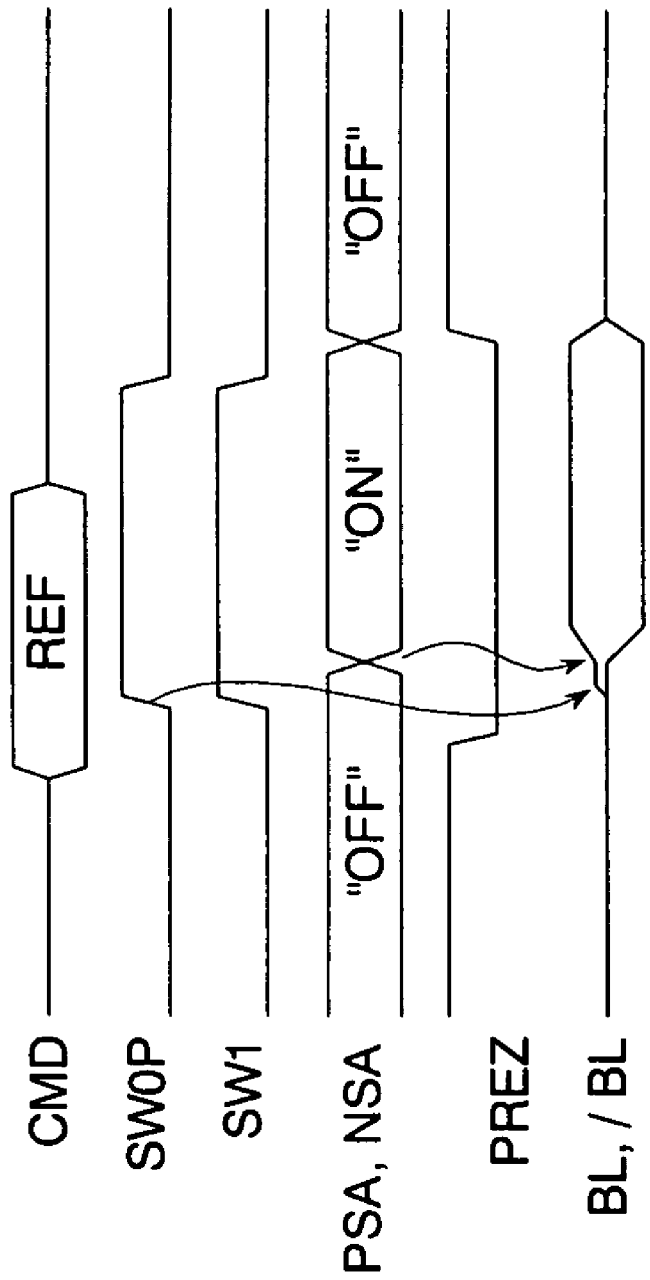
FIG. 42 is a timing chart showing the operation of the seventh embodiment in partial refresh mode and concentrated refresh mode.

FIG. 42 shows the operation of the seventh embodiment in the partial refresh mode and the concentrated refresh mode.

In the partial refresh mode and the concentrated refresh mode, the partial word line SW0P and the common word line SW1 are selected at the same time. The complementary data retained in the partial memory cells C00 and the common memory cells C10 is simultaneously amplified by the sense amplifiers SA and rewritten to the cells C00 and C10 (twin cell operation). Since the data is retained by using the partial memory cells C00 and the common memory cells C10, the refresh interval can be extended significantly.

In the partial refresh mode, the charge retained by each single memory cell immediately before a refresh operation is smaller than in the normal operation mode, as much as the refresh interval is extended. Consequently, in case of a direct shift from the partial refresh mode to the normal operation mode, memory cells on which a long time passes after refresh operations have been performed may suffer a failure in data read (data crash). Thus, before the shifting to the normal operation mode, refresh operations are performed on all the partial memory cells C00 in the concentrated refresh mode. The concentrated refresh mode requires only that data be rewritten to the partial memory cells C00. The refresh interval may thus be shorter than in the normal operation mode. In this embodiment, as shown in FIG. 32, the refresh interval is rendered ¼ the refresh interval in the normal operation mode. The refresh interval in the concentrated refresh mode may be the same as the read operation cycle tRC in the normal operation mode.

Figure 43:
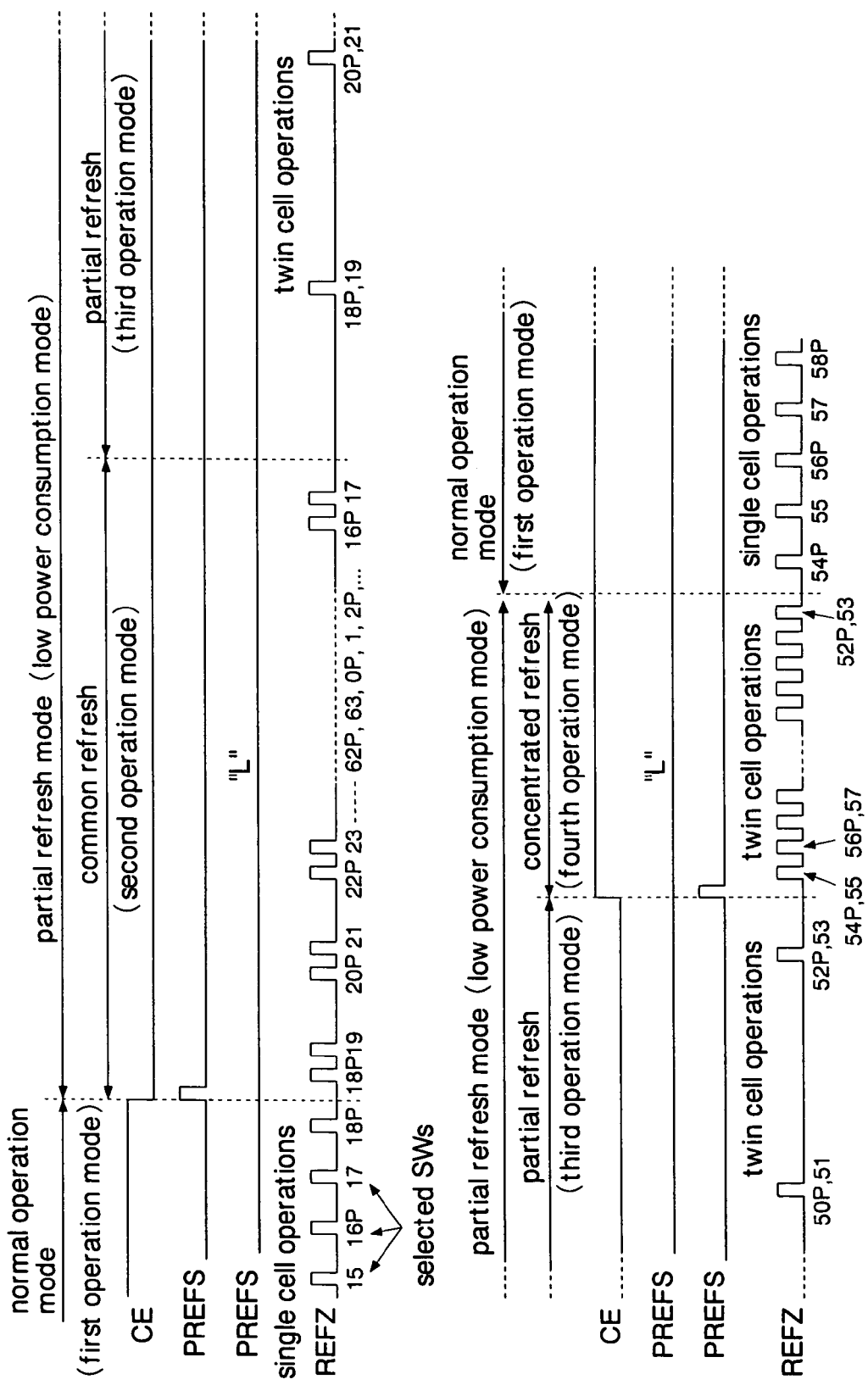
FIG. 43 is a timing chart showing the operation of the pseudo SRAM according to the seventh embodiment.

FIG. 43 shows the operation of the pseudo SRAM of the seventh embodiment. The timing chart shown to the bottom in the diagram follows the timing chart shown to the top in the diagram.

In the normal operation mode, each single sub word line SW is selected in response to the refresh control signal REFZ (single cell operations). When the CE signal changes to low level for shifting from the normal operation mode to the common refresh mode, the resetting circuit 54a of the refresh address counter 54 shown in FIG. 33 resets the counter 54b for generating the least significant bit X0 of the row address signal RAD2, in synchronization with the rising edge of the mode signal MODE2 so that the partial word lines SWP are selected initially.

After the partial word lines SWP are all selected, the operation mode shifts from the common refresh mode to the partial refresh mode. In the partial refresh mode, twin cell operations (refresh operations) are performed in which two adjacent sub word lines SW are selected for each single refresh control signal REFZ.

When the CE signal changes to high level during the partial refresh mode, the operation mode shifts to the concentrated refresh mode. In the concentrated refresh mode, twin cell operations are performed at shorter refresh intervals. Then, after the twin cell operations are performed on all the sub word lines SW, the operation mode shifts to the normal operation mode.

As above, the present embodiment can offer the same effects as those of the third embodiment described above. Besides, in this embodiment, the partial word lines SWP and the common word lines SW in the respective same partial areas PA are arranged adjacent to each other. This can simplify the circuit layout of the word decoder WDEC for selecting the word lines SWP and SW.

In accordance with the chip enable signal CE for operating the pseudo SRAM, the operation mode shifts to the normal operation mode or the partial mode. Thus, the operation mode of the pseudo SRAM can be shifted by simple control. As a result, the control circuit of the system implementing the pseudo SRAM can be configured simply.

Figure 44:
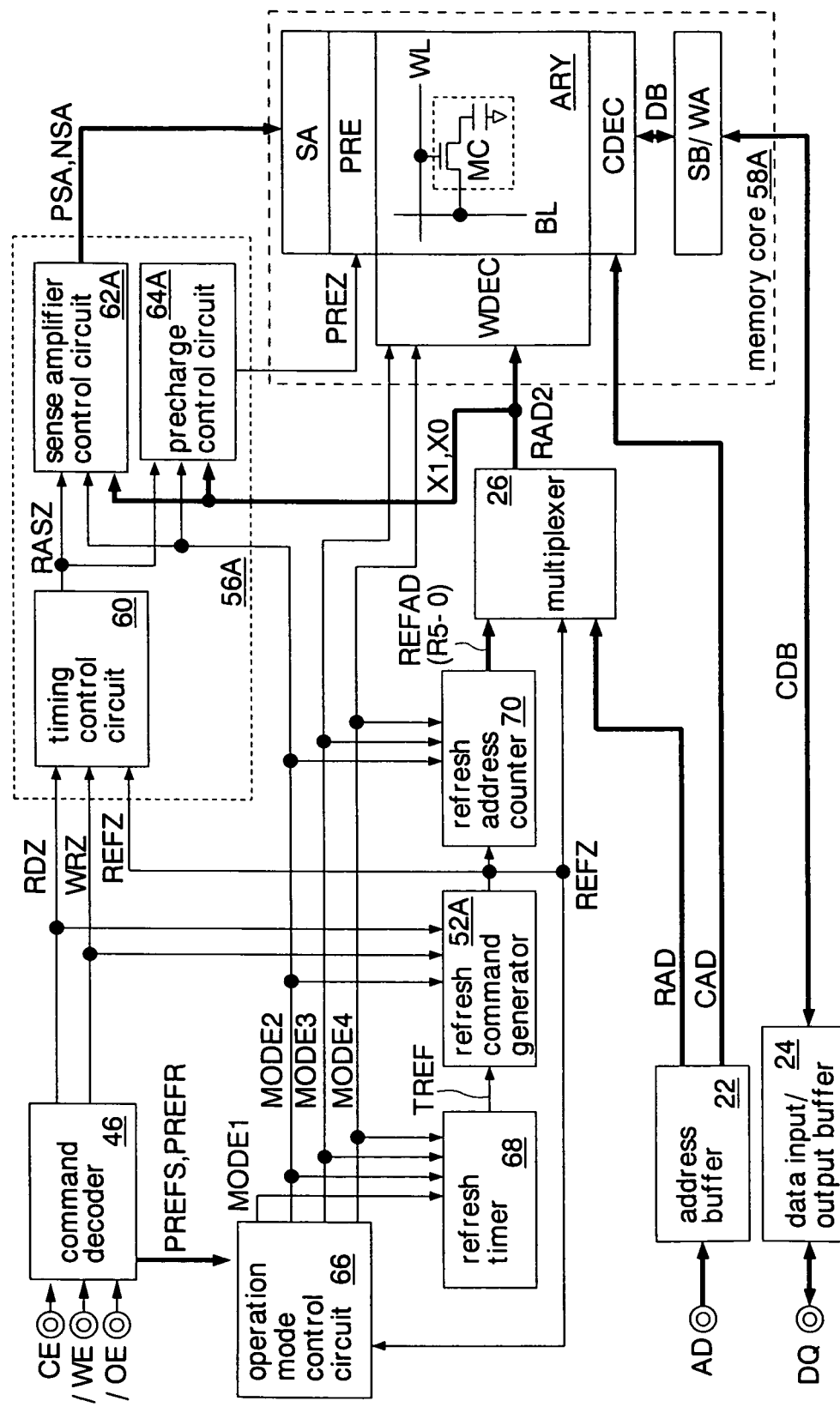
FIG. 44 is a block diagram showing an eighth embodiment of the semiconductor memory of the present invention.

FIG. 44 shows an eighth embodiment of the semiconductor memory of the present invention. The same elements as those described in the first and seventh embodiments will be designated by identical reference numbers or symbols. Detailed description thereof will be omitted here.

In this embodiment, an operation mode control circuit 66, a refresh timer 68, a refresh command generator 52A, a refresh address counter 70, a core control circuit 56A, and a memory core 58A are formed instead of the operation mode control circuit 48, the refresh timer 50, the refresh command generator 52, the refresh address counter 54, the core control circuit 56, and the memory core 58 of the seventh embodiment. The rest of the configuration is almost the same as in the seventh embodiment. The operation mode control circuit 66, the refresh timer 68, the refresh address counter 70, and the core control circuit 56A operate as an operation control circuit.

The sense amplifier control circuit 62A and the precharge control circuit 64A receive the lower two bits X1 and X0 of the row address signal RAD output from the multiplexer 26.

Figure 45:
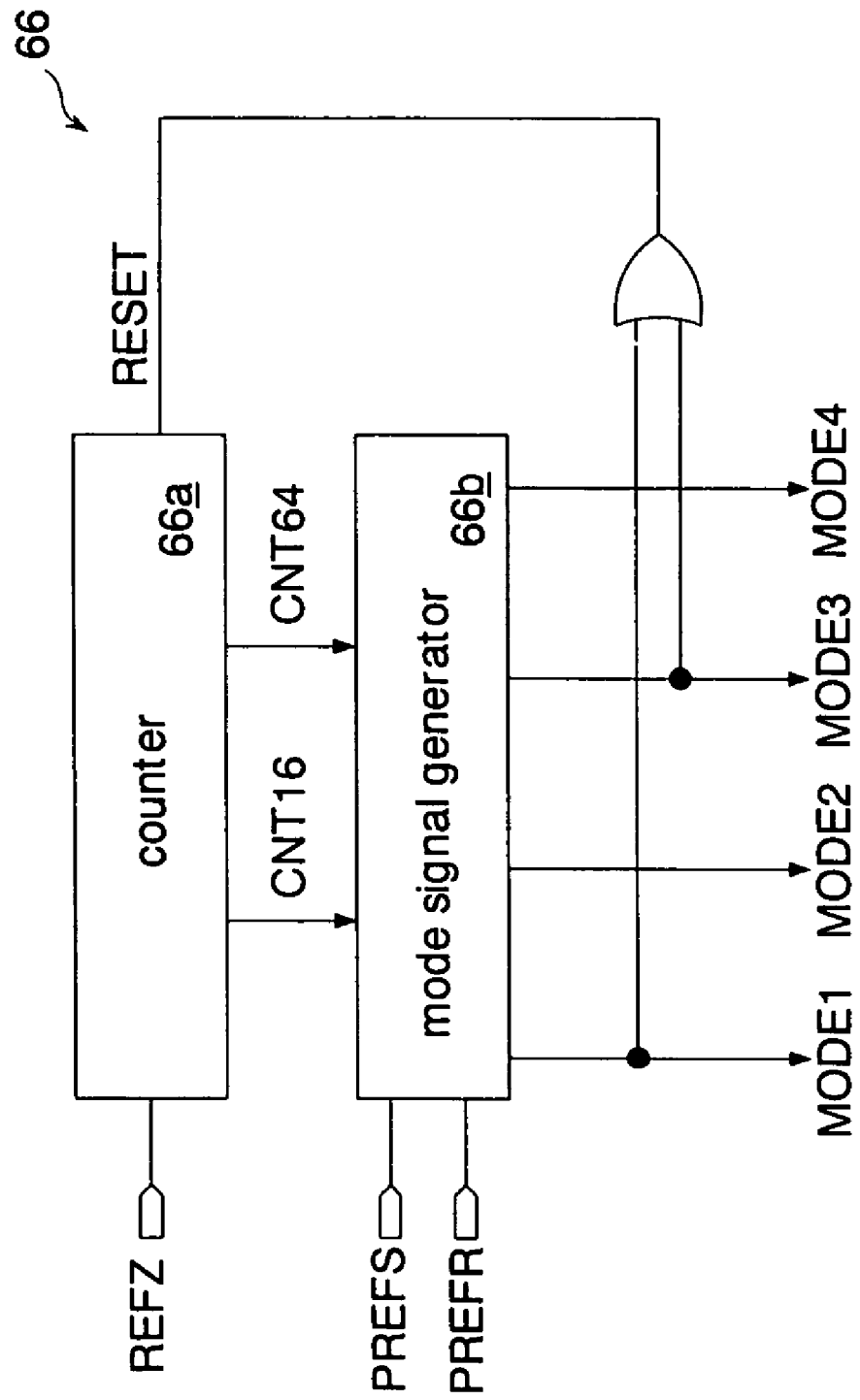
FIG. 45 is a block diagram showing the details of the operation mode control circuit shown in FIG. 44.

FIG. 45 shows the details of the operation mode control circuit 66 shown in FIG. 44.

The operation mode control circuit 66 has a counter 66a and a mode signal generator 66b. The counter 66a counts in synchronization with the rising edge of the refresh control signal REFZ. The counter 66a outputs a counter signal CNT16 at the 16th count and a counter signal CNT64 at the 64th count.

Figure 46:
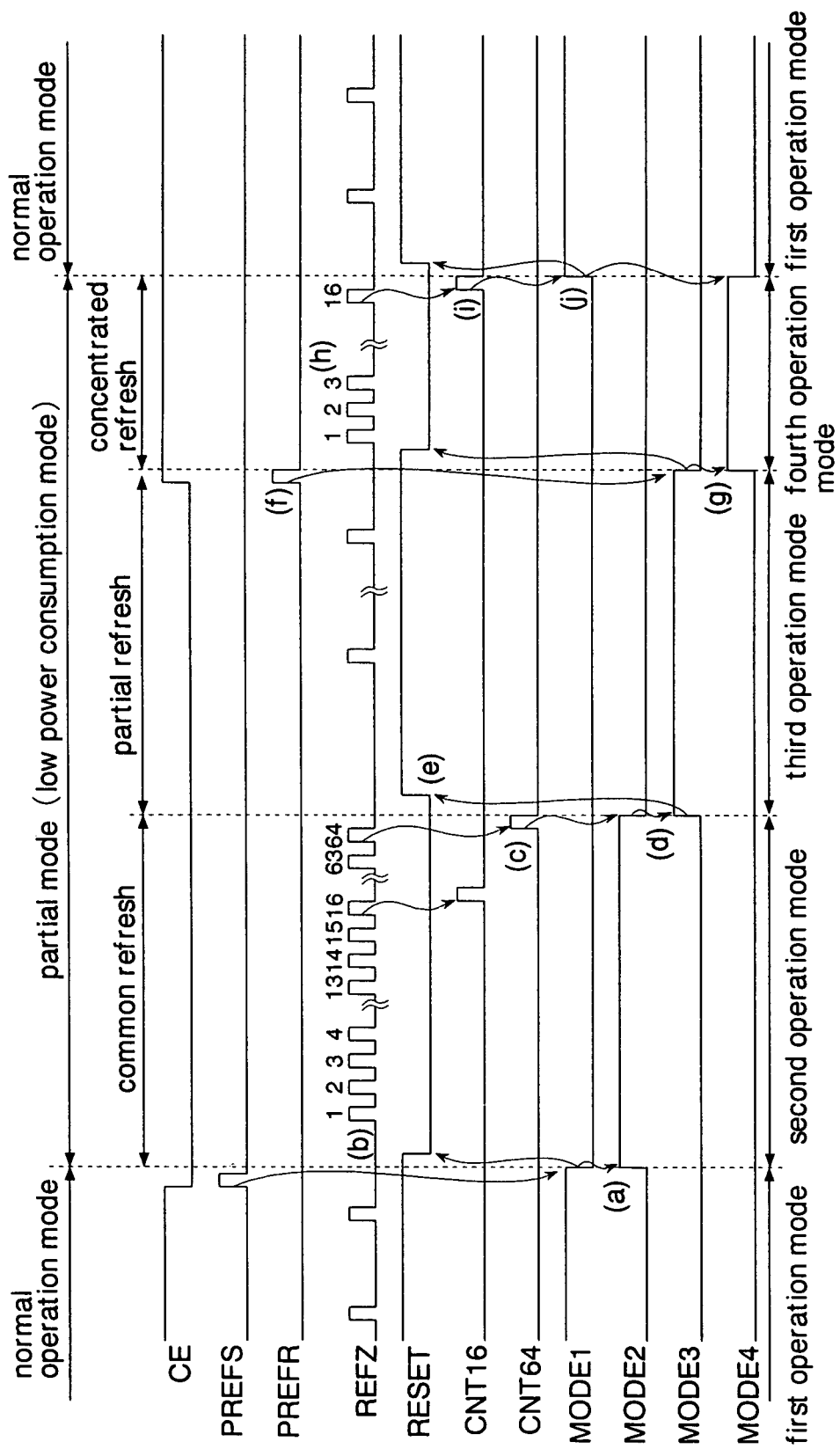
FIG. 46 is a timing chart showing the operation of the operation mode control circuit shown in FIG. 44.

FIG. 46 shows the operation of the operation mode control circuit 66 shown in FIG. 45.

In this embodiment, the refresh control signal REFZ is output four times in succession during the common refresh mode. In the partial refresh mode and the concentrated refresh mode, partial memory cells C00 connected to a single partial word line SWP to be described later and common memory cells C10, C20, and C30 connected to three common word lines SW, respectively, are refreshed at a time (quad cell operation). Thus, during the concentrated refresh mode, 16 refresh control signals REFZ are output to refresh the entire retained data.

Figure 47:
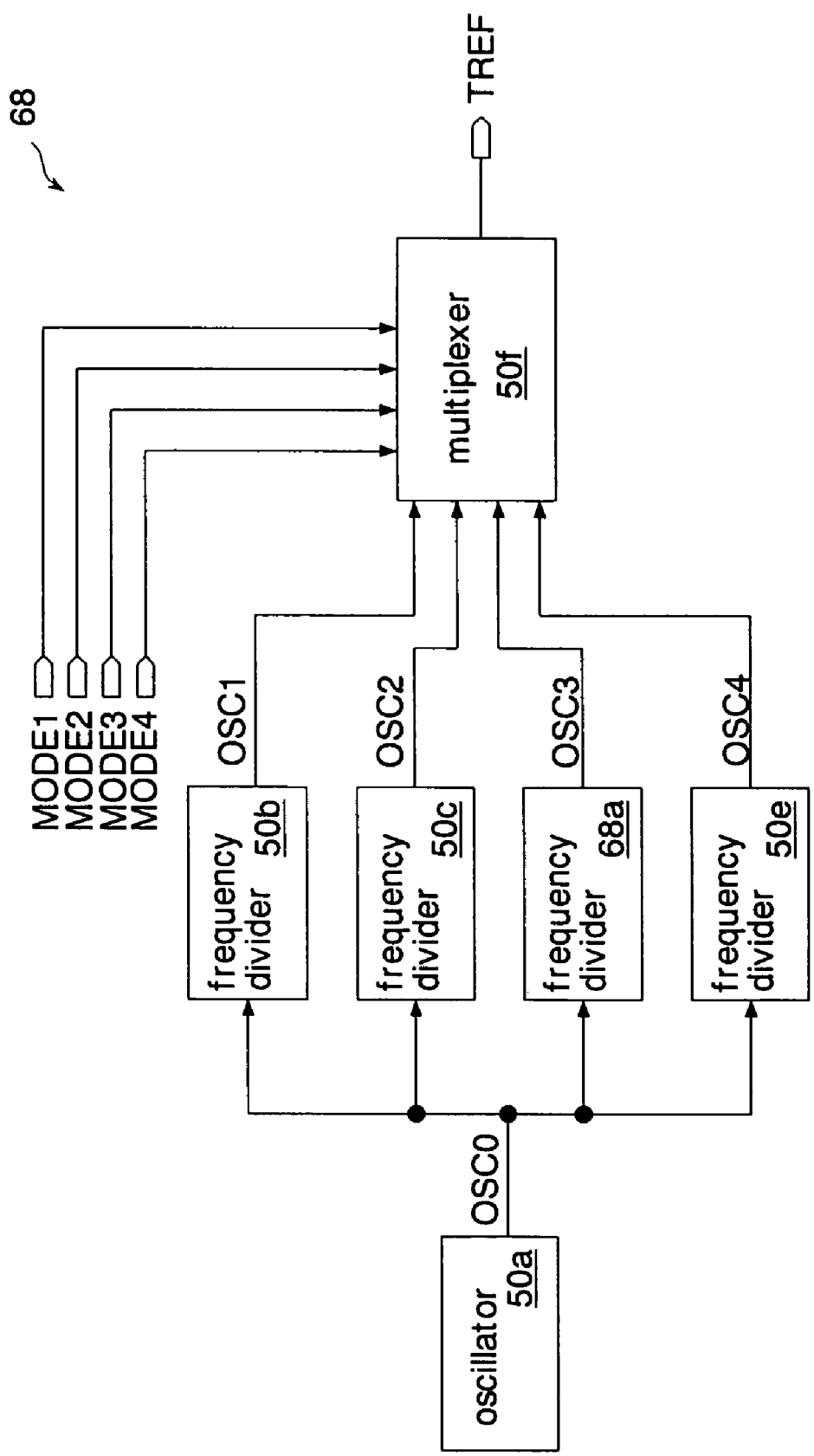
FIG. 47 is a block diagram showing the details of the refresh timer shown in FIG. 44.

FIG. 47 shows the details of the refresh timer 68 shown in FIG. 44.

The refresh timer 68 has frequency dividers 50b, 50c, 68a, and 50e which convert the OSC0 signal to ⅛, ⅟₁₆, ⅟₆₄, and ½ in frequency, respectively.

Figure 48:
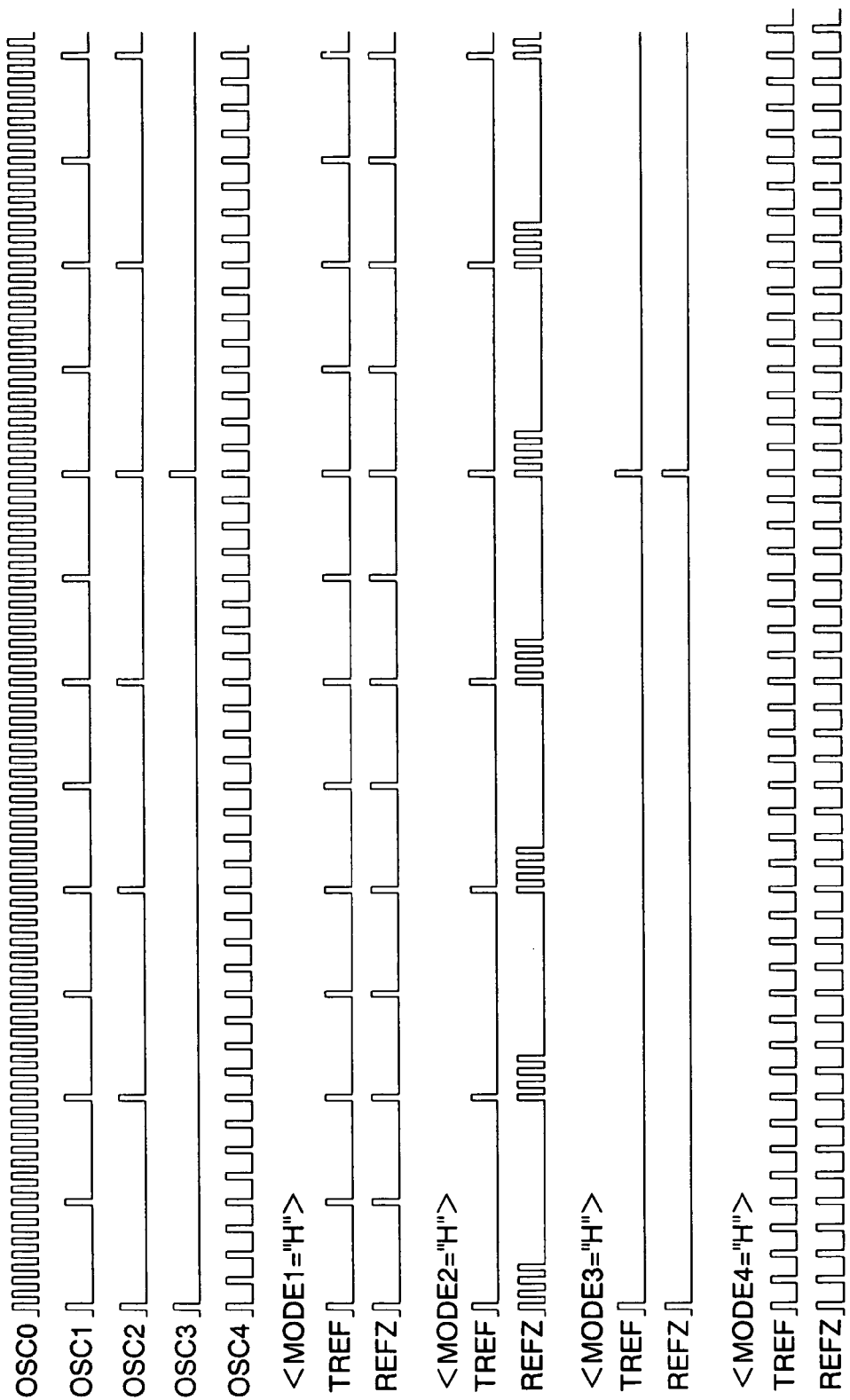
FIG. 48 is a timing chart showing the operation of the refresh timer and the refresh command generator according to the eighth embodiment.

FIG. 48 shows the operation of the refresh timer 68 and the refresh command generator 52A.

The refresh timer 68 outputs the oscillation signals OSC1, OSC2, OSC3, and OSC4 as the refresh request signal TREF when the mode signals MODE1, MODE2, MODE3, and MODE4 are at high level, respectively. The refresh command generator 52A outputs the refresh request signal TREF as the refresh control signal REFZ when the mode signals MODE1, MODE3, and MODE4 are at high level, respectively. When the mode signal MODE2 is at high level, the refresh command generator 52A outputs the refresh control signal REFZ four times in synchronization with the refresh request signal TREF.

Figure 49:
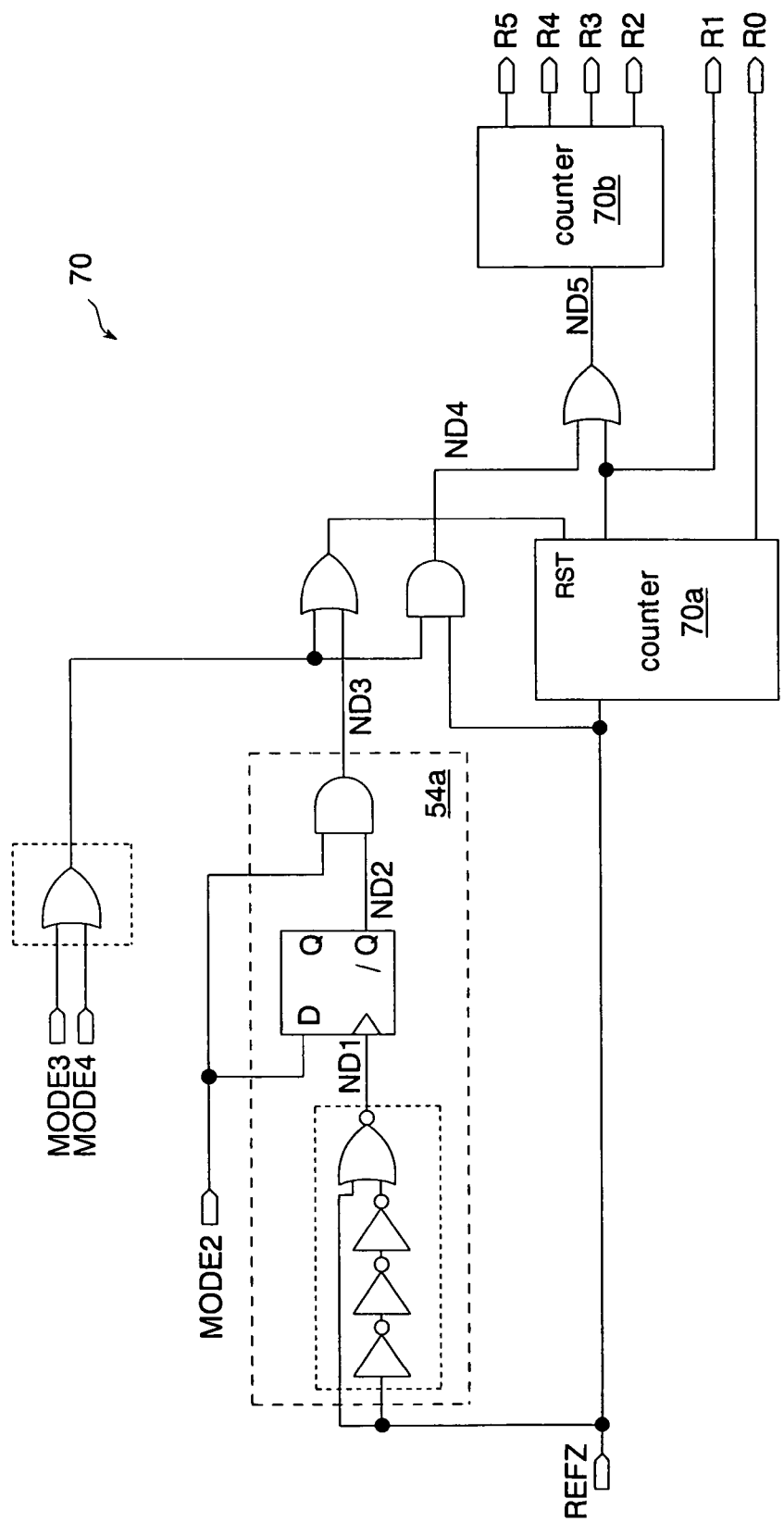
FIG. 49 is a block diagram showing the details of the refresh address counter shown in FIG. 44.

FIG. 49 shows the details of the refresh address counter 70 shown in FIG. 44.

The refresh address counter 70 has a resetting circuit 54a, counters 70a and 70b, and logic gates for controlling the counters 70a and 70b. The counter 70a counts in synchronization with the refresh control signal REFZ to generate the lower two bits R1 and R0 of the refresh address signal REFAD. The counter 70a is reset when the mode signal MODE3 or MODE4 is at high level, or in synchronization with the rising edge of the mode signal MODE2.

When the mode signal MODE3 or MODE4 is at high level, the counter 70b counts in synchronization with the refresh control signal REFZ to update the upper four bits R5-2 of the refresh address signal REFAD. When the mode signal MODE1 or MODE2 is at high level (except in a predetermined period after the rising edge of the mode signal MODE2), the counter 70b counts in synchronization with the address signal R1 output from the counter 70a, thereby updating the bits R5-2.

FIG. 50 shows the operation of the refresh address counter 70 shown in FIG. 49.

When the mode signal MODE1 or MODE2 is at high level, the refresh address counter 70 successively counts up the 6-bit refresh address signal R5-0 in synchronization with the refresh control signal REFZ. When the mode signal MODE3 or MODE4 is at high level, the refresh address counter 70 successively counts up the 4-bit refresh address signal R5-2 in synchronization with the refresh control signal REFZ. Here, the refresh address signal R1, R0 is fixed to low level.

Figure 51:
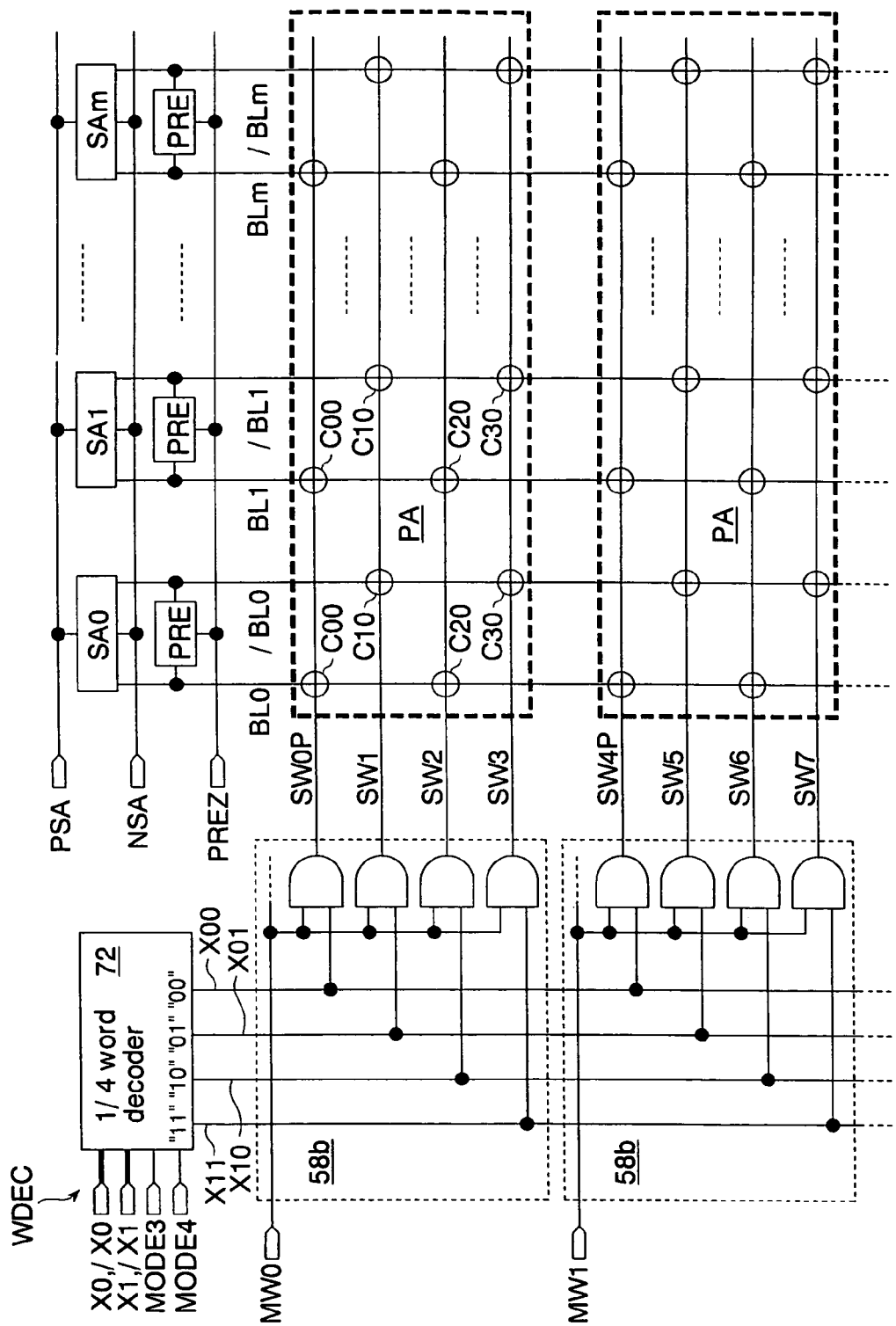
FIG. 51 is a block diagram showing the details of essential parts of the memory core shown in FIG. 44.

FIG. 51 shows the details of essential parts of the memory core 58A shown in FIG. 44.

The word decoder WDEC of the memory core 58A has a ¼ word decoder 72 and a plurality of sub word decoders 58b corresponding to main word lines MW (MW0, MW1, . . . ), respectively. The ¼ word decoder 72 outputs any of decoding signals X11, X10, X01, and X00 according to the lower two bits X1 and X0 of the row address signal RAD2 and the inverted bits /X1 and /X0 thereof when the mode signals MODE3 and MODE4 are at low level. The ¼ word decoder 72 changes all the decoding signals X11, X10, X01, and X00 to high level when either of the mode signals MODE3 and MODE4 is at high level.

In this embodiment, the memory cells (C00, C10, C20, C30, . . . ) connected to adjacent four sub word lines (for example, SW0P, SW1, SW2, and SW3) form a partial area PA. For example, the sub word line SW0P is a partial word line connected to the partial memory cells C00 whose data is retained in the partial mode. The sub word lines SW1, SW2, and SW3 are common word lines connected to the common memory cells C10, C20, and C30 whose data will not be retained in the partial mode.

The partial memory cells C00 and the common memory cells C20 are connected to the bit lines BL, and the common memory cells C10 and C30 are connected to the bit lines /BL. In the partial mode, the partial word line SW0P and the common word lines SW1, SW2, and SW3 are selected in synchronization with one another so that four memory cells are accessed at a time (quad cell operation). Then, the data retained by the partial memory cell C00 during the normal operation mode is retained by the four memory cells C00, C10, C20, and C30 during the partial mode.

In this embodiment, a quarter of the memory cells MC formed in the memory core 58A are partial memory cells. That is, data as much as a quarter of the memory capacity of the pseudo SRAM is retained during the partial mode.

Figure 52:
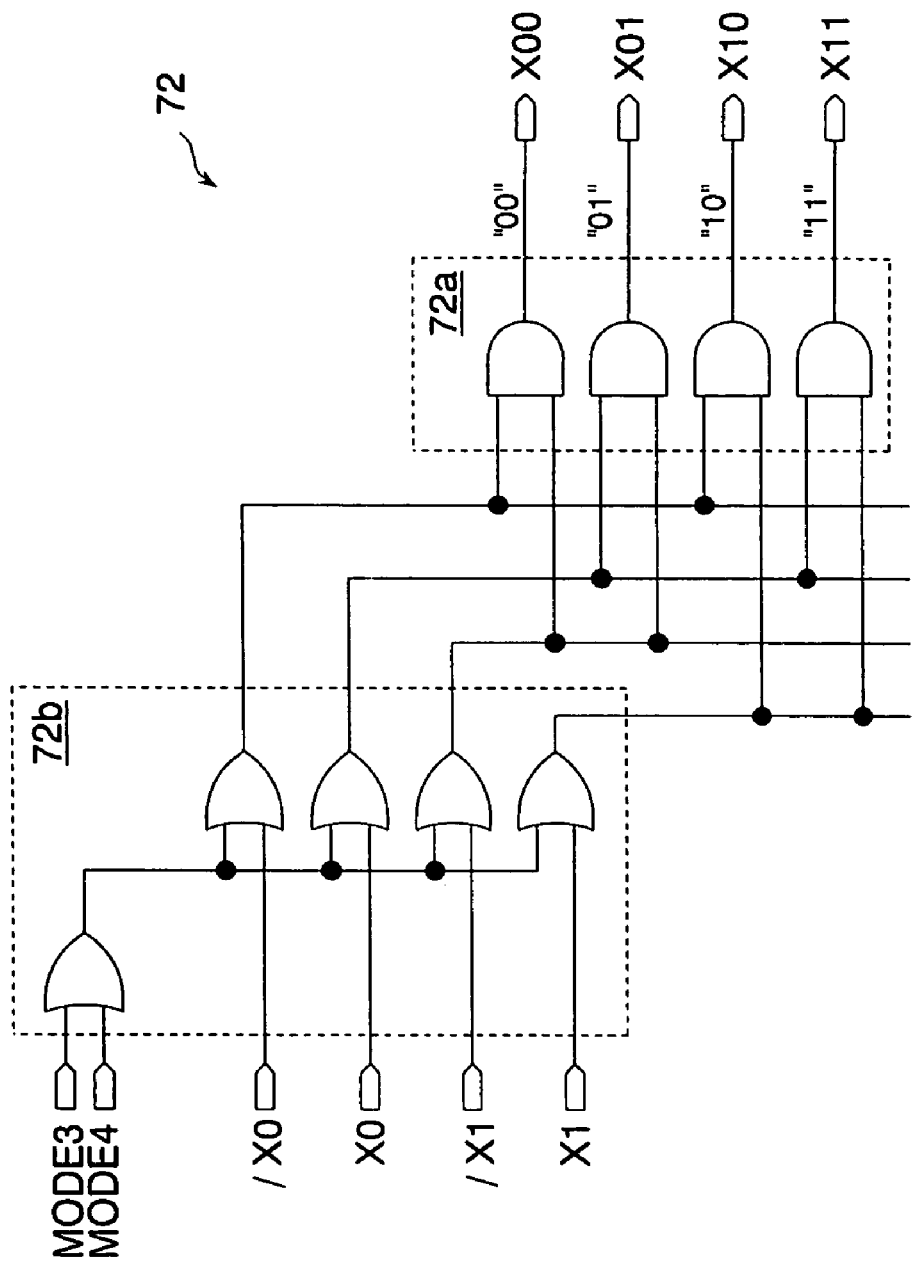
FIG. 52 is a circuit diagram showing the details of the ¼ word decoder shown in FIG. 51.

FIG. 52 shows the details of the ¼ word decoder 72 shown in FIG. 51.

The ¼ word decoder 72 has a decoder 72a and a mask circuit 72b. The decoder 72a decodes the row address signals X0, /X0, X1, and /X1 to generate the decoding signals X11, X10, X01, and X00. The mask circuit 72b masks the row address signals X0, /X0, X1, and /X1 to output high level to the decoder 72a when the mode signal MODE3 or MODE4 is at high level.

Figure 53:
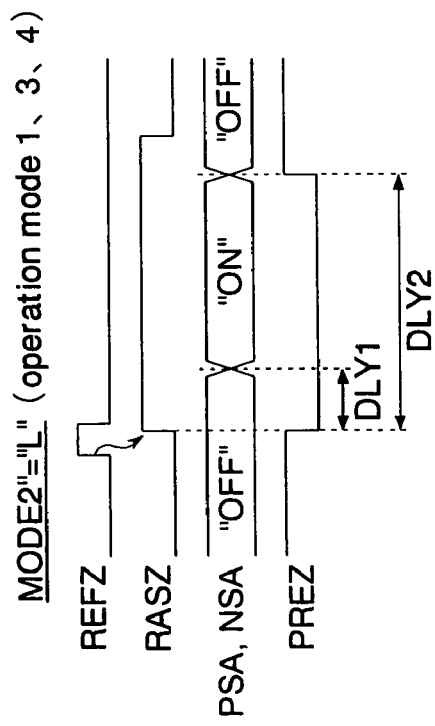
FIG. 53 is a timing chart showing the operation of the sense amplifier control circuit and the precharge control circuit shown in FIG. 44.
Figure 53:
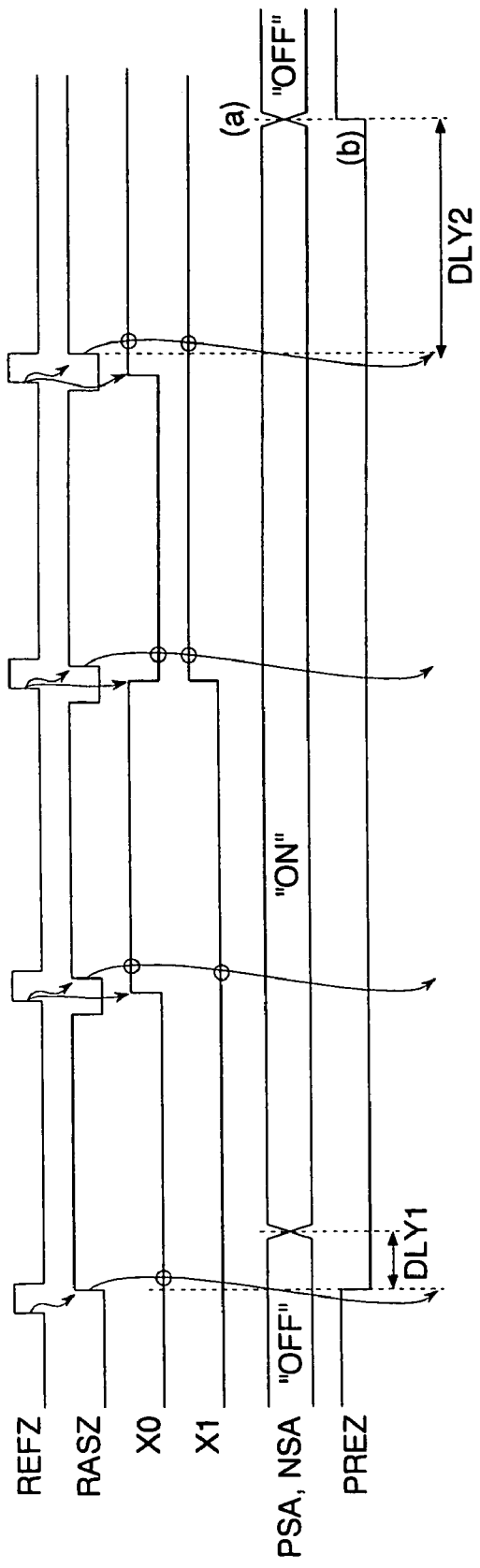

FIG. 53 shows the operation of the sense amplifier control circuit 62A and the precharge control circuit 64A shown in FIG. 44. For situations where the mode signal MODE2 is at low level and where the mode signal MODE2 changes to high level, the operation is the same as in the seventh embodiment (FIG. 39).

When the mode signal MODE2 is at high level (when in the second operation mode), the sense amplifier control circuit 62A changes the sense amplifier activating signals PSA and NSA a delay time DLY2 after the rising edge of the RASZ signal, after the row address signals X1 and X0 both change to high level. This inactivates the sense amplifiers SA (FIG. 53(a)). When the mode signal MODE2 is at high level, the precharge control circuit 64A changes the precharging signal PREZ to high level the delay time DLY2 after the rising edge of the RASZ signal, after the row address signals X1 and X0 both change to high level, thereby starting a precharge operation (FIG. 53(b)).

That is, during the second operation mode (common refresh mode), in order that the data retained by the partial memory cells C00 be written to the partial memory cells and the adjacent common memory cells C10, C20, and C30, the sense amplifiers SA are activated and the bit lines BL, /BL are kept from being precharged while the RASZ signal is output four times.

Figure 54:
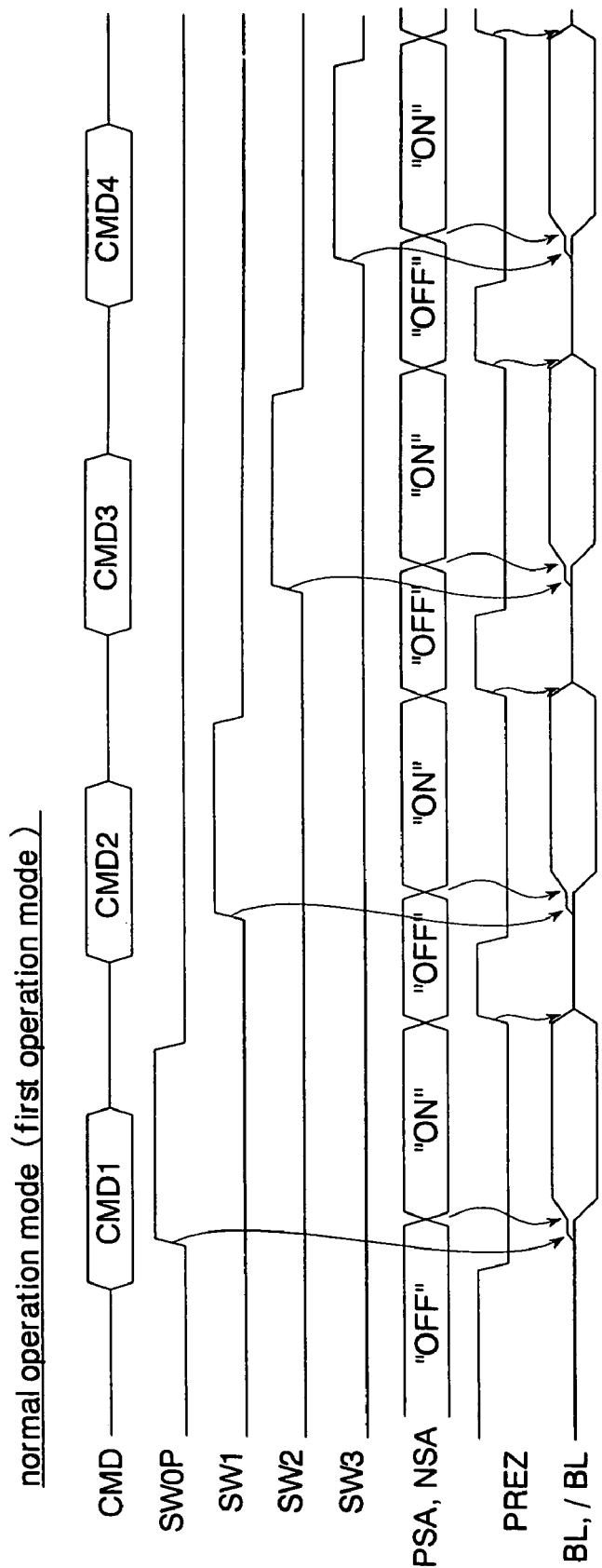
FIG. 54 is a timing chart showing the operation of the eighth embodiment in normal operation mode.

FIG. 54 shows the operation of the eighth embodiment in the normal operation mode.

In the normal operation mode, the word lines SW0P, SW1, SW2, and SW3 are selected independently according to the row address signal RAD2 as in the seventh embodiment (FIG. 40). Then, in response to read commands or write commands from exterior, read operations or write operations are performed. Refresh operations are performed in response to refresh commands generated inside the pseudo SRAM.

Figure 55:
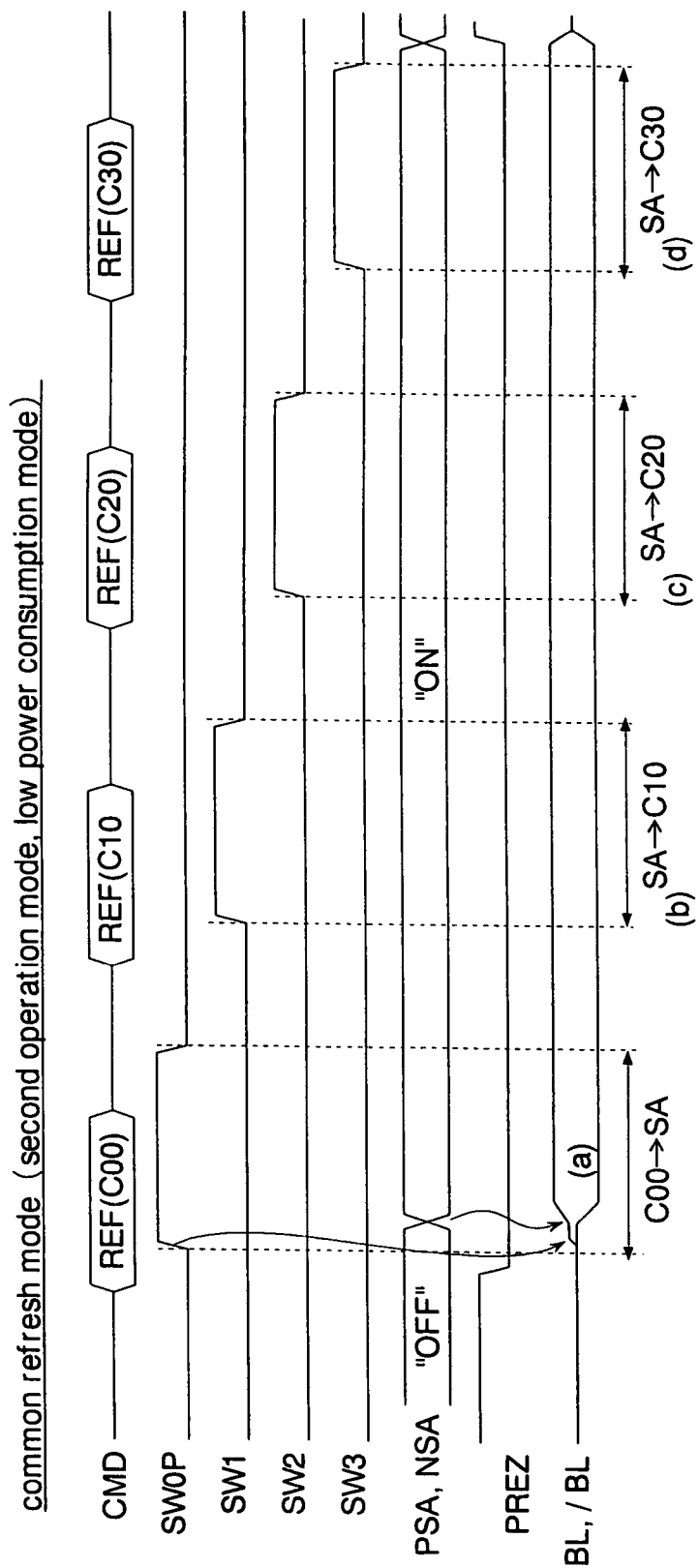
FIG. 55 is a timing chart showing the operation of the eighth embodiment in common refresh mode.

FIG. 55 shows the operation of the eighth embodiment in the common refresh mode.

In the common refresh mode, the data retained by the partial memory cells C00 are initially latched into the sense amplifiers SA (FIG. 55(*a*)). Next, with the sense amplifiers SA activated, the common memory cells C10, C20, and C30 are accessed in succession so that the data (complementary data) latched in the sense amplifiers SA is written to these common memory cells C10, C20, and C30 (FIG. 55(*b, c, d*)). Consequently, the partial memory cells C00 and the common memory cells C10, C20, and C30 retain mutually complementary data. The foregoing operation is performed on all the partial areas PA.

Figure 56:
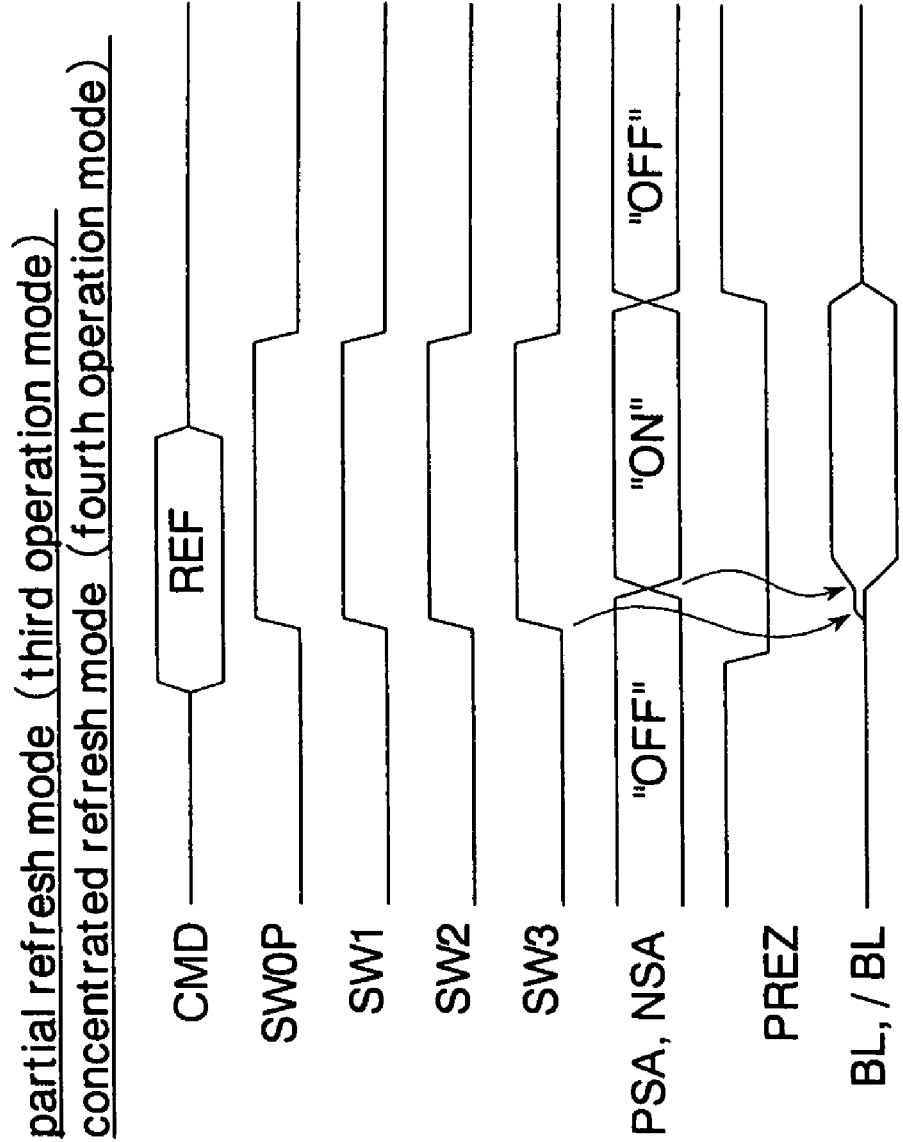
FIG. 56 is a timing chart showing the operation of the eighth embodiment in partial refresh mode and concentrated refresh mode.

FIG. 56 shows the operation of the eighth embodiment in the partial refresh mode and the concentrated refresh mode.

In the partial refresh mode and the concentrated refresh mode, the partial word line SW0P and the common word lines SW1, SW2, and SW3 are selected at the same time. The complementary data retained in the partial memory cells C00 and the common memory cells C10, C20, and C30 is simultaneously amplified by the sense amplifiers SA and rewritten to the cells C00, C10, C20, and C30 (quad cell operation). Since the data is retained by the partial memory cells C00 and the common memory cells C10, C20, and C30, the refresh interval can be extended more than in the seventh embodiment.

The concentrated refresh mode, as in the seventh embodiment, is an operation necessary to prevent the data retained by the partial memory cells C00 from disappearing upon shifting from the partial mode to the normal operation mode.

As above, the present embodiment can offer the same effects as those obtained from the third and seventh embodiments described above. Moreover, in this embodiment, data retained in a single partial memory cell C00 is retained by using the partial memory cell C00 and common memory cells C10, C20, and C30 in the partial mode. This allows a further increase in retention time over which the data can be retained. Consequently, the frequency of refresh operations can be reduced further with a significant reduction in the power consumption during the partial mode.

Incidentally, the embodiments described above have dealt with the cases where the present invention is applied to a pseudo SRAM. However, the present invention is not limited to such embodiments. For example, the present invention may be applied to a DRAM that has a self refresh function.

The foregoing embodiments have dealt with the cases where the CE signal, the /WE signal, and the /OE signal are used as the command signals. However, the present invention is not limited to such embodiments. For example, as with a DRAM, a row address strobe signal /RAS and a column address strobe signal /CAS may be used as the command signals.

The foregoing embodiments have dealt with the cases where the operation mode is changed to the partial mode when the chip enable signal CE is at low level. However, the present invention is not limited to such embodiments. For example, two chip enable signals /CE1 and CE2 may be received through external terminals. Here, normal read operations and write operations are enabled when the /CE1 signal is at low level and the CE2 signal at high level, and the operation mode is changed to the partial mode when the CE2 signal is at low level.

The first through fifth embodiments described above have dealt with the cases where the present invention is applied to a memory core having an architecture in which the sense amplifiers SA are connected to a single bit line BL each. However, the present invention is not limited to such embodiments. For example, the memory cores described in the first through fifth embodiments may be replaced with a memory core that has complementary bit lines BL and /BL such as illustrated in the sixth embodiment.

The foregoing first through fifth embodiments have dealt with the cases where the mode register 14 is set with a predetermined value so that the low power consumption mode is established as the partial mode where the mode signal PAMDZ of high level is output. However, the present invention is not limited to such embodiments. For example, the mode register may be made of a fuse circuit having a fuse with such a specification that the partial mode for outputting the mode signal PAMDZ is established when the fuse is blown in the fabrication process. Alternatively, the output of the fuse circuit may be input to the mode register so that the mode register is set in accordance with the programmed state of the fuse upon power-up of the pseudo SRAM. Furthermore, the output level of the mode signal PAMDZ may be set according to the voltage value of a conductive layer that is formed on the chip as corresponding to the pattern shape of a photomask used in the fabrication process.

The third embodiment (FIG. 18) and fourth embodiment (FIG. 21) described above have dealt with the cases where concentrated refresh operations are performed on the memory cells MC in all the partial areas PA. However, the present invention is not limited to such embodiments. For example, concentrated refresh operations may be performed only on memory cells MC on which a predetermined period elapses since previous refresh operations have been performed. Here, an example of the predetermine period is the time equivalent to the refresh interval for a single memory cell. In this case, the partial areas PA to undergo concentrated refresh can be reduced approximately by half, with a reduction in the period required for concentrated refresh operations. The reduced number of refresh operations can also reduce the power consumption.

Figure 57:
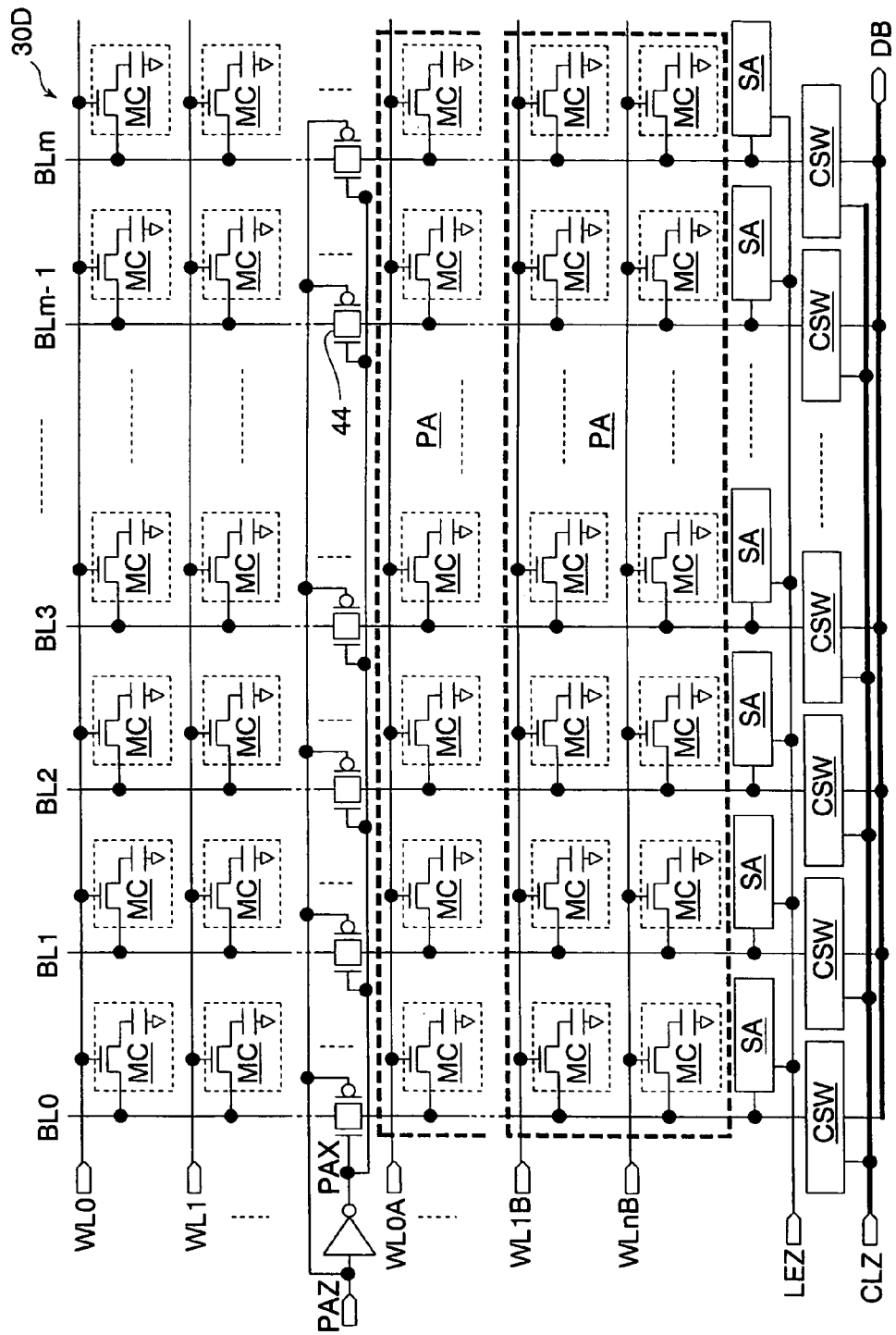
FIG. 57 is a block diagram showing another example of the memory core according to the fifth embodiment.

The fifth embodiment described above has dealt with the case where the switch circuit 44 is composed of nMOS transistors. However, the present invention is not limited to such an embodiment. For example, as shown in FIG. 57, the switch circuit 44 may be composed of CMOS transmission gates. In this case, the bit lines BL can be reduced in resistance so that refresh operations, read operations, and write operations are performed at high speed.

The foregoing fifth embodiment has dealt with the case where the bit lines BL are divided into two equal parts to form the partial areas PA. However, the present invention is not limited to such an embodiment. For example, the bit lines BL may be divided into four equal parts to form the partial areas PA. Here, the refresh intervals can be rendered four times longer, with a further reduction in the power consumption during the partial mode.

The sixth embodiment described above has dealt with the case where the word line WLP is continuously selected during the partial mode. However, the present invention is not limited to such an embodiment. For example, as in the second embodiment, the word line WLP may be selected only at the start and at the end of the partial mode. In particular, when the word lines are supplied with a boost voltage, the frequency of operation of the booster can be lowered during the partial mode with a further reduction in power consumption.

Figure 58:
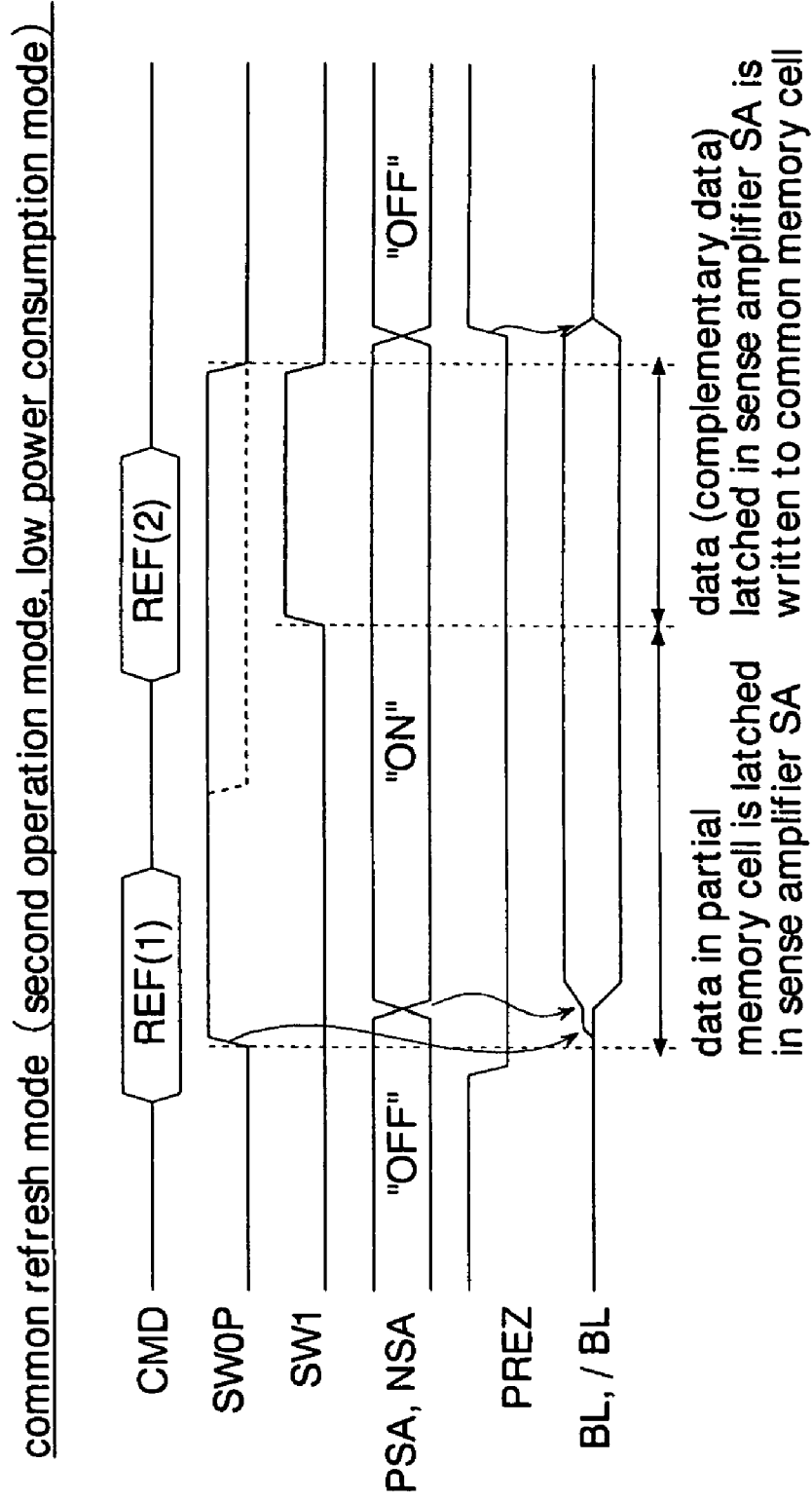
FIG. 58 is a timing chart showing another example of operation of the seventh embodiment in common refresh mode.

The seventh embodiment (FIG. 41) described above has dealt with the case where the partial word line SW0P and the common word line SW1 are successively selected in the common refresh mode. However, the present invention is not limited to such an embodiment. For example, as shown in FIG. 58, the partial word line SW0P may be kept selected until it is deselected along with the common word line SW1. In this case, the word lines can be deselected by a single operation of the resetting circuit with a reduction in power consumption. The operation shown in FIG. 58 may also be applied to the eighth embodiment (FIG. 55).

Figure 59:
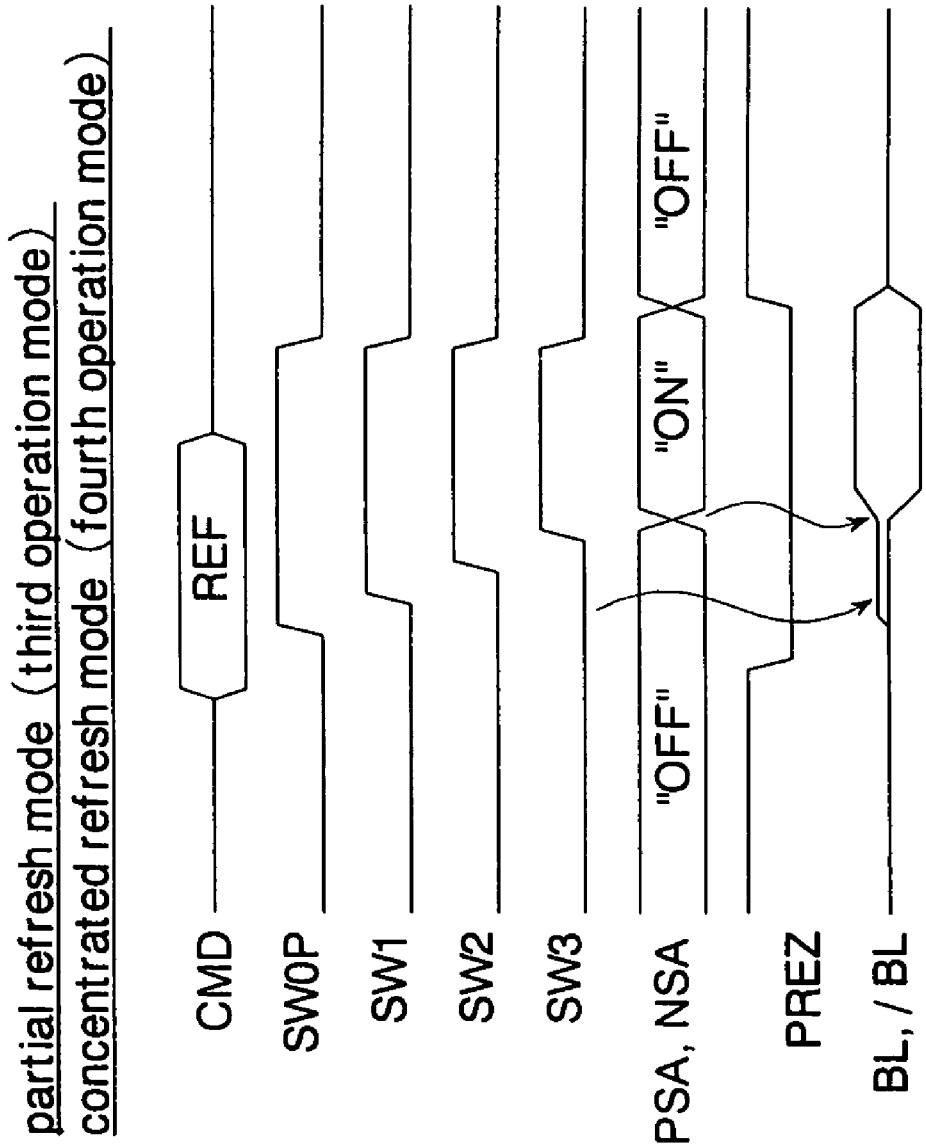
FIG. 59 is a timing chart showing another example of operation of the eighth embodiment in partial refresh mode and concentrated refresh mode.

The foregoing eighth embodiment (FIG. 56) has dealt with the case where the partial word line SW0P and the common word lines SW1, SW2, and SW3 are selected simultaneously during the partial refresh mode and during the concentrated refresh mode. However, the present invention is not limited to such an embodiment. For example, as shown in FIG. 59, the selection starting timing of the word lines SW0P, SW1, SW2, and SW3 can shift in succession to suppress power supply noise. In particular, when the timing specification shown in FIG. 59 is applied to a pseudo SRAM in which a boost voltage is supplied to the word lines, the consumption current can be dispersed to lower the capacity of the booster. As a result, the power consumption can be reduced further to reduce the power supply noise that occurs with the operation of the booster.

The invention is not limited to the above embodiments and various modifications may be made without departing from the spirit and scope of the invention. Any improvement may be made in part or all of the components.

What is claimed is:

1. A semiconductor memory comprising:
   a first memory cell and a plurality of second memory cells;
   complementary bit lines connected to said first and second memory cells;
   a sense amplifier connected to said complementary bit lines;
   a refresh control circuit for cyclically outputting a refresh control signal for refreshing said first and second memory cells; and
   an operation control circuit for performing a read operation, a write operation, and a refresh operation on said first and second memory cells, wherein
   said operation control circuit
   operates any of said first and second memory cells selected in accordance with an address signal during normal operation mode in which said read operation and said write operation are performed, and
   performs, at the start of low power consumption mode, a refresh operation in which data retained in said first memory cell is amplified by said sense amplifier and written to said first and second memory cells, and subsequently refreshes said first and second memory cells simultaneously in response to said refresh control signal.

2. The semiconductor memory according to claim 1, wherein:
   at least one of said second memory cells is connected to a first bit line which is one of said complementary bit lines, said first bit line being connected to said first memory cell; and
   at least two of the rest of said second memory cells are connected to a second bit line which is another of said complementary bit lines.

3. The semiconductor memory according to claim 1, comprising
   a first word line connected to said first memory cell and second word lines connected to said second memory cells, respectively, wherein
   said operation control circuit starts selection of said first word line earlier than selection of said second word lines during a first refresh operation in said low power consumption mode.

4. The semiconductor memory according to claim 3, wherein
   said operation control circuit selects said second word lines in succession after the selection of said first word line.

5. The semiconductor memory according to claim 1, comprising
   a first word line connected to said first memory cell and second word lines connected to said second memory cells, respectively, wherein
   said word line control circuit selects said first and second word lines simultaneously during second and subsequent refresh operations in said low power consumption mode.

6. The semiconductor memory according to claim 1, wherein
   said operation control circuit refreshes, in response to said refresh control signal, either of said first and second memory cells selected in accordance with said address signal during said normal operation mode, and refreshes both of said first and second memory cells in response to a single operation of said sense amplifier during said low power consumption mode.

7. The semiconductor memory according to claim 1, wherein
   said refresh control circuit outputs said refresh control signal at first intervals during said normal operation mode, and outputs said refresh control signal at second intervals longer than said first intervals during second and subsequent refresh operations in said low power consumption mode.

8. The semiconductor memory according to claim 7, wherein
   in shifting from said low power consumption mode to said normal operation mode, said refresh control circuit outputs said refresh control signal at third intervals shorter than said first intervals.

9. The semiconductor memory according to claim 1, comprising
   a command terminal for receiving a first command and a second command, wherein
   the semiconductor memory enters said low power consumption mode when said first command is received at said command terminal in said normal operation mode, and enters said normal operation mode when said second command is received at said command terminal in said low power consumption mode.

* * * * *